US012731651B2

(12) United States Patent
Singhania et al.

(10) Patent No.: US 12,731,651 B2
(45) Date of Patent: Sep. 8, 2026

(54) EFFICIENT TRAINING METHOD FOR UNMATCHED DATA OUTPUT PATH IN NON-VOLATILE MEMORY

(71) Applicant: Sandisk Technologies, Inc., Milpitas, CA (US)

(72) Inventors: Abhishek Singhania, Bengaluru (IN); Sajal Mittal, Bengaluru (IN); Shiv Harit Mathur, Bengaluru (IN)

(73) Assignee: Sandisk Technologies, Inc., Milpitas, CA (US)

( * ) Notice: Subject to any disclaimer, the term of this patent is extended or adjusted under 35 U.S.C. 154(b) by 136 days.

(21) Appl. No.: 18/896,420

(22) Filed: Sep. 25, 2024

(65) Prior Publication Data

US 2026/0088110 A1 Mar. 26, 2026

(51) Int. Cl.
*G11C 16/34* (2006.01)
*G11C 16/08* (2006.01)
*G11C 16/32* (2006.01)

(52) U.S. Cl.
CPC .......... *G11C 16/3459* (2013.01); *G11C 16/08* (2013.01); *G11C 16/32* (2013.01)

(58) Field of Classification Search
CPC ...... G11C 16/3459; G11C 16/34; G11C 16/08
USPC ...................................................... 365/185.22
See application file for complete search history.

(56) References Cited

U.S. PATENT DOCUMENTS 7,031,344 B2 * 4/2006 Rakib ................. H04L 25/4921 370/479
9,015,302 B2 * 4/2015 Howe ................. H04L 63/0428 709/223
9,490,787 B1 * 11/2016 Kho ....................... H03K 5/135
10,134,463 B2 11/2018 Mansuri et al.
10,324,490 B2 6/2019 Mozak
2023/0386584 A1 11/2023 Ramachandra et al.
2024/0079049 A1 3/2024 Bak et al.

OTHER PUBLICATIONS

Oh, Tae-Young, et al., "A 3.2 Gbps/pin 8 1.0 V LPDDR4 SDRAM With Integrated ECC Engine for Sub-1 V DRAM Core Operation," IEEE Journal of Solid-State Circuits, vol. 50, No. 1, Jan. 2015, 13 pages.*

* cited by examiner

*Primary Examiner* — Muna A Techane
(74) *Attorney, Agent, or Firm* — Pearl Cohen LLP

(57) ABSTRACT

To reduce power consumption and circuitry requirements, the following presents an "unmatched" data output architecture, in which the clock path does not mimic the data path. To provide proper data transfers in the data output path, the clock signal is tuned at points of the clock path, such as for data transfers from internal data buses to FIFOs and from the FIFO though the multiplexers to the input/output pads. An amount of timing offset is introduced in the generation of internal transfer clocks, which can be determined as part of a valid data window training process that can be performed by the controller, such as part of the power up process. To more quickly train the memory dies and determine the timing offset for an unmatched data output architecture, replica circuits for the data path and the clock path can be introduced on to the memory dies.

20 Claims, 39 Drawing Sheets

120
Host
122
Host Processor
124
Host Memory
128
PCIe Interface
126
130
NVMe over PCIe
100
102
Memory Controller
104
Memory Package
BEP
112
FEP
110
DDR
106
MRAM/ DRAM/ ReRAM
SSD 110
PCIe Interface
164
PCIe Interface
166
154
NOC
Memory Processor
156
DRAM Controller
162
SRAM
160
Host Processor
152
PCIe Interface to Host
150

104

Figure 6D
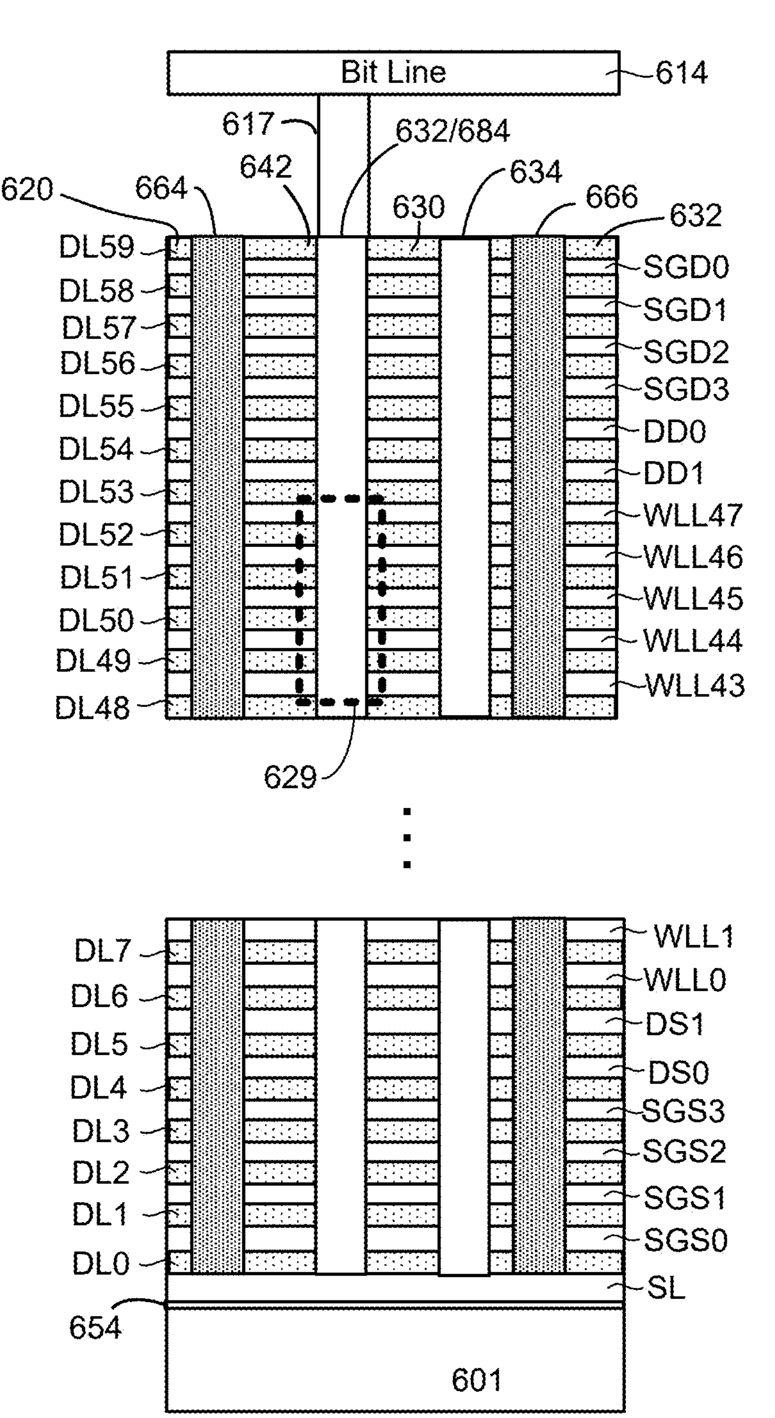

632

629
DLL53
MC1
WLL47
WLL47
DLL52
DLL52
MC2
WLL46
WLL46
DLL51
DLL51
MC3
WLL45
WLL45
DLL50
DLL50
MC4
WLL44
WLL44
DLL49
DLL49
MC5
678
677
WLL43
WLL43
676
677
678
673
672
671
670
671
672
673

Figure 7A
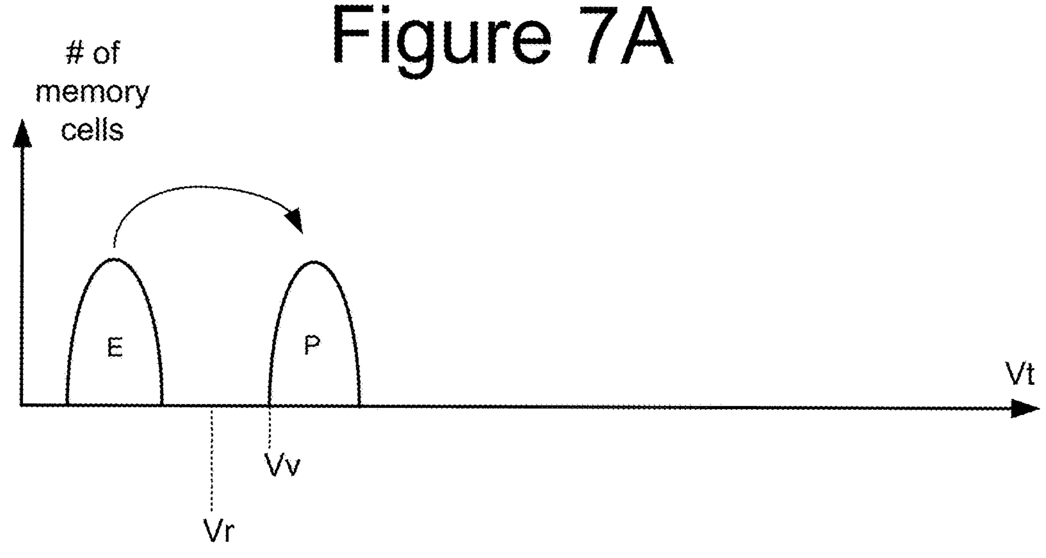
Figure 7B
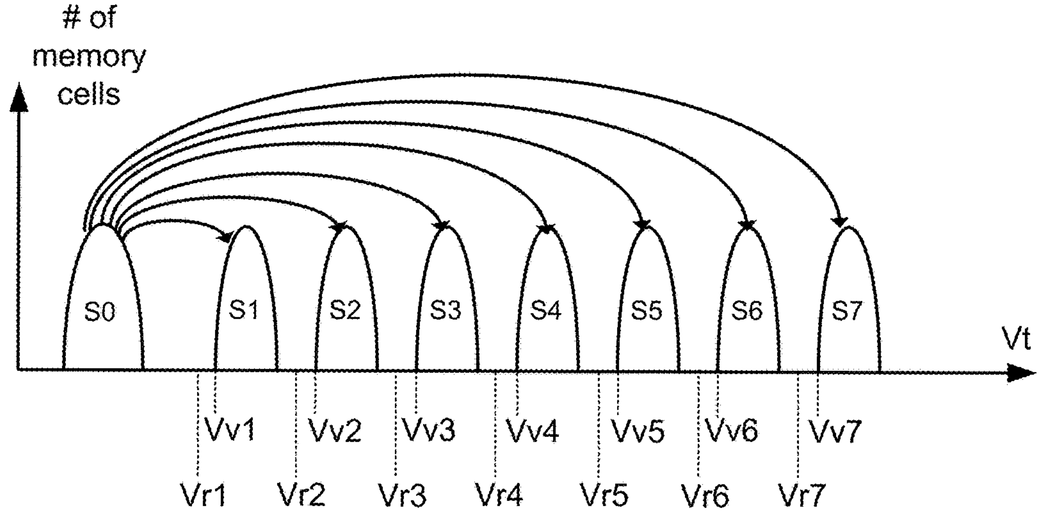
Figure 7C
| | S0 | S1 | S2 | S3 | S4 | S5 | S6 | S7 |
|---|---|---|---|---|---|---|---|---|
| Upper Page | 1 | 1 | 1 | 0 | 0 | 0 | 0 | 1 |
| Middle Page | 1 | 1 | 0 | 0 | 1 | 1 | 0 | 0 |
| Lower Page | 1 | 0 | 0 | 0 | 0 | 1 | 1 | 1 |

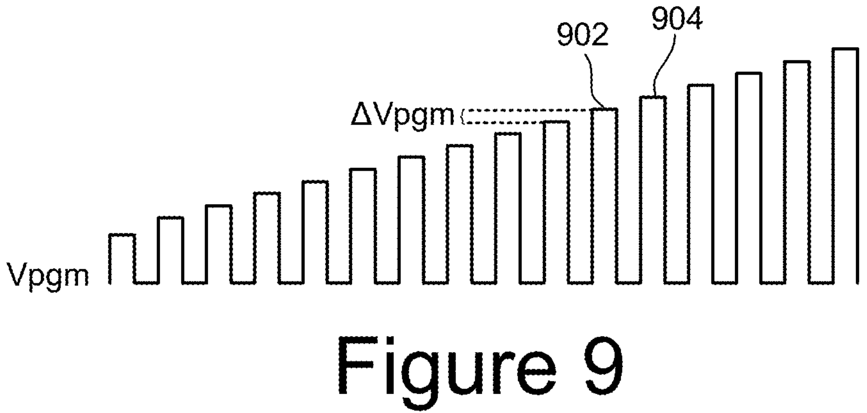
Figure 9
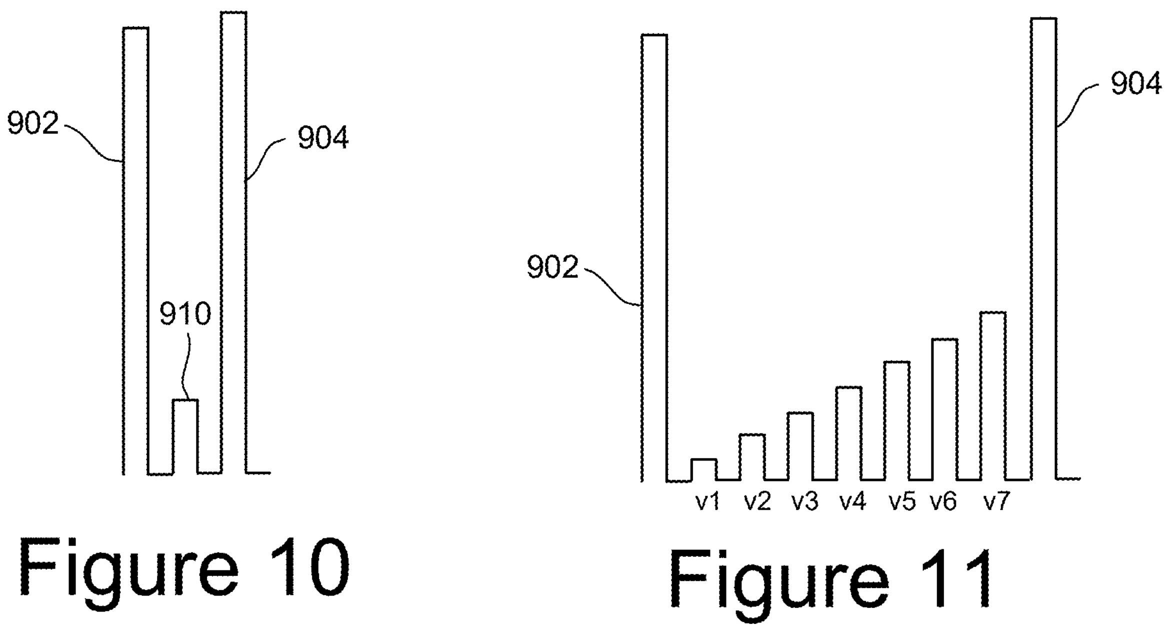
Figure 10
Figure 11

| FE_DVW<2:0> | Masking | MUX DAC<1:0> |
|---|---|---|
| 000 | 0 | 00 |
| 001 | 0 | 01 |
| 010 | 0 | 10 |
| 011 | 0 | 11 |
| 100 | 1 | 00 |
| 101 | 1 | 01 |
| 110 | 1 | 10 |
| 111 | 1 | 11 |

Figure 19

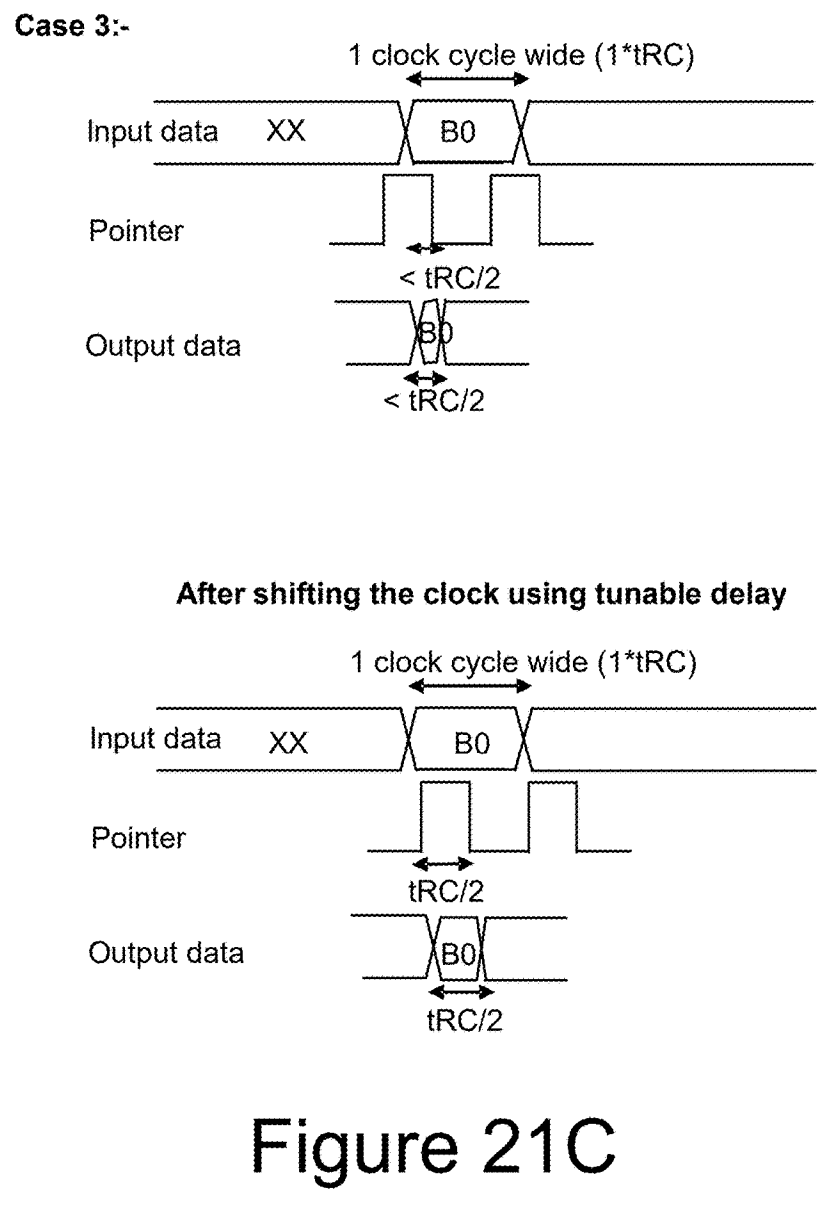

Case 3:-

1 clock cycle wide (1*tRC)

Input data XX B0

Pointer

< tRC/2

Output data B0

< tRC/2

After shifting the clock using tunable delay 1 clock cycle wide (1*tRC)

Input data XX B0

Pointer tRC/2

Output data B0 tRC/2

Figure 21C

EFFICIENT TRAINING METHOD FOR UNMATCHED DATA OUTPUT PATH IN NON-VOLATILE MEMORY

BACKGROUND

The present disclosure relates to technology for non-volatile storage.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery). An example of non-volatile memory is flash memory (e.g., NAND-type and NOR-type flash memory). Users of non-volatile memory typically want the memory to operate at high speeds so that they do not need to wait for memory operations to be completed.

BRIEF DESCRIPTION OF THE DRAWINGS

Like-numbered elements refer to common components in the different figures.

FIG. 6D depicts a portion of an embodiment of three dimensional memory structure showing a cross-sectional view along line AA of FIG. 6C.

FIG. 7A depicts threshold voltage distributions of memory cells in a binary embodiment.

FIG. 7B depicts threshold voltage distributions of memory cells in a multi-level cell (MLC) embodiment.

FIG. 7C is a table describing one example of an assignment of data values to data states.

FIG. 9 depicts a series of programming voltage pulses.

FIG. 10 depicts two programming voltage pulses and a verify voltage pulse.

FIG. 11 depicts two programming voltage pulses and a set of verify voltage pulses.

FIG. 19 is an example of a table of the parameter values for the tunable delay parameter.

FIGS. 20A-20C and 21A-21C illustrate the effect of the parameter values respectively on Margin 1 and Margin 2.

DETAILED DESCRIPTION

In a non-volatile memory system such as a solid state drive, to provide data from a memory die to the memory controller, the memory die receives a clock signal from the memory controller that the control circuitry for the memory die then uses for transferring read data along the data output path from the memory arrays to the input/output pads of the memory die. Typical stages of the data output path can include internal data buses from the sensing circuitry, a set of data buffers (e.g., FIFOs), multiplexers, and the input/output pads, where clock signals or pointers derived from the received clock signal used at the data transfer between these different stages of the data output path. To maintain alignment between the data transfers and the clock signals, a "matched" data output architecture can be used, in which elements in the clock path are structured similarly to the elements of the data path. Although the matched architecture can provide the wanted clock alignments, it requires a relatively large amount of circuitry, which consumes power and device area.

To reduce power consumption and circuitry requirements, the following presents an "unmatched" data output architecture, in which the clock path does not mimic the data path. To provide proper data transfers in the data output path, the clock signal is tuned at points of the clock path, such for data transfers from internal data buses to FIFOs and from the FIFOs though multiplexers to the input/output pads. An amount of timing offset is introduced in the generation of internal transfer clocks, which can be determined as part of a valid data window training process that can be performed by the controller, such as part of the power up process.

In further embodiments, to more quickly train the memory dies and determine the timing offset for an unmatched data output architecture, replica circuits for the data path and the clock path can be introduced on to the memory dies. The replica circuits can then be used to determine the timing offset between the two paths. As each die can have its own replica circuits, all of the dies of a controller can be trained concurrently, helping to speed up the process. In one set of examples, there is both a general FIFO data path and an asynchronous data path can replica circuits for both clock and data path can be included.

FIGS. 1A-6F describe one example of a storage system that can be used to implement the technology disclosed herein.

Figure 1A:
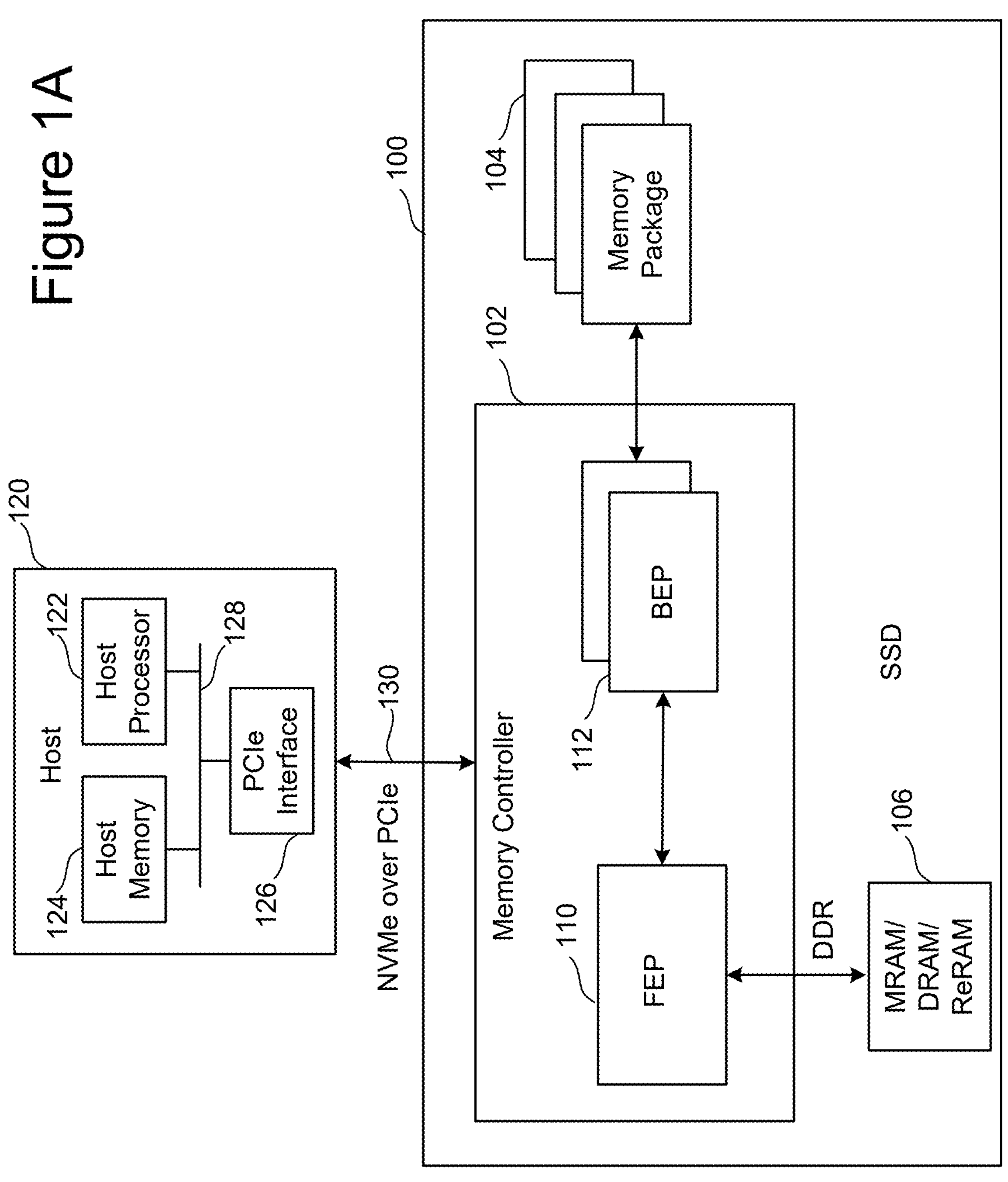
FIG. 1A is a block diagram of one embodiment of a storage system connected to a host.

FIG. 1A is a block diagram of one embodiment of a storage system 100 connected to a host system 120. Storage system 100 can implement the technology disclosed herein. Many different types of storage systems can be used with the technology disclosed herein. One example storage system is a solid state drive ("SSD"); however, other types of storage systems can also be used. Storage system 100 comprises a memory controller 102, memory package 104 for storing data, and local memory (e.g., MRAM/DRAM/ReRAM) 106. Memory controller 102 comprises a Front End Processor Circuit (FEP) 110 and one or more Back End Processor Circuits (BEP) 112. In one embodiment FEP 110 circuit is implemented on an ASIC. In one embodiment, each BEP circuit 112 is implemented on a separate ASIC. The ASICs for each of the BEP circuits 112 and the FEP circuit 110 are implemented on the same semiconductor such that the memory controller 102 is manufactured as a System on a Chip ("SoC"). FEP 110 and BEP 112 both include their own processors. In one embodiment, FEP 110 and BEP 112 work as a master slave configuration where the FEP 110 is the master and each BEP 112 is a slave. For example, FEP circuit 110 implements a flash translation layer that performs memory management (e.g., garbage collection, wear leveling, etc.), logical to physical address translation, communication with the host, management of DRAM (local volatile memory) and management of the overall operation of the SSD (or other non-volatile storage system). The BEP circuit 112 manages memory operations in the memory package 104 at the request of FEP circuit 110. For example, the BEP circuit 112 can carry out the read, erase and programming processes. Additionally, the BEP circuit 112 can perform buffer management, set specific voltage levels required by the FEP circuit 110, perform error correction (ECC), control the Toggle Mode interfaces to the memory packages, etc. In one embodiment, each BEP circuit 112 is responsible for its own set of memory packages. Memory controller 102 is one example of a control circuit.

In one embodiment, there are a plurality of memory packages 104. Each memory package 104 may contain one or more memory dies. In one embodiment, each memory die in the memory package 104 utilizes NAND flash memory (including two dimensional NAND flash memory and/or three dimensional NAND flash memory). In other embodiments, the memory package 104 can include other types of memory; for example, the memory package can include Phase Change Memory (PCM) memory.

In one embodiment, memory controller 102 communicates with host system 120 using an interface 130 that implements NVM Express (NVMe) over PCI Express (PCIe). For working with storage system 100, host system 120 includes a host processor 122, host memory 124, and a PCIe interface 126, which communicate over bus 128. Host memory 124 is the host's physical memory, and can be DRAM, SRAM, non-volatile memory or another type of storage. Host system 120 is external to and separate from storage system 100. In one embodiment, storage system 100 is embedded in host system 120. In other embodiments, the controller 102 may communicate with host 120 via other types of communication buses and/or links, including for example, over an NVMe over Fabrics architecture, or a cache/memory coherence architecture based on Cache Coherent Interconnect for Accelerators (CCIX), Compute Express Link (CXL), Open Coherent Accelerator Processor Interface (OpenCAPI), Gen-Z and the like. For simplicity, the example embodiments below will be described with respect to a PCIe example.

Figure 1B:
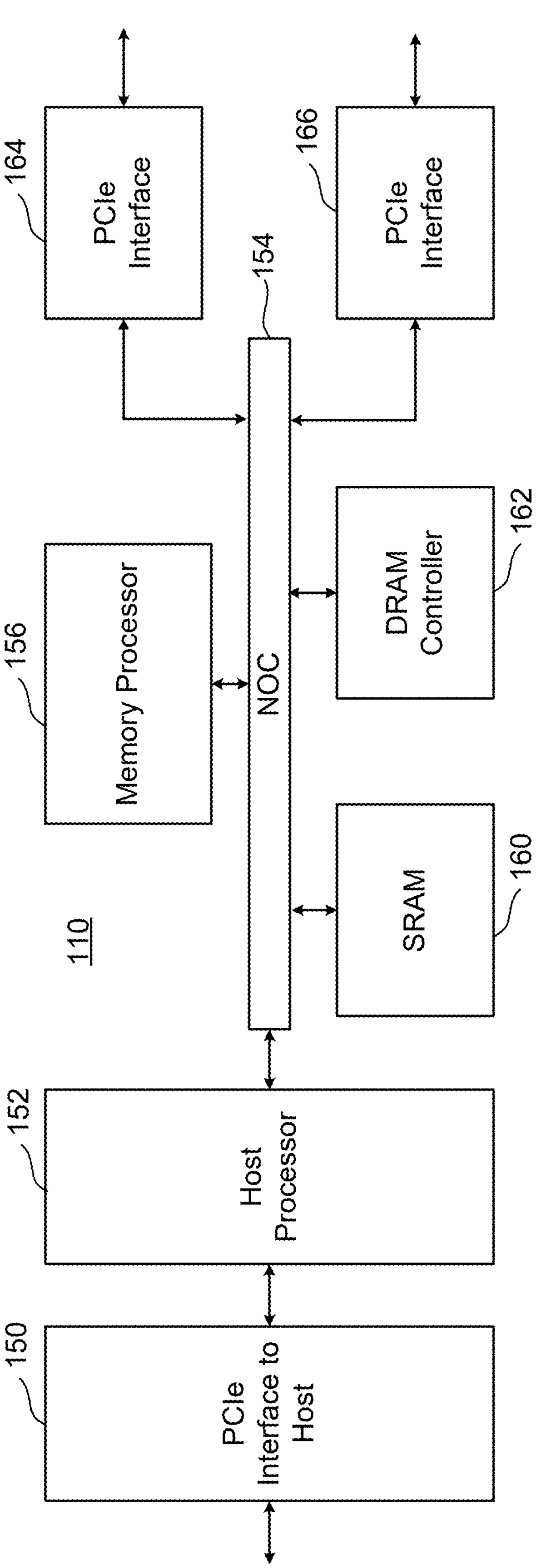
FIG. 1B is a block diagram of one embodiment of a Front End Processor Circuit.

FIG. 1B is a block diagram of one embodiment of FEP circuit 110. FIG. 1B shows a PCIe interface 150 to communicate with host system 120 and a host processor 152 in communication with that PCIe interface. The host processor 152 can be any type of processor known in the art that is suitable for the implementation. Host processor 152 is in communication with a network-on-chip (NOC) 154. A NOC is a communication subsystem on an integrated circuit, typically between cores in a SoC. NOC's can span synchronous and asynchronous clock domains or use un-clocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 154 is the memory processor 156, SRAM 160 and a DRAM controller 162. The DRAM controller 162 is used to operate and communicate with the local memory 106 (e.g., DRAM/MRAM/ReRAM). SRAM 160 is local RAM memory used by memory processor 156. Memory processor 156 is used to run the FEP circuit and perform the various memory operations. Also in communication with the NOC are two PCIe Interfaces 164 and 166. In the embodiment of FIG. 1B, memory controller 102 includes two BEP circuits 112; therefore, there are two PCIe Interfaces 164/166. Each PCIe Interface communicates with one of the BEP circuits 112. In other embodiments, there can be more or fewer than two BEP circuits 112; therefore, there can be more than two PCIe Interfaces.

Figure 2A:
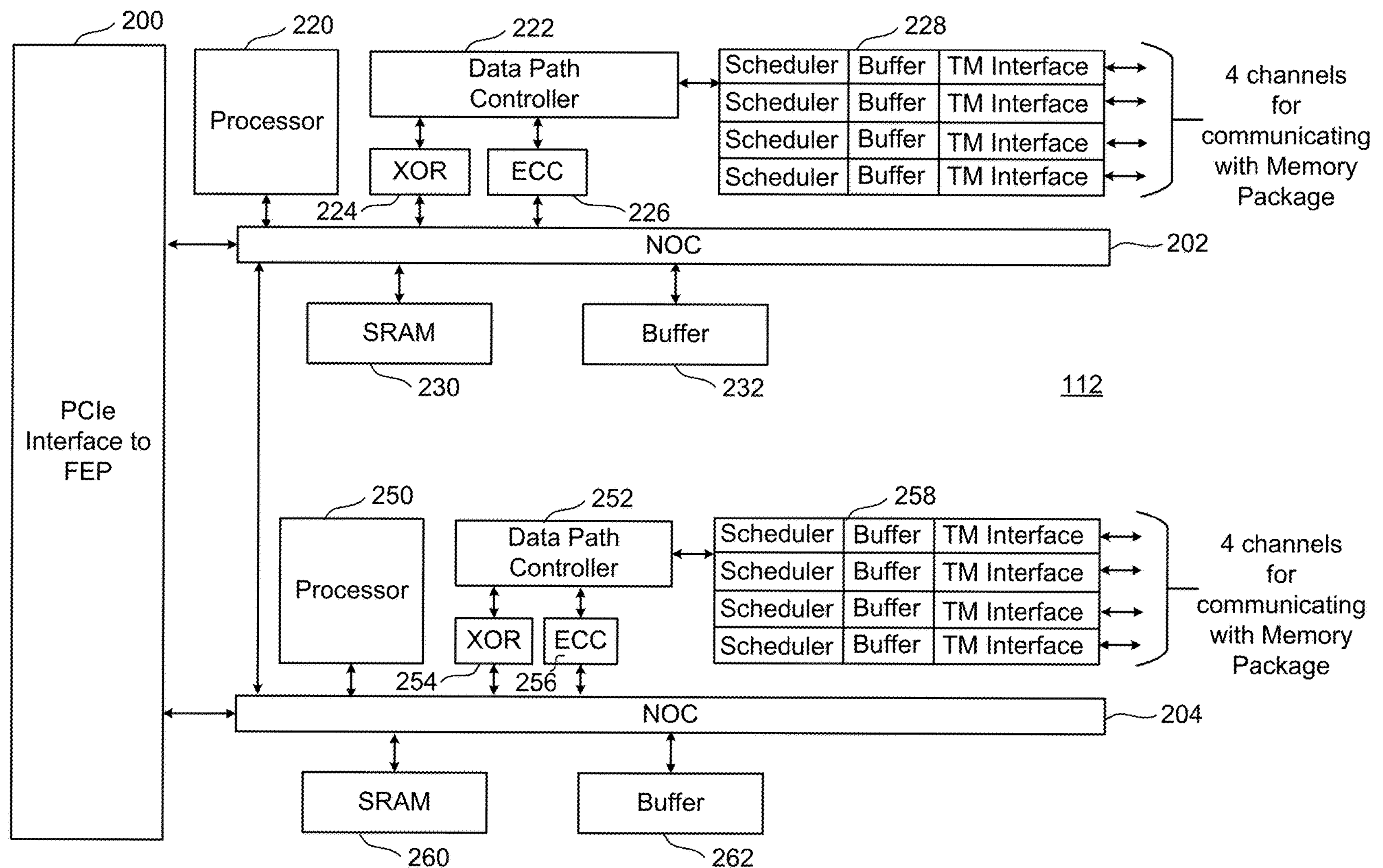
FIG. 2A is a block diagram of one embodiment of a Back End Processor Circuit.

FIG. 2A is a block diagram of one embodiment of the BEP circuit 112. FIG. 2A shows a PCIe Interface 200 for communicating with the FEP circuit 110 (e.g., communicating with one of PCIe Interfaces 164 and 166 of FIG. 1B). PCIe Interface 200 is in communication with two NOCs 202 and 204. In one embodiment the two NOCs can be combined to one large NOC. Each NOC (202/204) is connected to SRAM (230/260), a buffer (232/262), processor (220/250), and a data path controller (222/252) via an XOR engine (224/254), an ECC engine (226/256).

The ECC engines 226/256 are used to perform error correction, as known in the art. Herein, the ECC engines 226/256 may be referred to as controller ECC engines. The XOR engines 224/254 are used to XOR the data so that data can be combined and stored in a manner that can be recovered in case there is a programming error. In an embodiment, the XOR engines 224/254 are able to recover data that cannot be decoded using ECC engine 226/256.

Data path controller 222 is connected to a memory interface 228 for communicating via four channels with integrated memory assemblies. Thus, the top NOC 202 is associated with memory interface 228 for four channels for communicating with integrated memory assemblies and the bottom NOC 204 is associated with memory interface 258 for four additional channels for communicating with integrated memory assemblies. In one embodiment, each memory interface 228/258 includes four Toggle Mode interfaces (TM Interface), four buffers and four schedulers. There is one scheduler, buffer and TM Interface for each of the channels. The processor can be any standard processor known in the art. The data path controllers 222/252 can be a processor, FPGA, microprocessor or other type of controller. The XOR engines 224/254 and ECC engines 226/256 are dedicated hardware circuits, known as hardware accelerators. In other embodiments, the XOR engines 224/254, ECC engines 226/256 can be implemented in software. The scheduler, buffer, and TM Interfaces are hardware circuits. In other embodiments, the memory interface (an electrical circuit for communicating with memory dies) can be a different structure than depicted in FIG. 2A. Additionally, controllers with structures different than FIGS. 1B and 2A can also be used with the technology described herein.

Figure 2B:
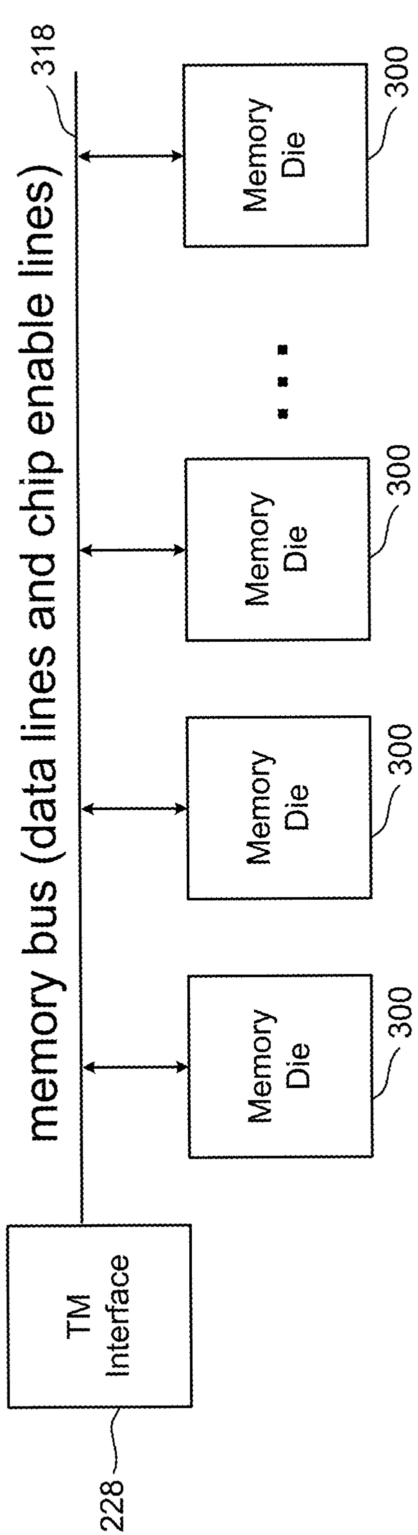
FIG. 2B is a block diagram of one embodiment of a memory package.

FIG. 2B is a block diagram of one embodiment of a memory package 104 that includes a plurality of memory dies 300 connected to a memory bus (data lines and chip enable lines) 318. The memory bus 318 connects to a Toggle Mode Interface 228 for communicating with the TM Interface of a BEP circuit 112 (see e.g., FIG. 2A). In some embodiments, the memory package can include a small controller connected to the memory bus and the TM Interface. In total, the memory package 104 may have eight or sixteen memory die; however, other numbers of memory die can also be implemented. The technology described herein is not limited to any particular number of memory die. In some embodiments, the memory package can also include a processor, CPU device, such as a RISC-V CPU along with some amount of RAM to help implement some of capabilities described below. The technology described herein is not limited to any particular number of memory die.

Figure 3A:
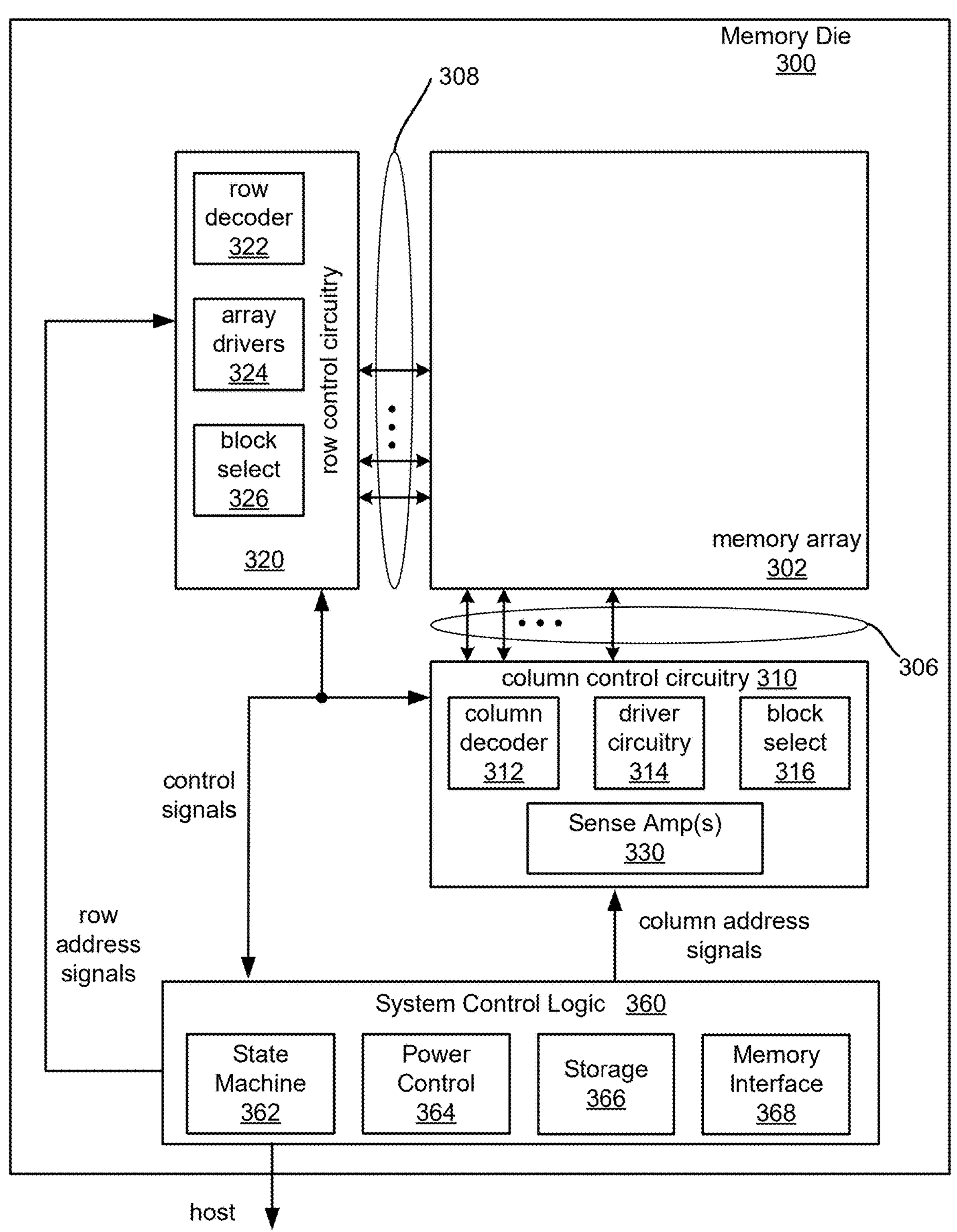
FIG. 3A is a functional block diagram of an embodiment of a memory die.

FIG. 3A is a block diagram that depicts one example of a memory die 300 that can implement the technology described herein. Memory die 300, which can correspond to one of the memory die 300 of FIG. 2B, includes a memory array 302 that can include any of memory cells described in the following. The array terminal lines of memory array 302 include the various layer(s) of word lines organized as rows, and the various layer(s) of bit lines organized as columns. However, other orientations can also be implemented. Memory die 300 includes row control circuitry 320, whose outputs 308 are connected to respective word lines of the memory array 302. Row control circuitry 320 receives a group of M row address signals and one or more various control signals from System Control Logic circuit 360, and typically may include such circuits as row decoders 322, array terminal drivers 324, and block select circuitry 326 for both reading and writing operations. Row control circuitry 320 may also include read/write circuitry. Memory die 300 also includes column control circuitry 310 including sense amplifier(s) 330 whose input/outputs 306 are connected to respective bit lines of the memory array 302. Although only a single block is shown for array 302, a memory die can include multiple arrays that can be individually accessed. Column control circuitry 310 receives a group of N column address signals and one or more various control signals from System Control Logic 360, and typically may include such circuits as column decoders 312, array terminal receivers or drivers 314, block select circuitry 316, as well as read/write circuitry, and I/O multiplexers.

System control logic 360 receives data and commands from a host and provides output data and status to the host. In other embodiments, system control logic 360 receives data and commands from a separate controller circuit and provides output data to that controller circuit, with the controller circuit communicating with the host. In some embodiments, the system control logic 360 can include a state machine 362 that provides die-level control of memory operations. In one embodiment, the state machine 362 is programmable by software. In other embodiments, the state machine 362 does not use software and is completely implemented in hardware (e.g., electrical circuits). In another embodiment, the state machine 362 is replaced by a micro-controller or microprocessor, either on or off the memory chip. The system control logic 360 can also include a power control module 364 controls the power and voltages supplied to the rows and columns of the memory 302 during memory operations and may include charge pumps and regulator circuit for creating regulating voltages. System control logic 360 includes storage 366, which may be used to store parameters for operating the memory array 302.

Commands and data are transferred between the controller 102 and the memory die 300 via memory controller interface 368 (also referred to as a "communication interface"). Memory controller interface 368 is an electrical interface for communicating with memory controller 102. Examples of memory controller interface 368 include a Toggle Mode Interface and an Open NAND Flash Interface (ONFI). Other I/O interfaces can also be used. For example, memory controller interface 368 may implement a Toggle Mode Interface that connects to the Toggle Mode interfaces of memory interface 228/258 for memory controller 102. In one embodiment, memory controller interface 368 includes a set of input and/or output (I/O) pins that connect to the controller 102.

In some embodiments, all of the elements of memory die 300, including the system control logic 360, can be formed as part of a single die. In other embodiments, some or all of the system control logic 360 can be formed on a different die.

For purposes of this document, the phrase "one or more control circuits" can include a controller, a state machine, a micro-controller, micro-processor, and/or other control circuitry as represented by the system control logic 360, or other analogous circuits that are used to control non-volatile memory.

In one embodiment, memory structure 302 comprises a three dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping.

In another embodiment, memory structure 302 comprises a two dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 302 is not limited to the examples above. Many different types of memory array architectures or memory technologies can be used to form memory structure 302. No particular non-volatile memory technology is required for purposes of the new claimed embodiments proposed herein. Other examples of suitable technologies for memory cells of the memory structure 302 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 302 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 3A can be grouped into two parts, the structure of memory structure 302 of the memory cells and the peripheral circuitry, including all of the other elements. An important characteristic of a memory circuit is its capacity, which can be increased by increasing the area of the memory die of memory system 100 that is given over to the memory structure 302; however, this reduces the area of the memory die available for the peripheral circuitry. This can place quite severe restrictions on these peripheral elements. For example, the need to fit sense amplifier circuits within the available area can be a significant restriction on sense amplifier design architectures. With respect to the system control logic 360, reduced availability of area can limit the available functionalities that can be implemented on-chip. Consequently, a basic trade-off in the design of a memory die for the memory system 100 is the amount of area to devote to the memory structure 302 and the amount of area to devote to the peripheral circuitry.

Another area in which the memory structure 302 and the peripheral circuitry are often at odds is in the processing involved in forming these regions, since these regions often involve differing processing technologies and the trade-off in having differing technologies on a single die. For example, when the memory structure 302 is NAND flash, this is an NMOS structure, while the peripheral circuitry is often CMOS based. For example, elements such sense amplifier circuits, charge pumps, logic elements in a state machine, and other peripheral circuitry in system control logic 360 often employ PMOS devices. Processing operations for manufacturing a CMOS die will differ in many aspects from the processing operations optimized for an NMOS flash NAND memory or other memory cell technologies.

To improve upon these limitations, embodiments described below can separate the elements of FIG. 3A onto separately formed dies that are then bonded together. More specifically, the memory structure 302 can be formed on one die and some or all of the peripheral circuitry elements, including one or more control circuits, can be formed on a separate die. For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate die. This allows each of the memory die to be optimized individually according to its technology. For example, a NAND memory die can be optimized for an NMOS based memory array structure, without worrying about the CMOS elements that have now been moved onto a separate peripheral circuitry die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other memory circuit. Although the following will focus on a bonded memory circuit of one memory die and one peripheral circuitry die, other embodiments can use more die, such as two memory die and one peripheral circuitry die, for example.

Figure 3B:
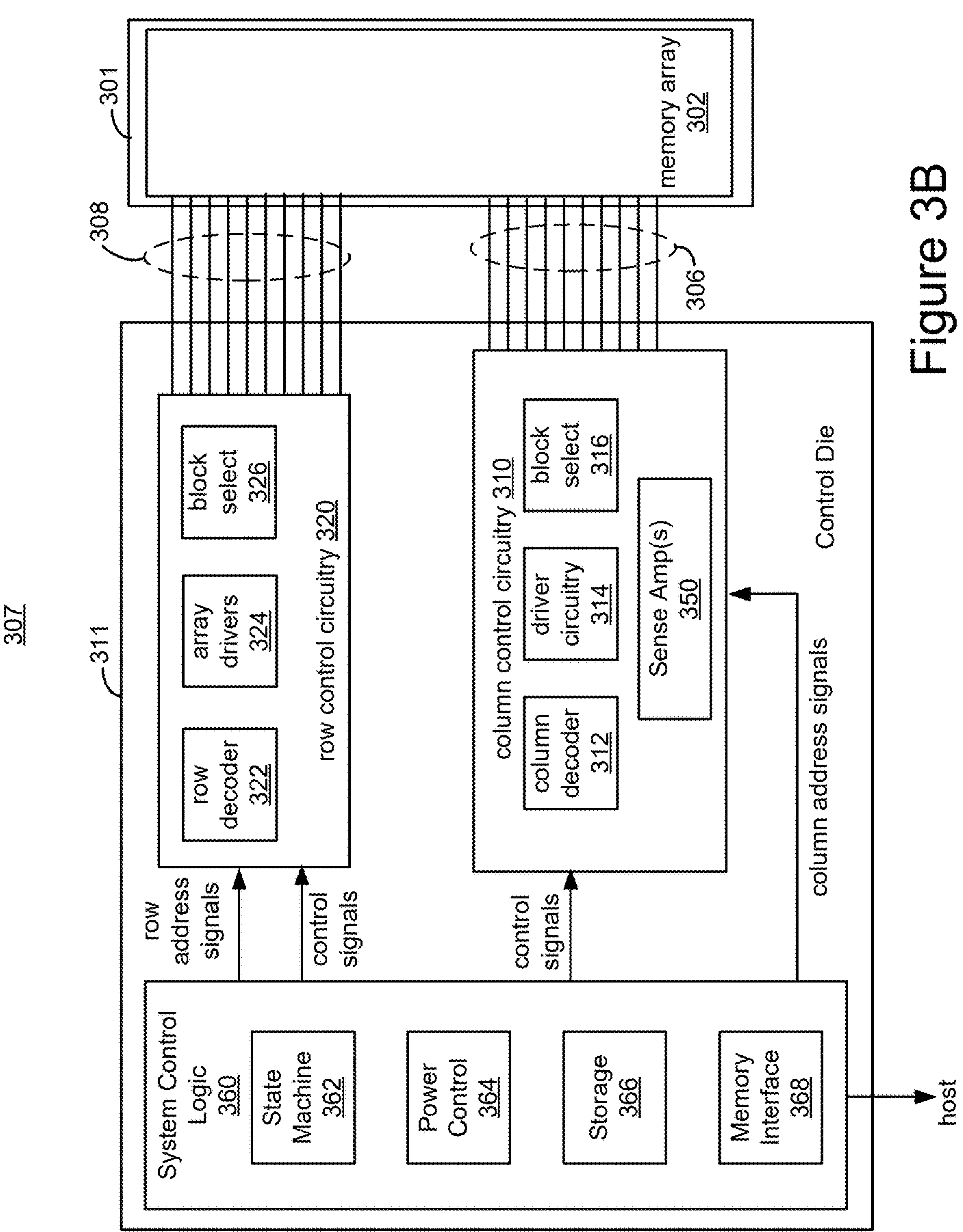
FIG. 3B is a functional block diagram of an embodiment of an integrated memory assembly.

FIG. 3B shows an alternative arrangement to that of FIG. 3A which may be implemented using wafer-to-wafer bonding to provide a bonded die pair. FIG. 3B depicts a functional block diagram of one embodiment of an integrated memory assembly 307. The integrated memory assembly 307 may be used in a memory package 104 in storage system 100. The integrated memory assembly 307 includes two types of semiconductor die (or more succinctly, "die"). Memory structure die 301 includes memory structure 302. Memory structure 302 may contain non-volatile memory cells. Control die 311 includes control circuitry 360, 310, 320. In some embodiments, the control die 311 is configured to connect to the memory structure 302 in the memory structure die 301. In some embodiments, the memory structure die 301 and the control die 311 are bonded together.

FIG. 3B shows an example of the peripheral circuitry, including control circuits, formed in a peripheral circuit or control die 311 coupled to memory structure 302 formed in memory structure die 301. Common components are labelled similarly to FIG. 3A. It can be seen that system control logic 360, row control circuitry 320, and column control circuitry 310 are located in control die 311. In some embodiments, all or a portion of the column control circuitry 310 and all or a portion of the row control circuitry 320 are located on the memory structure die 301. In some embodiments, some of the circuitry in the system control logic 360 is located on the on the memory structure die 301.

System control logic 360, row control circuitry 320, and column control circuitry 310 may be formed by a common process (e.g., CMOS process), so that adding elements and functionalities, such as ECC, more typically found on a memory controller 102 may require few or no additional process steps (i.e., the same process steps used to fabricate controller 102 may also be used to fabricate system control logic 360, row control circuitry 320, and column control circuitry 310). Thus, while moving such circuits from a die such as memory structure die 301 may reduce the number of steps needed to fabricate such a die, adding such circuits to a die such as control die 311 may not require any additional process steps. The control die 311 could also be referred to as a CMOS die, due to the use of CMOS technology to implement some or all of control circuitry 360, 310, 320.

FIG. 3B shows column control circuitry 310 including sense amplifier(s) 350 on the control die 311 coupled to memory structure 302 on the memory structure die 301 through electrical paths 306. For example, electrical paths 306 may provide electrical connection between column decoder 312, driver circuitry 314, and block select 316 and bit lines of memory structure 302. Electrical paths may extend from column control circuitry 310 in control die 311 through pads on control die 311 that are bonded to corresponding pads of the memory structure die 301, which are connected to bit lines of memory structure 302. Each bit line of memory structure 302 may have a corresponding electrical path in electrical paths 306, including a pair of bond pads, which connects to column control circuitry 310. Similarly, row control circuitry 320, including row decoder 322, array drivers 324, and block select 326 are coupled to memory structure 302 through electrical paths 308. Each electrical path 308 may correspond to a word line, dummy word line, or select gate line. Additional electrical paths may also be provided between control die 311 and memory structure die 301.

For purposes of this document, the phrase "one or more control circuits" can include one or more of controller 102, system control logic 360, column control circuitry 310, row control circuitry 320, a micro-controller, a state machine, and/or other control circuitry, or other analogous circuits that are used to control non-volatile memory. The one or more control circuits can include hardware only or a combination of hardware and software (including firmware). For example, a controller programmed by firmware to perform the functions described herein is one example of a control circuit. A control circuit can include a processor, FGA, ASIC, integrated circuit, or other type of circuit.

Figure 4A:
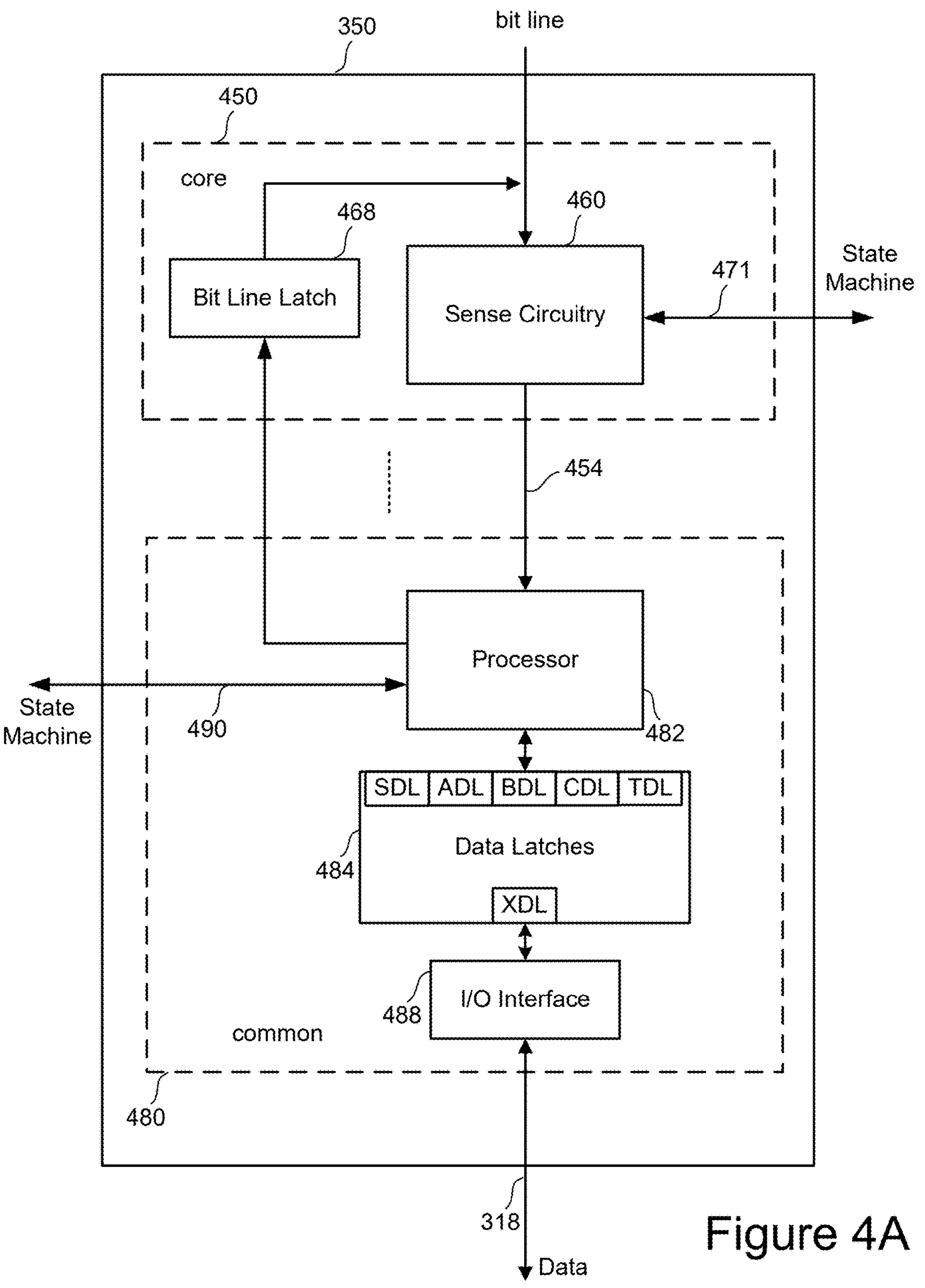
FIG. 4A is a block diagram of an individual sense block partitioned into a core portion and a common portion.

FIG. 4A is a block diagram of an individual sense block of sense amplifiers 350 partitioned into a core portion, referred to as a sense module 480, and a common portion 480. In one embodiment, there will be a separate sense module 450 for each bit line and one common portion 480 for a set of multiple sense modules 450. In one example, a sense block will include one common portion 480 and eight sense, twelve, or sixteen modules 450. Each of the sense modules in a group will communicate with the associated common portion via a data bus 454.

Sense module 450 comprises sense circuitry 460 that determines whether a conduction current in a connected bit line is above or below a predetermined level or, in voltage based sensing, whether a voltage level in a connected bit line is above or below a predetermined level. The sense circuitry 460 is to receive control signals from the state machine via input lines 471. In some embodiments, sense module 450 includes a circuit commonly referred to as a sense amplifier. Sense module 450 also includes a bit line latch 468 that is used to set a voltage condition on the connected bit line. For example, a predetermined state latched in bit line latch 468 will result in the connected bit line being pulled to a state designating program inhibit (e.g., VDD).

Common portion 480 comprises a processor 468, a set of data latches 484 and an I/O Interface 488 coupled between the set of data latches 484 and data bus 318. Processor 482 performs computations. For example, one of its functions is to determine the data stored in the sensed memory cell and store the determined data in the set of data latches. The set of data latches 484 is used to store data bits determined by processor 468 during a read operation. It is also used to store data bits imported from the data bus 318 during a program operation. The imported data bits represent write data meant to be programmed into the memory. I/O interface 488 provides an interface between data latches 484 and the data bus 318.

During read or sensing, the operation of the system is under the control of state machine 362 that controls (using power control 364) the supply of different control gate or other bias voltages to the addressed memory cell(s). As it steps through the various predefined control gate voltages corresponding to the various memory states supported by the memory, the sense module 450 may trip at one of these voltages and an output will be provided from sense module 450 to processor 468 via bus 454. At that point, processor 468 determines the resultant memory state by consideration of the tripping event(s) of the sense module and the information about the applied control gate voltage from the state machine via input lines 490. It then computes a binary encoding for the memory state and stores the resultant data bits into data latches 484. In another embodiment of the core portion, bit line latch 468 serves double duty, both as a latch for latching the output of the sense module 450 and also as a bit line latch as described above.

Data latch stack 484 contains a stack of data latches corresponding to the sense module. In one embodiment, there are three, four or another number of data latches per sense module 450. In one embodiment, the latches are each one bit. In this document, the latches in one embodiment of data latch stack 484 will be referred to as SDL, XDL, ADL, BDL, and CDL. In the embodiments discussed here, the latch XDL is a transfer latch used to exchange data with the I/O interface 488. In addition to a first sense amp data latch SDL, the additional latches ADL, BDL and CDL can be used to hold multi-state data, where the number of such latches typically reflects the number of bits stored in a memory cell. For example, in 3-bit per cell multi-level cell (MLC) memory format, the three sets of latches ADL, BDL, CDL can be used for upper, middle, lower page data. In a 2-bit per cell embodiment, only ADL and BDL might be used, while a 4-bit per cell MLC embodiment might include a further set of DDL latches. In other embodiments, the XDL latches can be used to hold additional pages of data, such as a 4-bit per cell MLC embodiment the uses the XDL latches in addition to the three sets of latches ADL, BDL, CDL for four pages of data. The following discussion will mainly focus on a 3-bit per cell embodiment, as this can illustrate the main features but not get overly complicated, but the discussion can also be applied to embodiments with more or fewer bit per cell formats. Some embodiments many also include additional latches for particular functions, such as represented by the TDL latch where, for example, this could be used in "quick pass write" operations where it is used in program operations for when a memory cell is approaching its target state and is partially inhibited to slow its programming rate. In embodiments discussed below, the latches ADL, BDL, . . . can transfer data between themselves and the bit line latch 468 and with the transfer latch XDL, but not directly with the I/O interface 488, so that a transfer from these latches to the I/O interface is transferred by way of the XDL latches.

For example, in some embodiments data read from a memory cell or data to be programmed into a memory cell will first be stored in XDL. In case the data is to be programmed into a memory cell, the system can program the data into the memory cell from XDL. In one embodiment, the data is programmed into the memory cell entirely from XDL before the next operation proceeds. In other embodiments, as the system begins to program a memory cell through XDL, the system also transfers the data stored in XDL into ADL in order to reset XDL. Before data is transferred from XDL into ADL, the data kept in ADL is transferred to BDL, flushing out whatever data (if any) is being kept in BDL, and similarly for BDL and CDL. Once data has been transferred from XDL into ADL, the system continues (if necessary) to program the memory cell through ADL, while simultaneously loading the data to be programmed into a memory cell on the next word line into XDL, which has been reset. By performing the data load and programming operations simultaneously, the system can save time and thus perform a sequence of such operations faster.

During program or verify, the data to be programmed is stored in the set of data latches 484 from the data bus 318. During the verify process, Processor 468 monitors the verified memory state relative to the desired memory state. When the two are in agreement, processor 468 sets the bit line latch 468 so as to cause the bit line to be pulled to a state designating program inhibit. This inhibits the memory cell coupled to the bit line from further programming even if it is subjected to programming pulses on its control gate. In other embodiments the processor initially loads the bit line latch 468 and the sense circuitry sets it to an inhibit value during the verify process.

In some implementations (but not required), the data latches are implemented as a shift register so that the parallel data stored therein is converted to serial data for data bus 318, and vice versa. In one preferred embodiment, all the data latches corresponding to the read/write block of m memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Figure 4B:
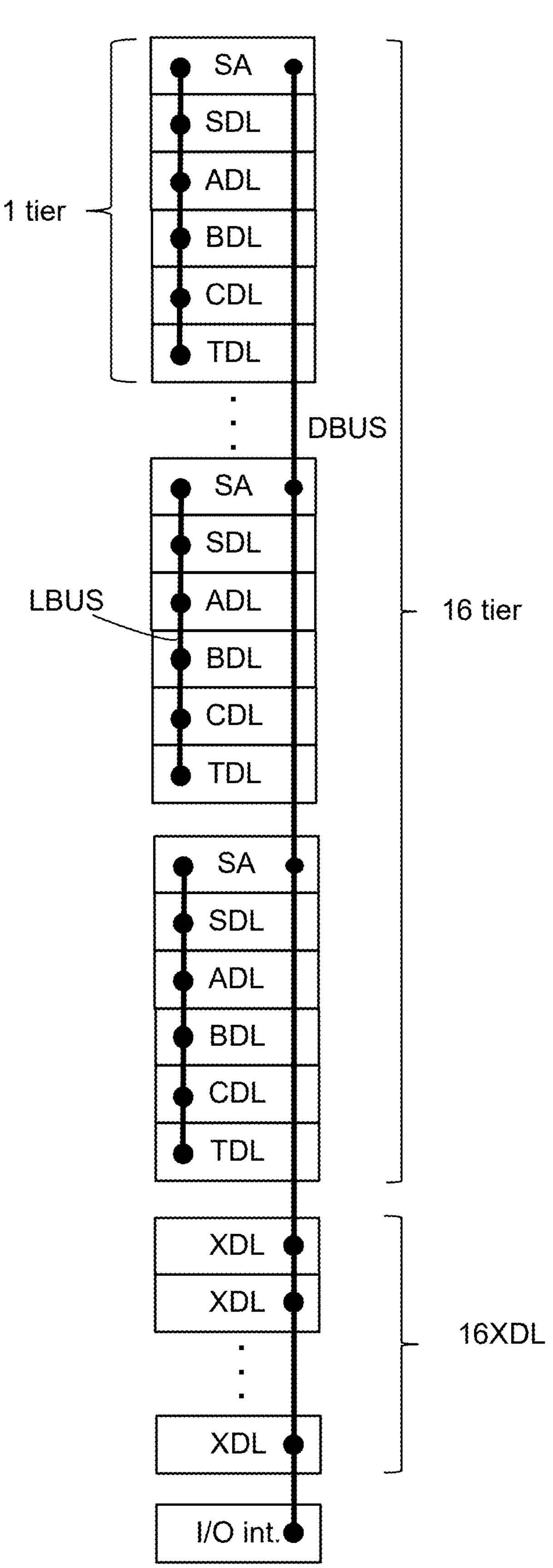
FIG. 4B is a schematic representation of one embodiment for the structure of the data latches.

FIG. 4B is a schematic representation of the structure for one embodiment of the data latches. The example of FIG. 4B is for a 3 bit per cell embodiment where each sense amplifier (SA) has a set of associated data latches forming a "tier" including a sense amp data latch (SDL), the data latches for the 3 bit data states (ADL, BDL, CDL), and an auxiliary data latch (TDL) that could be used for implementing quick pass write operations, for example. In one set of embodiments for 4 bit data states, the XDL data latches can be used for a fourth page of data. Within each of these stacks of data latches, data can be transferred between the sense amplifier and its associated set of latches along a local bus LBUS. In some embodiments, each of the sense amplifiers and corresponding set of data latches of a tier that are associated with one bit line can be grouped together for a corresponding "column" of bit lines, and formed on a memory die within the pitch of the column of memory cells along the periphery of the memory cell array. The example discussed here uses an embodiment where 16 bit lines form a column so that a 16-bit word is physically located together in the array. An example of a memory array may have 1000 such columns, corresponding to 16K bit lines. In the topology of the FIG. 4B embodiment, each sense amplifier and its set of associated data latches of a tier are connected along an internal bus structure of DBUSs along which data can be transferred between each of the tier of latches and a corresponding XDL. For the embodiment described in the following, the XDL transfer latches can transfer data to and from the I/O interface, but the other data latches of the tier (e.g., ADL) are not arranged to transfer data directly to or from the I/O interface and must go through the intermediary of the transfer data latch XDL.

Figure 5A:
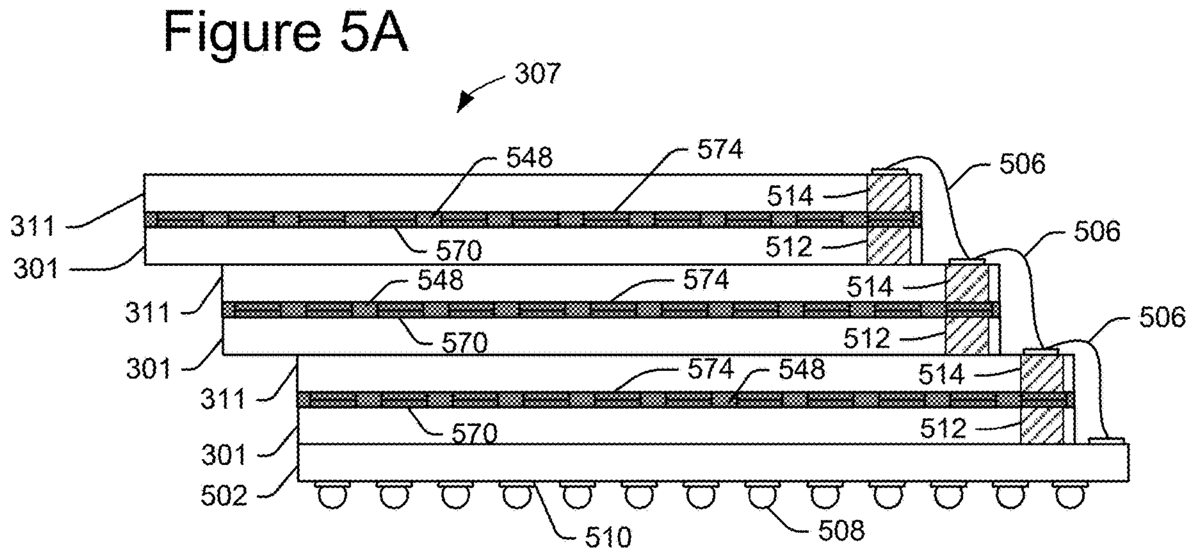
FIG. 5A depicts a side view of an embodiment of an integrated memory assembly stacked on a substrate.

In some embodiments, there is more than one control die 311 and more than one memory structure die 301 in an integrated memory assembly 307. In some embodiments, the integrated memory assembly 307 includes a stack of multiple control die 311 and multiple memory structure die 301. FIG. 5A depicts a side view of an embodiment of an integrated memory assembly 307 stacked on a substrate 502 (e.g., a stack comprising control dies 311 and memory structure dies 301). The integrated memory assembly 307 has three control dies 311 and three memory structure dies 301. In some embodiments, there are more than three memory structure dies 301 and more than three control die 311.

Each control die 311 is affixed (e.g., bonded) to at least one of the memory structure dies 301. Some of the bond pads 570, 574, are depicted. There may be many more bond pads. A space between two dies 301, 311 that are bonded together is filled with a solid layer 548, which may be formed from epoxy or other resin or polymer. This solid layer 548 protects the electrical connections between the dies 301, 311, and further secures the dies together. Various materials may be used as solid layer 548, but in embodiments, it may be Hysol epoxy resin from Henkel Corp., having offices in California, USA.

The integrated memory assembly 307 may for example be stacked with a stepped offset, leaving the bond pads at each level uncovered and accessible from above. Wire bonds 506 connected to the bond pads connect the control die 311 to the substrate 502. A number of such wire bonds may be formed across the width of each control die 311 (i.e., into the page of FIG. 5A).

A memory structure die through silicon via (TSV) 512 may be used to route signals through a memory structure die 301. A control die through silicon via (TSV) 514 may be used to route signals through a control die 311. The TSVs 512, 514 may be formed before, during or after formation of the integrated circuits in the semiconductor dies 301, 311. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 508 may optionally be affixed to contact pads 510 on a lower surface of substrate 502. The solder balls 508 may be used to electrically and mechanically couple the integrated memory assembly 307 to a host device such as a printed circuit board. Solder balls 508 may be omitted where the integrated memory assembly 307 is to be used as an LGA package. The solder balls 508 may form a part of the interface between the integrated memory assembly 307 and the memory controller 102.

Figure 5B:
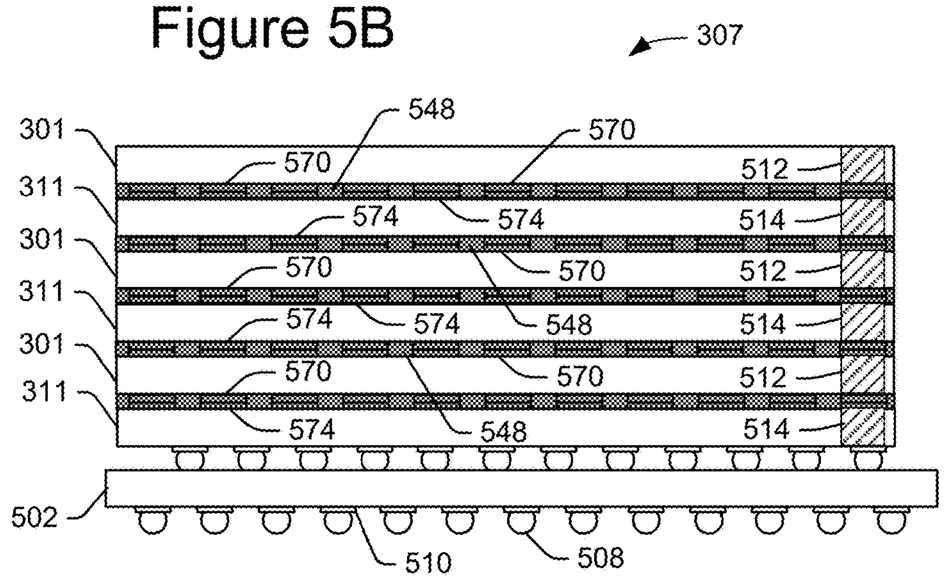
FIG. 5B depicts a side view of an embodiment of an integrated memory assembly stacked on a substrate.

FIG. 5B depicts a side view of an embodiment of an integrated memory assembly 307 stacked on a substrate 502. The integrated memory assembly 307 has three control die 311 and three memory structure die 301. In some embodiments, there are many more than three memory structure dies 301 and many more than three control dies 311. In this example, each control die 311 is bonded to at least one memory structure die 301. Optionally, a control die 311 may be bonded to two memory structure die 301.

Some of the bond pads 570, 574 are depicted. There may be many more bond pads. A space between two dies 301, 311 that are bonded together is filled with a solid layer 548, which may be formed from epoxy or other resin or polymer. In contrast to the example in FIG. 5A, the integrated memory assembly 307 in FIG. 5B does not have a stepped offset. A memory structure die through silicon via (TSV) 512 may be used to route signals through a memory structure die 301. A control die through silicon via (TSV) 514 may be used to route signals through a control die 311.

Solder balls 508 may optionally be affixed to contact pads 510 on a lower surface of substrate 502. The solder balls 508 may be used to electrically and mechanically couple the integrated memory assembly 307 to a host device such as a printed circuit board. Solder balls 508 may be omitted where the integrated memory assembly 307 is to be used as an LGA package.

As has been briefly discussed above, the control die 311 and the memory structure die 301 may be bonded together. Bond pads on each die 301, 311 may be used to bond the two dies together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 μm square and spaced from each other with a pitch of 5 μm to 5 μm. While this process is referred to herein as Cu-to-Cu bonding, this term may also apply even where the bond pads are formed of materials other than Cu.

When the area of bond pads is small, it may be difficult to bond the semiconductor dies together. The size of, and pitch between, bond pads may be further reduced by providing a film layer on the surfaces of the semiconductor dies including the bond pads. The film layer is provided around the bond pads. When the dies are brought together, the bond pads may bond to each other, and the film layers on the respective dies may bond to each other. Such a bonding technique may be referred to as hybrid bonding. In embodiments using hybrid bonding, the bond pads may be about 5 μm square and spaced from each other with a pitch of 1 μm to 5 μm. Bonding techniques may be used providing bond pads with even smaller sizes and pitches.

Some embodiments may include a film on surface of the dies 301, 311. Where no such film is initially provided, a space between the dies may be under filled with an epoxy or other resin or polymer. The under-fill material may be applied as a liquid which then hardens into a solid layer. This under-fill step protects the electrical connections between the dies 301, 311, and further secures the dies together. Various materials may be used as under-fill material, but in embodiments, it may be Hysol epoxy resin from Henkel Corp., having offices in California, USA.

Figure 6A:
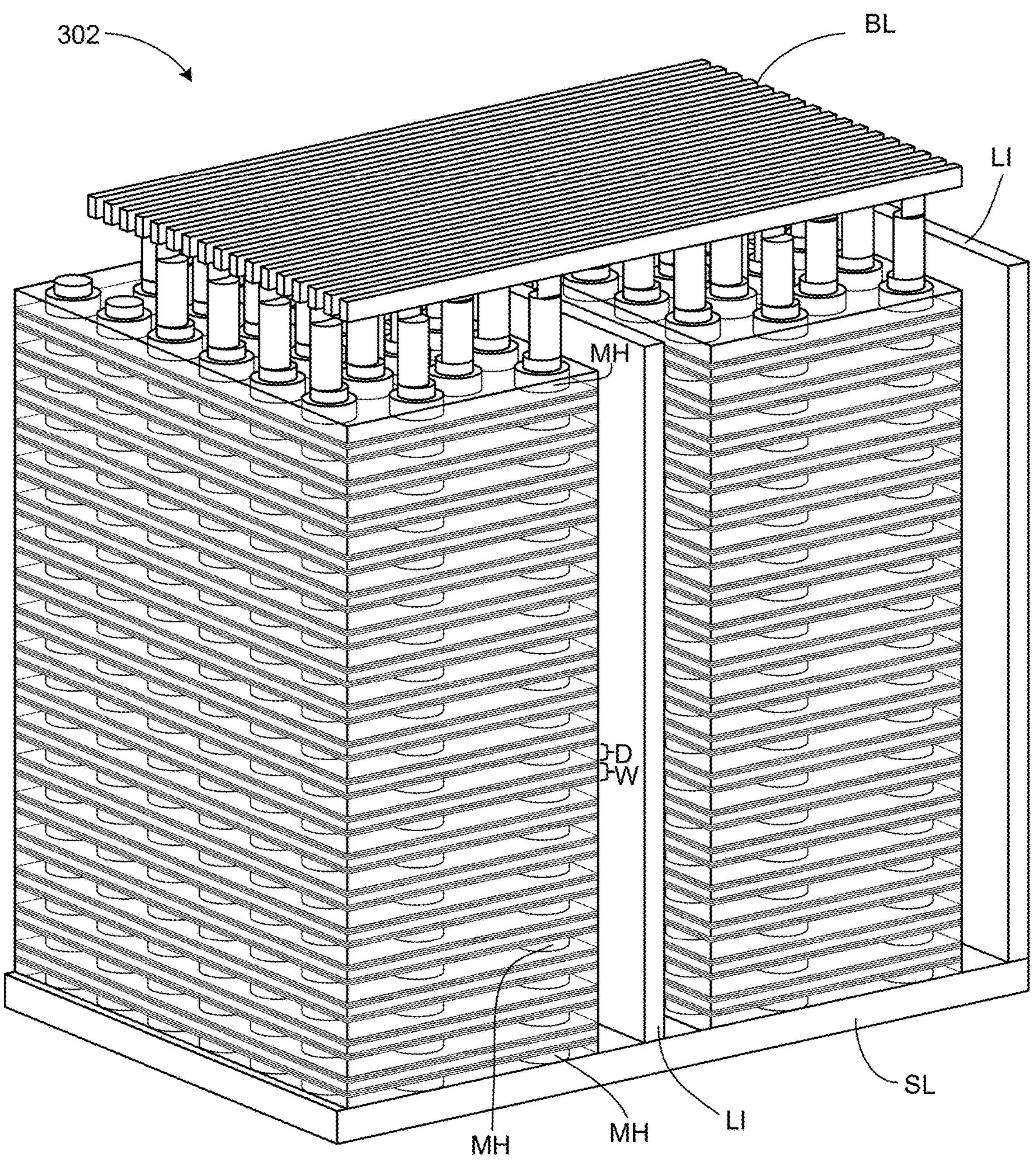
FIG. 6A is a perspective view of a portion of one example embodiment of a monolithic three dimensional memory array that can comprise memory structure.

FIG. 6A is a perspective view of a portion of one example embodiment of a monolithic three dimensional memory array that can comprise memory structure 302, which includes a plurality non-volatile memory cells. For example, FIG. 6A shows a portion of one block comprising memory. The structure depicted includes a set of bit lines BL positioned above a stack of alternating dielectric layers and conductive layers with vertical columns of materials extending through the dielectric layers and conductive layers. For example purposes, one of the dielectric layers is marked as D and one of the conductive layers (also called word line layers) is marked as W. The word line layers contain one or more word lines that are connected to memory cells. For example, a word line may be connected to a control gate of a memory cell. The number of alternating dielectric layers and conductive layers can vary based on specific implementation requirements. One set of embodiments includes between 108-304 alternating dielectric layers and conductive layers. One example embodiment includes 96 data word line layers, 8 select layers, 6 dummy word line layers and 110 dielectric layers. More or fewer than 108-304 layers can also be used. The alternating dielectric layers and conductive layers are divided into four "fingers" or sub-blocks by local interconnects LI, in an embodiment. FIG. 6A shows two fingers and two local interconnects LI. Below the alternating dielectric layers and word line layers is a source line layer SL. Vertical columns of materials (also known as memory holes) are formed in the stack of alternating dielectric layers and conductive layers. For example, one of the vertical columns/memory holes is marked as MH. Note that in FIG. 6A, the dielectric layers are depicted as see-through so that the reader can see the memory holes positioned in the stack of alternating dielectric layers and conductive layers. In one embodiment, NAND strings are formed by filling the vertical column/memory hole with materials including a charge-trapping material to create a vertical column of memory cells. Each memory cell can store one or more bits of data.

Figure 6B:
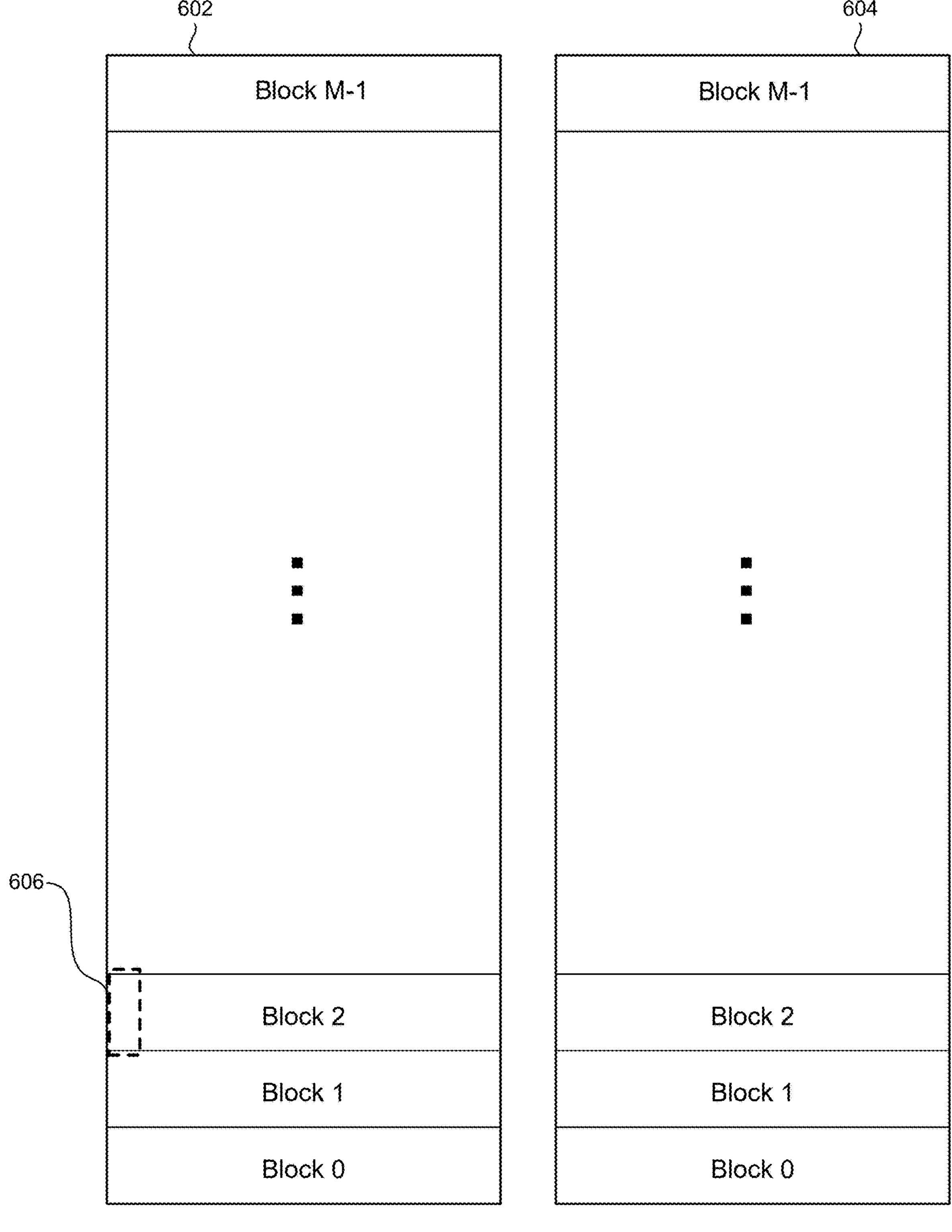
FIG. 6B is a block diagram explaining one example organization of memory structure.

FIG. 6B is a block diagram explaining one example organization of memory structure 302, which is divided into two planes 602 and 604. Each plane is then divided into M blocks. In one example, each plane has about 2000 blocks. However, different numbers of blocks and planes can also be used. In one embodiment, for two plane memory, the block IDs are usually such that even blocks belong to one plane and odd blocks belong to another plane; therefore, plane 602 includes block 0, 2, 4, 6, . . . and plane 604 includes blocks 1, 3, 5, 7, . . . . In on embodiment, a block of memory cells is a unit of erase. That is, all memory cells of a block are erased together. In other embodiments, memory cells can be grouped into blocks for other reasons, such as to organize the memory structure 302 to enable the signaling and selection circuits.

Figure 6C:
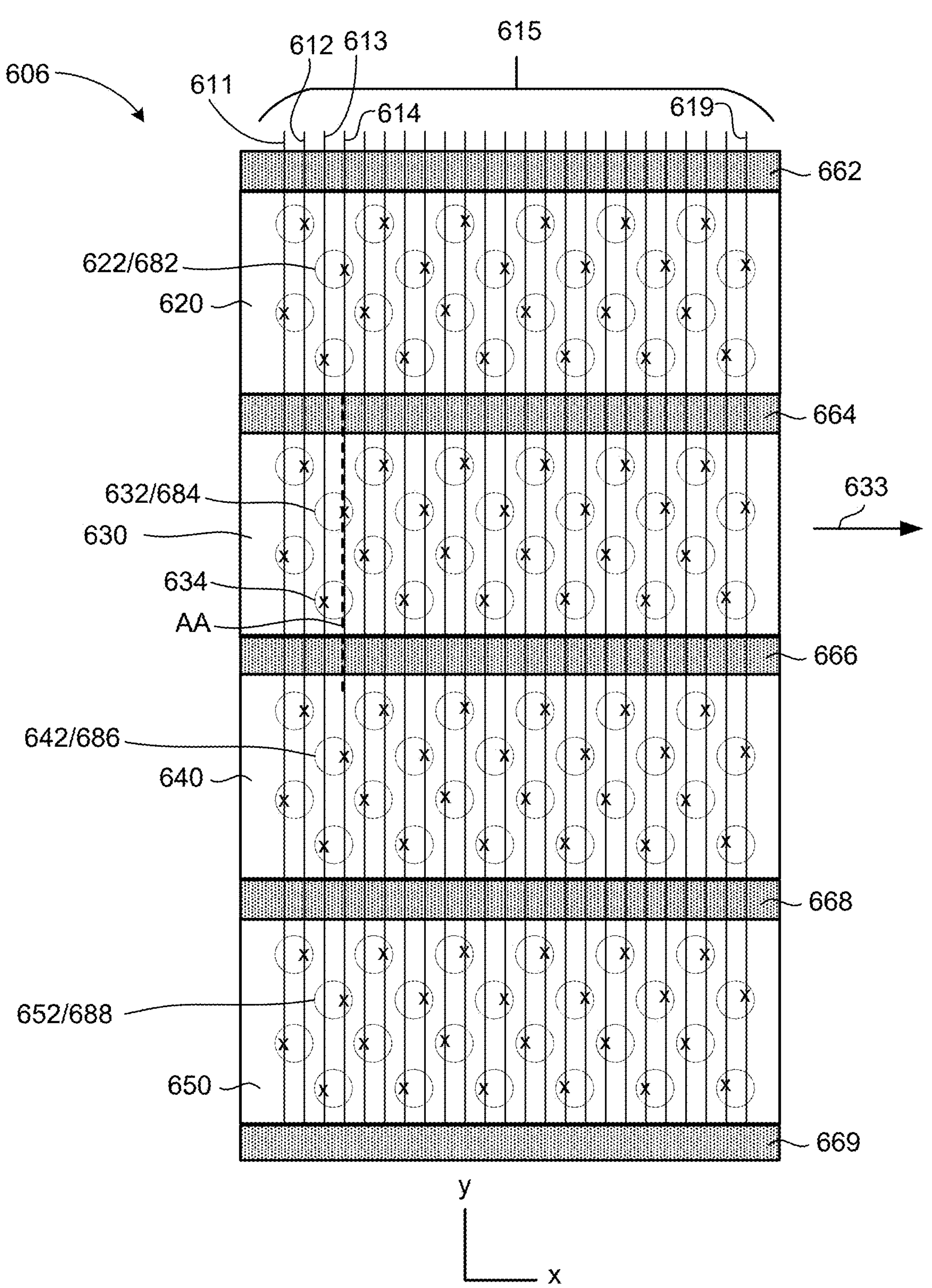
FIG. 6C is a block diagram depicting a top view of a portion of one block from the memory structure.
Figure 6E:
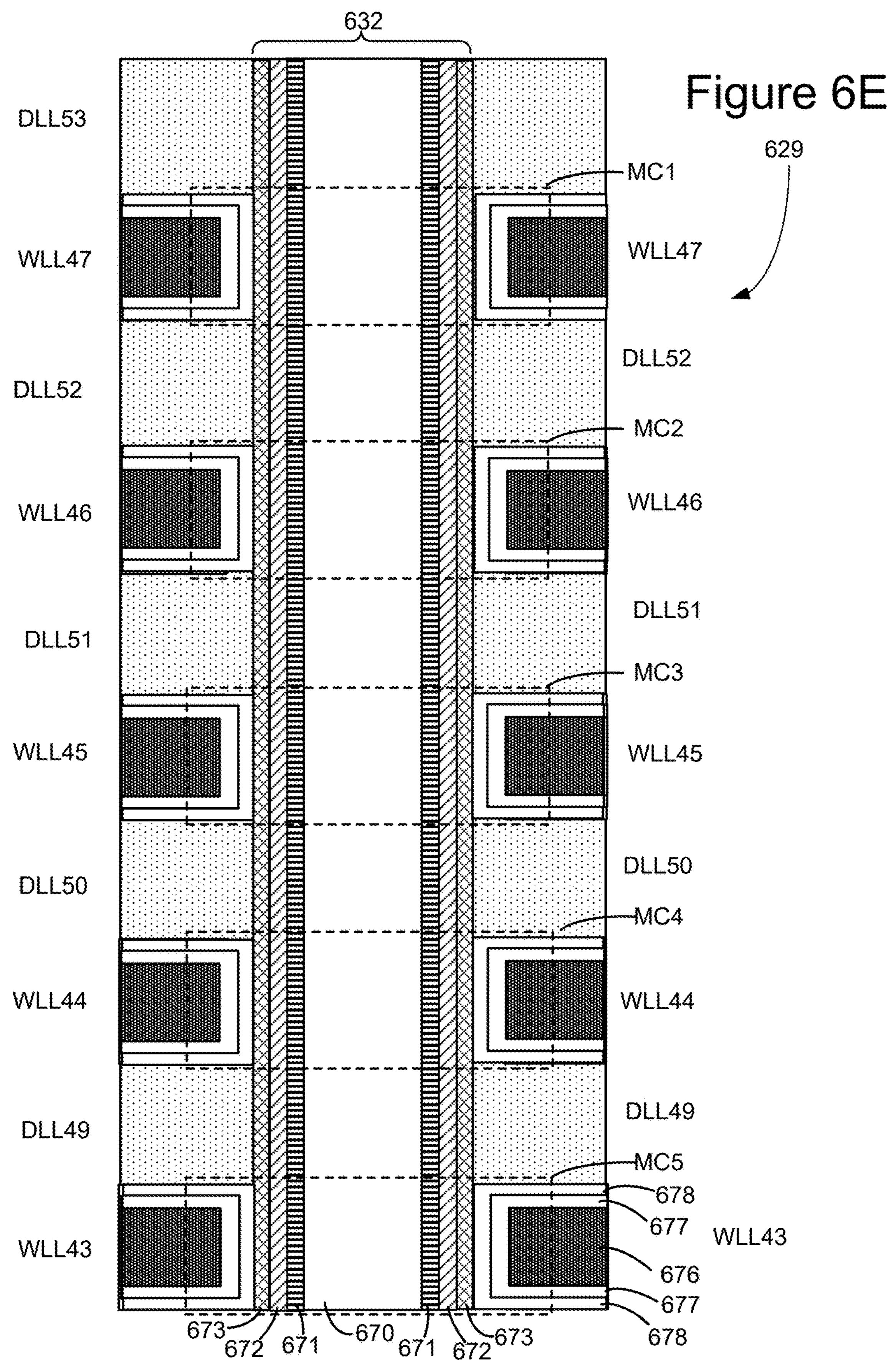
FIG. 6E depicts a cross sectional view of region of FIG. 6D that includes a portion of a vertical column.

FIGS. 6C-6E depict an example 3D NAND structure. FIG. 6C is a block diagram depicting a top view of a portion of one block from memory structure 302. The portion of the block depicted in FIG. 6C corresponds to portion 606 in block 2 of FIG. 6B. As can be seen from FIG. 6C, the block depicted in FIG. 6C extends in the direction of 633. In one embodiment, the memory array will have 60 layers. Other embodiments have less than or more than 60 layers. However, FIG. 6C only shows the top layer.

FIG. 6C depicts a plurality of circles that represent the vertical columns. Each of the vertical columns includes multiple select transistors and multiple memory cells. In one embodiment, each vertical column implements a NAND string. For example, FIG. 6C depicts vertical columns 622, 632, 642 and 652. Vertical column 622 implements NAND string 682. Vertical column 632 implements NAND string 684. Vertical column 642 implements NAND string 686. Vertical column 652 implements NAND string 688. More details of the vertical columns are provided below. Since the block depicted in FIG. 6C extends in the direction of arrow 633 and in the direction of arrow 633, the block includes more vertical columns than depicted in FIG. 6C.

FIG. 6C also depicts a set of bit lines 615, including bit lines 611, 612, 613, 614, . . . , 619. FIG. 6C shows twenty-four bit lines because only a portion of the block is depicted. It is contemplated that more than twenty-four bit lines connected to vertical columns of the block. Each of the circles representing vertical columns has an "x" to indicate its connection to one bit line. For example, bit line 614 is connected to vertical columns 622, 632, 642 and 652.

The block depicted in FIG. 6C includes a set of local interconnects 662, 664, 666, 668 and 669 that connect the various layers to a source line below the vertical columns. Local interconnects 662, 664, 666, 668 and 669 also serve to divide each layer of the block into four regions; for example, the top layer depicted in FIG. 6C is divided into regions 620, 630, 640 and 650, which are referred to as fingers or sub-blocks. In the layers of the block that implement memory cells, the four regions are referred to as word line sub-blocks that are separated by the local interconnects. In one embodiment, the word line sub-blocks on a common level of a block connect together at the end of the block to form a single word line. In another embodiment, the word line sub-blocks on the same level are not connected together. In one example implementation, a bit line only connects to one vertical column in each of regions 620, 630, 640 and 650. In that implementation, each block has sixteen rows of active columns and each bit line connects to four rows in each block. In one embodiment, all of four rows connected to a common bit line are connected to the same word line (via different word line sub-blocks on the same level that are connected together); therefore, the system uses the source side select lines and the drain side select lines to choose one (or another subset) of the four to be subjected to a memory operation (program, verify, read, and/or erase).

Although FIG. 6C shows each region having four rows of vertical columns, four regions and sixteen rows of vertical columns in a block, those exact numbers are an example implementation. Other embodiments may include more or fewer regions per block, more or fewer rows of vertical columns per region and more or fewer rows of vertical columns per block.

FIG. 6C also shows the vertical columns being staggered. In other embodiments, different patterns of staggering can be used. In some embodiments, the vertical columns are not staggered.

FIG. 6D depicts a portion of an embodiment of three dimensional memory structure 302 showing a cross-sectional view along line AA of FIG. 6C. This cross sectional view cuts through vertical columns 632 and 634 and region 630 (see FIG. 6C). The structure of FIG. 6D includes four drain side select layers SGD0, SGD1, SGD2 and SGD3; four source side select layers SGS0, SGS1, SGS2 and SGS3; four dummy word line layers DD0, DD1, DS0 and DS1; and forty-eight data word line layers WLL0-WLL47 for connecting to data memory cells. Other embodiments can implement more or less than four drain side select layers, more or less than four source side select layers, more or fewer than four dummy word line layers, and more or fewer than forty eight word line layers (e.g., 96 word line layers). Vertical columns 632 and 634 are depicted protruding through the drain side select layers, source side select layers, dummy word line layers and word line layers. In one embodiment, each vertical column comprises a NAND string. For example, vertical column 632 comprises NAND string 684. Below the vertical columns and the layers listed below is substrate 601, an insulating film 654 on the substrate, and source line SL. The NAND string of vertical column 632 has a source end at a bottom of the stack and a drain end at a top of the stack. As in agreement with FIG. 6C, FIG. 6D show vertical column 632 connected to Bit Line 614 via connector 617. Local interconnects 664 and 666 are also depicted.

For ease of reference, drain side select layers SGD0, SGD1, SGD2 and SGD3; source side select layers SGS0, SGS1, SGS2 and SGS3; dummy word line layers DD0, DD1, DS0 and DS1; and word line layers WLL0-WLL47 collectively are referred to as the conductive layers. In one embodiment, the conductive layers are made from a combination of TiN and tungsten. In other embodiments, other materials can be used to form the conductive layers, such as doped polysilicon, metal such as tungsten or metal silicide. In some embodiments, different conductive layers can be formed from different materials. Between conductive layers are dielectric layers DL0-DL59. For example, dielectric layers DL49 is above word line layer WLL43 and below word line layer WLL44. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layers WLL0-WLL47 connect to memory cells (also called data memory cells). Dummy word line layers DD0, DD1, DS0 and DS1 connect to dummy memory cells. A dummy memory cell does not store user data, while a data memory cell is eligible to store user data. Drain side select layers SGD0, SGD1, SGD2 and SGD3 are used to electrically connect and disconnect NAND strings from bit lines. Source side select layers SGS0, SGS1, SGS2 and SGS3 are used to electrically connect and disconnect NAND strings from the source line SL.

In some embodiments, the word lines are read sequentially, which means that the word lines are read either from low to high (e.g., WLL0 to WLL47) or from high to low (e.g., WLL47 to WLL0). It is not required to read the entire set of word lines when reading sequentially. Techniques are disclosed herein for providing compensation for interference caused by adjacent memory cells on target memory cells during a sequential read.

In some embodiments, the read of an individual word line is broken down into separate reads of sub-blocks. Referring again to FIG. 6C, the block is divided into four sub-blocks 620, 630, 640, 650. Thus, the four sub-blocks on one word line layer may be read, prior to reading the four sub-blocks on an adjacent word line layer. In some embodiments, data state information is used to provide compensation on a sub-block basis. For example, data state information for memory cells at WLL35 is kept for each of the four sub-blocks 620-650. Then, when reading sub-block 620 at WLL36 the data state information for sub-block 620 at WLL35 is used to compensate for interference from adjacent memory cells in sub-block 620 at WLL35, when reading sub-block 630 at WLL36 the data state information for sub-block 630 at WLL35 is used to compensate for interference from adjacent memory cells in sub-block 620 at WLL35, etc.

FIG. 6E depicts a cross sectional view of region 629 of FIG. 6D that includes a portion of vertical column 632. In one embodiment, the vertical columns are round and include four layers; however, in other embodiments more or less than four layers can be included and other shapes can be used. In one embodiment, vertical column 632 includes an inner core layer 670 that is made of a dielectric, such as $SiO_2$. Other materials can also be used. Surrounding inner core 670 is polysilicon channel 671. Materials other than polysilicon can also be used. Note that it is the channel 671 that connects to the bit line. Surrounding channel 671 is a tunneling dielectric 672. In one embodiment, tunneling dielectric 672 has an ONO structure. Surrounding tunneling dielectric 672 is charge trapping layer 673, such as (for example) Silicon Nitride. Other memory materials and structures can also be used. The technology described herein is not limited to any particular material or structure.

FIG. 6E depicts dielectric layers DLL49, DLL50, DLL51, DLL52 and DLL53, as well as word line layers WLL43, WLL44, WLL45, WLL46, and WLL47. Each of the word line layers includes a word line region 676 surrounded by an aluminum oxide layer 677, which is surrounded by a blocking oxide ($SiO_2$) layer 678. The physical interaction of the word line layers with the vertical column forms the memory cells. Thus, a memory cell, in one embodiment, comprises channel 671, tunneling dielectric 672, charge trapping layer 673, blocking oxide layer 678, aluminum oxide layer 677 and word line region 676. For example, word line layer WLL47 and a portion of vertical column 632 comprise a memory cell MC1. Word line layer WLL46 and a portion of vertical column 632 comprise a memory cell MC2. Word line layer WLL45 and a portion of vertical column 632 comprise a memory cell MC3. Word line layer WLL44 and a portion of vertical column 632 comprise a memory cell MC4. Word line layer WLL43 and a portion of vertical column 632 comprise a memory cell MC5. In other architectures, a memory cell may have a different structure; however, the memory cell would still be the storage unit.

Note that the charge trapping layer 673 may extend from one end of the NAND string to the other, and hence may be referred to herein as a continuous charge trapping layer. When a memory cell is programmed, electrons are stored in a portion of the charge trapping layer 673 which is associated with the memory cell. These electrons are drawn into the charge trapping layer 673 from the channel 671, through the tunneling dielectric 672, in response to an appropriate voltage on word line region 676. The Vt of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as gate induced drain leakage (GIDL).

Figure 6F:
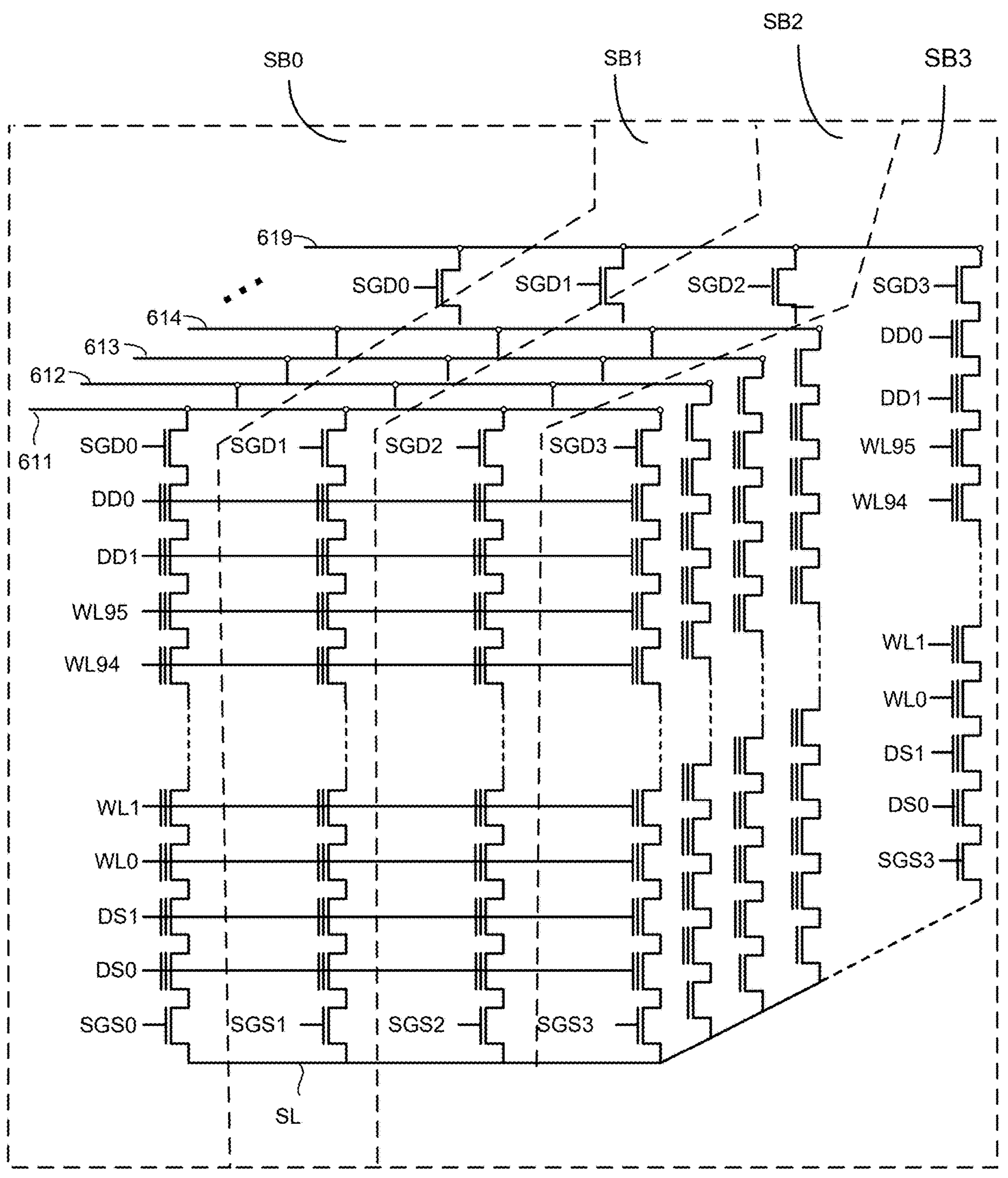
FIG. 6F is a schematic of a plurality of NAND strings showing multiple sub-blocks.

FIG. 6F is a schematic diagram of a portion of the memory depicted in FIGS. 6A-6E. FIG. 6F shows physical word lines WLL0-WLL95 running across the entire block. The structure of FIG. 6F corresponds to portion 606 in Block 2 of FIGS. 6A-6E, including bit lines 611, 612, 613, 614, . . . , 619. Within the block, each bit line is connected to four NAND strings. Drain side selection lines SGD0, SGD1, SGD2 and SGD3 are used to determine which of the four NAND strings connect to the associated bit line(s). Source side selection lines SGS0, SGS1, SGS2 and SGS3 are used to determine which of the four NAND strings connect to the common source line. The block can also be thought of as divided into four sub-blocks SB0, SB1, SB2 and SB3. Sub-block SB0 corresponds to those vertical NAND strings controlled by SGD0 and SGS0, sub-block SB1 corresponds to those vertical NAND strings controlled by SGD1 and SGS1, sub-block SB2 corresponds to those vertical NAND strings controlled by SGD2 and SGS2, and sub-block SB3 corresponds to those vertical NAND strings controlled by SGD3 and SGS3.

Although the example memory system of FIGS. 6A-6F is a three dimensional memory structure that includes vertical NAND strings with charge-trapping material, other (2D and 3D) memory structures (e.g., MRAM, ReRAM, PCM) can also be used with the technology described herein.

The memory systems discussed above can be erased, programmed and read. At the end of a successful programming process (with verification), the threshold voltages of the memory cells should be within one or more distributions of threshold voltages for programmed memory cells or within a distribution of threshold voltages for erased memory cells, as appropriate.

FIG. 7A is a graph of threshold voltage versus number of memory cells, and illustrates example threshold voltage distributions for the memory array when each memory cell stores one bit of data. FIG. 7A shows two threshold voltage distributions: E and P. Threshold voltage distribution E corresponds to an erased data state. Threshold voltage distribution P corresponds to a programmed data state. Memory cells that have threshold voltages in threshold voltage distribution E are, therefore, in the erased data state (e.g., they are erased). Memory cells that have threshold voltages in threshold voltage distribution P are, therefore, in the programmed data state (e.g., they are programmed). In one embodiment, erased memory cells store data "1" and programmed memory cells store data "0." Memory cells that store one bit of data are referred to as single level cells ("SLC").

FIG. 7B is a graph of threshold voltage versus number of memory cells, and illustrates example threshold voltage distributions for the memory array when each memory cell stores three bits of data. Other embodiments, however, may use other data capacities per memory cell (e.g., such as one, two, four, or five bits of data per memory cell). Memory cells that store more than one bit of data are referred to as multi-level cells ("MLC"). FIG. 7B shows eight threshold voltage distributions, corresponding to eight data states. For a data state N, that data state N has higher threshold voltages than data state N−1 and lower threshold voltages than data state N+1. The first threshold voltage distribution (data state) S0 represents memory cells that are erased. The other seven threshold voltage distributions (data states) S1-S7 represent memory cells that are programmed and, therefore, are also called programmed data states. In some embodiments, data states S1-S7 can overlap, with controller 122 relying on error correction to identify the correct data being stored.

FIG. 7B shows seven read reference voltages, Vr1, Vr2, Vr3, Vr4, Vr5, Vr6, and Vr7 for reading data from memory cells. By testing (e.g., performing sense operations) whether the threshold voltage of a given memory cell is above or below the seven read reference voltages, the system can determine what data state (i.e., S0, S1, S2, S3, . . . ) a memory cell is in. In FIG. 7A, read reference voltage Vr is used to test whether memory cells are erased or programmed.

FIG. 7B also shows seven verify reference voltages, Vv1, Vv2, Vv3, Vv4, Vv5, Vv6, and Vv7 (also referred to as verify target voltages). When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv5. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

In one embodiment, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 7B represent the full sequence programming. The technology described herein can also be used with other types of programming in addition to full sequence programming including (but not limited to) multiple stage/phase programming.

Each threshold voltage distribution (data state) of FIG. 7B corresponds to predetermined values for the set of data bits stored in the memory cells. The specific relationship between the data programmed into the memory cell and the threshold voltage levels of the memory cell depends upon the data encoding scheme adopted for the memory cells. In one embodiment, data values are assigned to the threshold voltage ranges using a Gray code assignment so that if the threshold voltage of a memory erroneously shifts to its neighboring physical state, only one bit will be affected.

FIG. 7C is a table describing one example of an assignment of data values to data states. In the table of FIG. 7B, S0=111 (erased state), S1=110, S2=100, S3=000, S4=010, S5=011, S6=001 and S7=101. Other encodings of data can also be used. No particular data encoding is required by the technology disclosed herein. In one embodiment, when a block is subjected to an erase operation, all memory cells are moved to data state S0, the erased state. Referring back to FIG. 4A, in one embodiment the ADL, BDL, and CDL data latches can respectively be used for the lower, middle, and upper page data values of a memory cell during a program operation.

In general, during verify operations and read operations, the selected word line is connected to a voltage (one example of a reference signal), a level of which is specified for each read operation (e.g., see read reference voltages Vr1, Vr2, Vr3, Vr4, Vr5, Vr6, and Vr7, of FIG. 6) or verify operation (e.g. see verify reference voltages Vv1, Vv2, Vv3, Vv4, Vv5, Vv6, and Vv7 of FIG. 6) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

Figure 8:
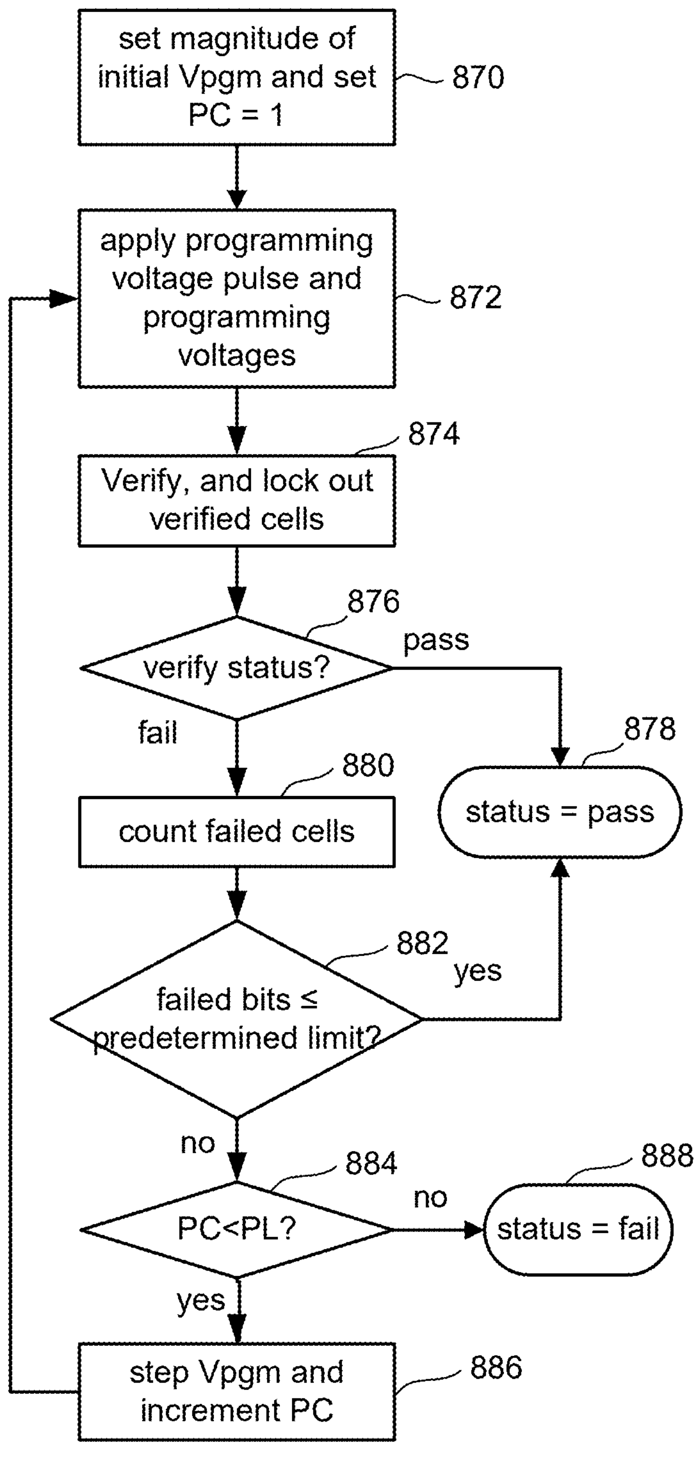
FIG. 8 is a flow chart describing one embodiment of a process for programming non-volatile memory.

FIG. 8 is a flowchart describing one embodiment of a process for programming that is performed by memory die 300/307. In one example embodiment, the process of FIG. 8 is performed on memory die 300/307 using the control circuit discussed above, at the direction of state machine 362. The process of FIG. 8 is performed to implement the programming of FIG. 7A, the full sequence programming of FIG. 7B, or other programming schemes including multi-stage programming. When implementing multi-stage programming, the process of FIG. 8 is used to implement any/each stage of the multi-stage programming process.

Typically, a programming signal Vpgm is applied to the control gates (via a selected word line) during a program operation as a series of programming voltage pulses, as depicted in FIG. 9. Between programming pulses are a set of verify pulses to perform verification. In many implementations, the magnitude of the program pulses is increased with each successive pulse by a predetermined step size ΔVpgm (e.g., 0.2 v-0.5 v). In step 870 of FIG. 8, the programming voltage (Vpgm) is initialized to the starting magnitude (e.g., ~12-16V or another suitable level) and a program counter PC maintained by state machine 362 is initialized at 1. In step 872, a program pulse of the programming signal Vpgm is applied to the selected word line (the word line selected for programming). In one embodiment, the group of memory cells being programmed concurrently are all connected to the same word line (the selected word line). The unselected word lines receive one or more boosting voltages (e.g., ~7-11 volts) to perform boosting schemes known in the art. In one embodiment, if a memory cell should be programmed, then the corresponding bit line is grounded. On the other hand, if the memory cell should remain at its current threshold voltage, then the corresponding bit line is connected to VDD (e.g., 1-3.5 volts) to inhibit programming. In step 872, the programming voltage pulse is concurrently applied to all memory cells connected to the selected word line so that all of the memory cells connected to the selected word line are programmed concurrently. That is, they are programmed at the same time or during overlapping times (both of which are considered concurrent). In this manner all of the memory cells connected to the selected word line will concurrently have their threshold voltage change, unless they have been locked out from programming.

In step 874, the appropriate memory cells are verified using the appropriate set of verify reference voltages to perform one or more verify operations. In one embodiment, the verification process is performed by testing whether the threshold voltages of the memory cells selected for programming have reached the appropriate verify reference voltage.

In step 876, it is determined whether all the memory cells have reached their target threshold voltages (pass). If so, the programming process is complete and successful because all selected memory cells were programmed and verified to their target states. A status of "PASS" (or success) is reported in step 878. If, in 876, it is determined that not all of the memory cells have reached their target threshold voltages (fail), then the programming process continues to step 880.

In step 880, the system counts the number of memory cells that have not yet reached their respective target threshold voltage distribution. That is, the system counts the number of memory cells that have, so far, failed the verify process. This counting can be done by the state machine 362, the controller 102, or other logic. In one implementation, each of the sense blocks will store the status (pass/fail) of their respective memory cells. In one embodiment, there is one total count, which reflects the total number of memory cells currently being programmed that have failed the last verify step. In another embodiment, separate counts are kept for each data state.

In step 882, it is determined whether the count from step 880 is less than or equal to a predetermined limit. In one embodiment, the predetermined limit is a number of bits that can be corrected by error correction codes (ECC) during a read process for the page of memory cells. If the number of failed cells is less than or equal to the predetermined limit, then the programming process can stop and a status of "PASS" is reported in step 878. In this situation, enough memory cells are programmed correctly such that the few remaining memory cells that have not been completely programmed can be corrected using ECC during the read process. In some embodiments, step 880 will count the number of failed cells for each sector, each target data state or other unit, and those counts will individually or collectively be compared to one or more thresholds in step 882.

In one embodiment, the predetermined limit can be less than the total number of bits that can be corrected by ECC during a read process to allow for future errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If the number of failed memory cells is not less than the predetermined limit, then the programming process continues at step 884 and the program counter PC is checked against the program limit value (PL). Examples of program limit values include 6, 20 and 30; however, other values can be used. If the program counter PC is not less than the program limit value PL, then the program process is considered to have failed, and a status of FAIL is reported in step 888. If the program counter PC is less than the program limit value PL, then the process continues at step 886 during which time the Program Counter PC is incremented by 1 and the program voltage Vpgm is stepped up to the next magnitude. For example, the next pulse will have a magnitude greater than the previous pulse by a step size (e.g., a step size of 0.1-0.4 volts). After step 886, the process loops back to step 872 and another program pulse is applied to the selected word line so that another iteration (steps 872-886) of the programming process of FIG. 8 is performed.

Because it is possible that errors can occur when programming or reading, and errors can occur while storing data (e.g., due to electrons drifting, data retention issues or other phenomenon), error correction is used with the programming of data. Memory systems often use Error Correction Codes (ECC) to protect data from corruption. Many ECC coding schemes are well known in the art. These conventional error correction codes are especially useful in large scale memories, including flash (and other non-volatile) memories, because of the substantial impact on manufacturing yield and device reliability that such coding schemes can provide, rendering devices that have a few non-programmable or defective cells as useable. Of course, a tradeoff exists between the yield savings and the cost of providing additional memory cells to store the code bits (i.e., the code "rate"). As such, some ECC codes are better suited for flash memory devices than others. Generally, ECC codes for flash memory devices tend to have higher code rates (i.e., a lower ratio of code bits to data bits) than the codes used in data communications applications (which may have code rates as low as ½). Examples of well-known ECC codes commonly used in connection with flash memory storage include Reed-Solomon codes, other BCH codes, Hamming codes, and the like. Sometimes, the error correction codes used in connection with flash memory storage are "systematic," in that the data portion of the eventual code word is unchanged from the actual data being encoded, with the code or parity bits appended to the data bits to form the complete code word.

The particular parameters for a given error correction code include the type of code, the size of the block of actual data from which the code word is derived, and the overall length of the code word after encoding. For example, a typical BCH code applied to a sector of 512 bytes (4096 bits) of data can correct up to four error bits, if at least 60 ECC or parity bits are used. Reed-Solomon codes are a subset of BCH codes, and are also commonly used for error correction. For example, a typical Reed-Solomon code can correct up to four errors in a 512 byte sector of data, using about 72 ECC bits. In the flash memory context, error correction coding provides substantial improvement in manufacturing yield, as well as in the reliability of the flash memory over time.

In some embodiments, controller 102 receives host data (also referred to as user data or data from an entity external to the memory system), also referred to as information bits, that is to be stored non-volatile memory structure 302. The informational bits are represented by the matrix i=[1 0] (note that two bits are used for example purposes only, and many embodiments have code words longer than two bits). An error correction coding process (such as any of the processes mentioned above or below) is implemented by ECC engine 226/256 of controller 102 in which parity bits are added to the informational bits to provide data represented by the matrix or code word v=[1 0 1 0], indicating that two parity bits have been appended to the data bits. Other techniques can be used that map input data to output data in more complex manners. For example, low density parity check (LDPC) codes, also referred to as Gallager codes, can be used. More details about LDPC codes can be found in R. G. Gallager, "Low-density parity-check codes," IRE Trans. Inform. Theory, vol. IT-8, pp. 21 28, January 1962; and D. MacKay, Information Theory, Inference and Learning Algorithms, Cambridge University Press 2003, chapter 47. In practice, such LDPC codes are typically applied (e.g., by ECC engine 226/256) to multiple pages encoded across a number of storage elements, but they do not need to be applied across multiple pages. The data bits can be mapped to a logical page and stored in memory structure 302 by programming one or more memory cells to one or more programming states, which corresponds to v.

In one embodiment, programming serves to raise the threshold voltage of the memory cells to one of the programmed data states S1-S7. Erasing serves to lower the threshold voltage of the memory cells to the Erase data state S0.

One technique to erase memory cells in some memory devices is to bias a p-well (or other types of) substrate to a high voltage to charge up a NAND channel. An erase enable voltage is applied to control gates of memory cells while the NAND channel is at a high voltage to erase the non-volatile storage elements (memory cells). Another approach to erasing memory cells is to generate gate induced drain leakage (GIDL) current to charge up the NAND string channel. An erase enable voltage is applied to control gates of the memory cells, while maintaining the string channel potential to erase the memory cells.

In one embodiment, the GIDL current is generated by causing a drain-to-gate voltage at a select transistor. A transistor drain-to-gate voltage that generates a GIDL current is referred to herein as a GIDL voltage. The GIDL current may result when the select transistor drain voltage is significantly higher than the select transistor control gate voltage. GIDL current is a result of carrier generation, i.e., electron-hole pair generation due to band-to-band tunneling and/or trap-assisted generation. In one embodiment, GIDL current may result in one type of carriers, e.g., holes, predominantly moving into NAND channel, thereby raising potential of the channel. The other type of carriers, e.g., electrons, are extracted from the channel, in the direction of a bit line or in the direction of a source line, by an electric field. During erase, the holes may tunnel from the channel to a charge storage region of memory cells and recombine with electrons there, to lower the threshold voltage of the memory cells.

The GIDL current may be generated at either end of the NAND string. A first GIDL voltage may be created between two terminals of a select transistor (e.g., drain side select transistor) that is connected to a bit line to generate a first GIDL current. A second GIDL voltage may be created between two terminals of a select transistor (e.g., source side select transistor) that is connected to a source line to generate a second GIDL current. Erasing based on GIDL current at only one end of the NAND string is referred to as a one-sided GIDL erase. Erasing based on GIDL current at both ends of the NAND string is referred to as a two-sided GIDL erase.

As discussed above, FIG. 9 depicts the programming signal Vpgm as a series of programming voltage pulses. These programming voltage pulses are one example of doses of programming applied to a plurality of non-volatile memory cells being programmed to a data state. As described by FIG. 8, the system performs program verification between the doses of programming, as depicted in FIGS. 10 and 11. FIG. 10, which illustrates an embodiment in which memory cells store one bit of data per memory cell, depicts two of the programming voltage pulses 902 and 904 of FIG. 9. Between programming voltage pulses 902 and 904 is verify voltage pulse 910. In one embodiment, verify voltage pulse 910 has a magnitude of Vv (see FIG. 7A) and represents the system performing program verification (step 874) between the doses of programming (successive iterations of step 872).

FIG. 11, which illustrates an embodiment in which memory cells store three bits of data per memory cell, depicts two of the programming voltage pulses 902 and 904 of FIG. 9. Between programming voltage pulses 902 and 904 are verify voltage pulses v1, v2, v3, v4, v5, v6 and v7. In one embodiment, verify voltage pulse v1 has a magnitude of Vv1 (see FIG. 7B), verify voltage pulse v2 has a magnitude of Vv2, verify voltage pulse v3 has a magnitude of Vv3, verify voltage pulse v4 has a magnitude of Vv4, verify voltage pulse v5 has a magnitude of Vv5, verify voltage pulse v6 has a magnitude of Vv6, and verify voltage pulse v7 has a magnitude of Vv7. Verify voltage pulses v1, v2, v3, v4, v5, v6 and v7 represent the system performing program verification (step 874) between the doses of programming (successive iterations of step 872).

Figure 12:
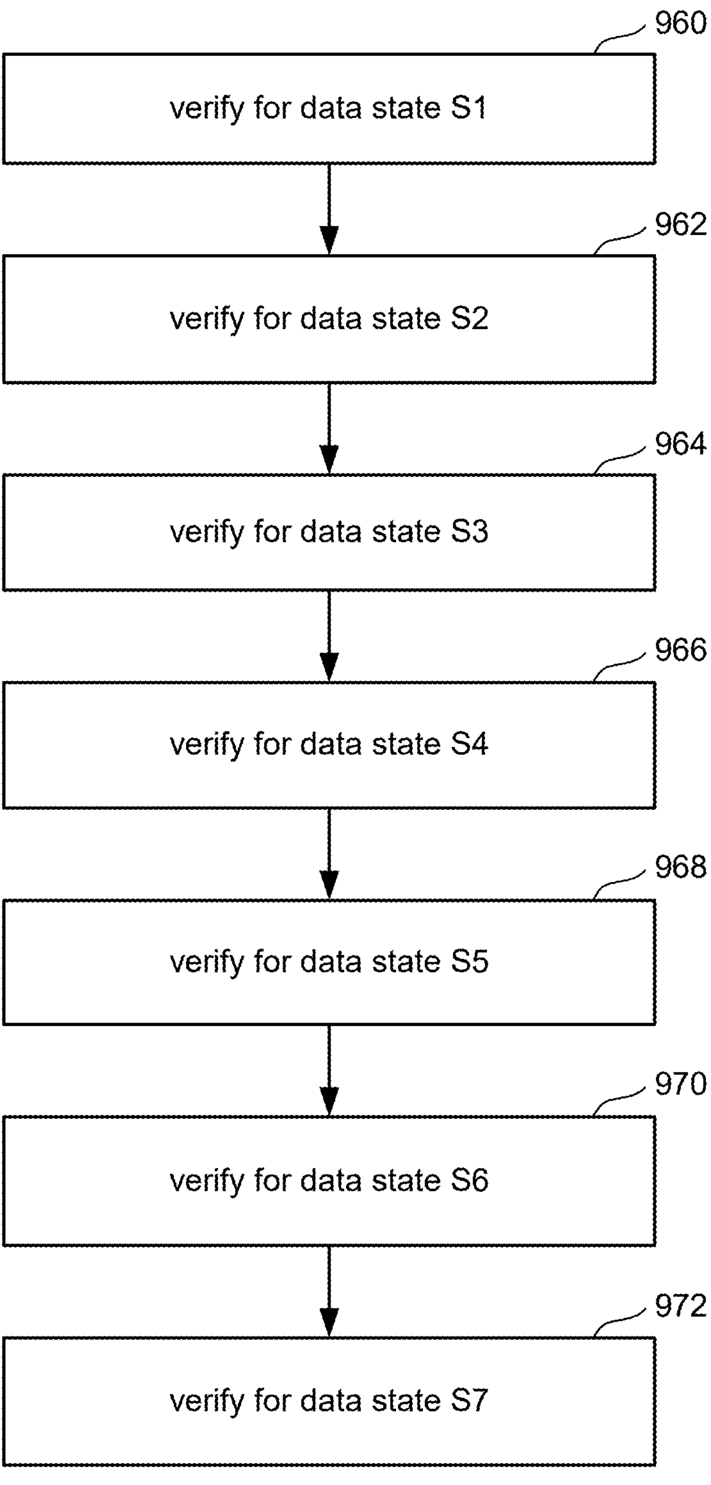
FIG. 12 is a flow chart describing one embodiment of a process for verifying programming of non-volatile memory.

FIG. 12 is a flow chart describing one embodiment of a process for verifying programming of non-volatile memory. That is, the process of FIG. 12 is a process performed during an example implementation of step 874 of FIG. 8 for an embodiment in which memory cells store three bits of data per memory cell. The process of FIG. 12 is performed using the waveforms of FIGS. 9 and 11. In step 960 of FIG. 12, the system performs verification for data state S1. For example, the system tests whether memory cells being programmed to data state S1 have threshold voltages greater than Vv1 (e.g., applying verify voltage pulse v1 of FIG. 11 to the control gates of memory cells being programmed to data state S1).

In step 962, the system performs verification for data state S2. For example, the system tests whether memory cells being programmed to data state S2 have threshold voltages greater than Vv2 (e.g., applying verify voltage pulse v2 of FIG. 11 to the control gates of memory cells being programmed to data state S2).

In step 964, the system performs verification for data state S3. For example, the system tests whether memory cells being programmed to data state S3 have threshold voltages greater than Vv3 (e.g., applying verify voltage pulse v3 of FIG. 11 to the control gates of memory cells being programmed to data state S3).

In step 966, the system performs verification for data state S4. For example, the system tests whether memory cells being programmed to data state S4 have threshold voltages greater than Vv4 (e.g., applying verify voltage pulses v4 of FIG. 11 to the control gates of memory cells being programmed to data state S4).

In step 968, the system performs verification for data state S5. For example, the system tests whether memory cells being programmed to data state S5 have threshold voltages greater than Vv5 (e.g., applying verify voltage pulses v5 of FIG. 11 to the control gates of memory cells being programmed to data state S5).

In step 970, the system performs verification for data state S6. For example, the system tests whether memory cells being programmed to data state S6 have threshold voltages greater than Vv6 (e.g., applying verify voltage pulse v6 of FIG. 11 to the control gates of memory cells being programmed to data state S6).

In step 972, the system performs verification for data state S7. For example, the system tests whether memory cells being programmed to data state S7 have threshold voltages greater than Vv7 (e.g., applying verify voltage pulse v7 of FIG. 11 to the control gates of memory cells being programmed to data state S7). Note that, in one embodiment, steps 960-972 are performed between doses of programming (e.g., between programming voltage pulses). In some embodiments, one or more of steps 960-972 can be skipped between certain programming voltage pulses. In one embodiment, steps 960-972 are performed sequentially (in any order or in the order depicted), while in other embodiments steps 960-972 are performed in parallel (e.g., concurrently).

The flow of FIG. 12 illustrates the verification of all of the target data states, but to speed up the verification phase of a programming operation a "smart verify" operation can be used. In a smart verify, not all of the target data state levels are checked. Initially, for the first few programming pulses, only the lower data states need to be checked. As the programming operation continues, as the lower target data states begin to verify, additional higher data states are included; and, as the lower states finish, the lower target state verifies can be dropped out.

Energy consumption is an important consideration in the design of non-volatile memory devices, both the NAND structures primarily discussed above and also in non-volatile technologies, such as MRAM and PCM. One way to reduce energy consumption and also use less space, is to change the architecture in the control circuit to reduce the amount of circuitry. The following presents embodiment that can reduce the circuitry used in the data output path (DOUT) between the sensing circuitry and the input/output (IO) pads on memory die 300 or the control die 311 of respective FIGS. 3A and 3B.

A common architecture uses a "matched" DOUT design, in which the clock path for providing the data to the IO pads is structured like the data path using the clock signal so that the delays of the signals can be closely matched, helping ensure setup and hold margins at the internal boundary of the data path. The matched architecture requires additional stages, leading to increased current and area requirements, and the extra stages contribute to higher jitter, which ultimately affects the data valid window. As memory designs progress, the internal circuitry needs to be modified to accommodate variations in path delay. To address these challenges, the following embodiments present a scalable architecture based on training techniques. This can eliminate the need for a matched architecture and significantly reduce power consumption by reducing the number of stages required.

Figure 13:
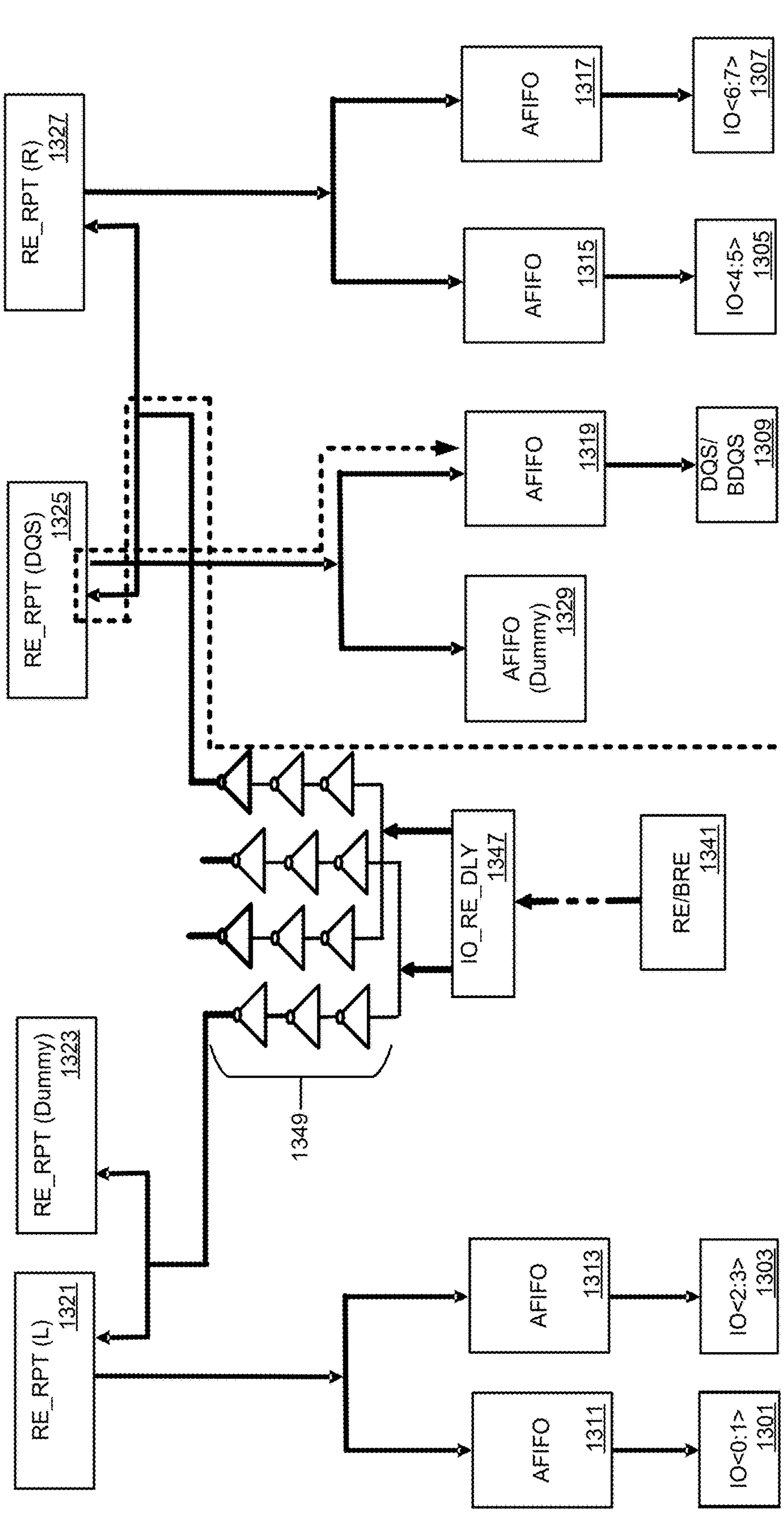
FIG. 13 is a block diagram of an example of some of the DOUT path elements and the input clock path for a matched DOUT design.

FIG. 13 is a block diagram of an example of some of the DOUT path elements and the input clock path for a matched DOUT design. This example includes 4 pairs of data IO pads IO<0:1> 1301, IO<2:3> 1303, IO<4:5> 1305, IO<6:7> 1307 and corresponding data first in, first out data buffers (FIFOs) 1311, 1313, 1315, 1317 to hold the data. (The embodiments presented here for these elements will use FIFOs and refer to these data buffers as FIFOs, but other organizations for the data buffers can be used.) FIG. 13 also shows a pad 1341 for receiving a high speed strobe signal and its inverse RE/BRE that is then propagated through the control circuit to a clock path FIFO 1319 to provide an output clock and its inverse DQS/BDQS at the IO pad 1309. FIG. 13 uses a matched DOUT design where the path between the pads RE/BRE 1341 and DQS/BDQS 1309 includes a number of stages to mimic or duplicate the number of stages and consequent delay seen by the data. Among these elements are a number of delay stages IO_RE_DLY 1347, whose output is split and travels through a number of inverter stages 1349, followed by a number of repeater stages RE_RPT (L) 1321, RE_RPT (DQS) 1325, and RE_RPT (R) 1327 for the different sets of FIFOs. For balancing the circuitry, a dummy repeater RE_RPT (Dummy) 1323 and dummy FIFO 1329 can be included. The path from RE/BRE 1341 to FIFO 1319 is illustrated by the heavy broken line.

In such a matched DOUT architecture, to reduce energy consumption requires lower voltage devices, which are not always feasible. Additionally, as the design of the data path changes across generations of devices, the matching elements of the clock paths require corresponding design changes, so that the matched DOUT architecture with internal margin is not readily scalable.

Figure 14A:
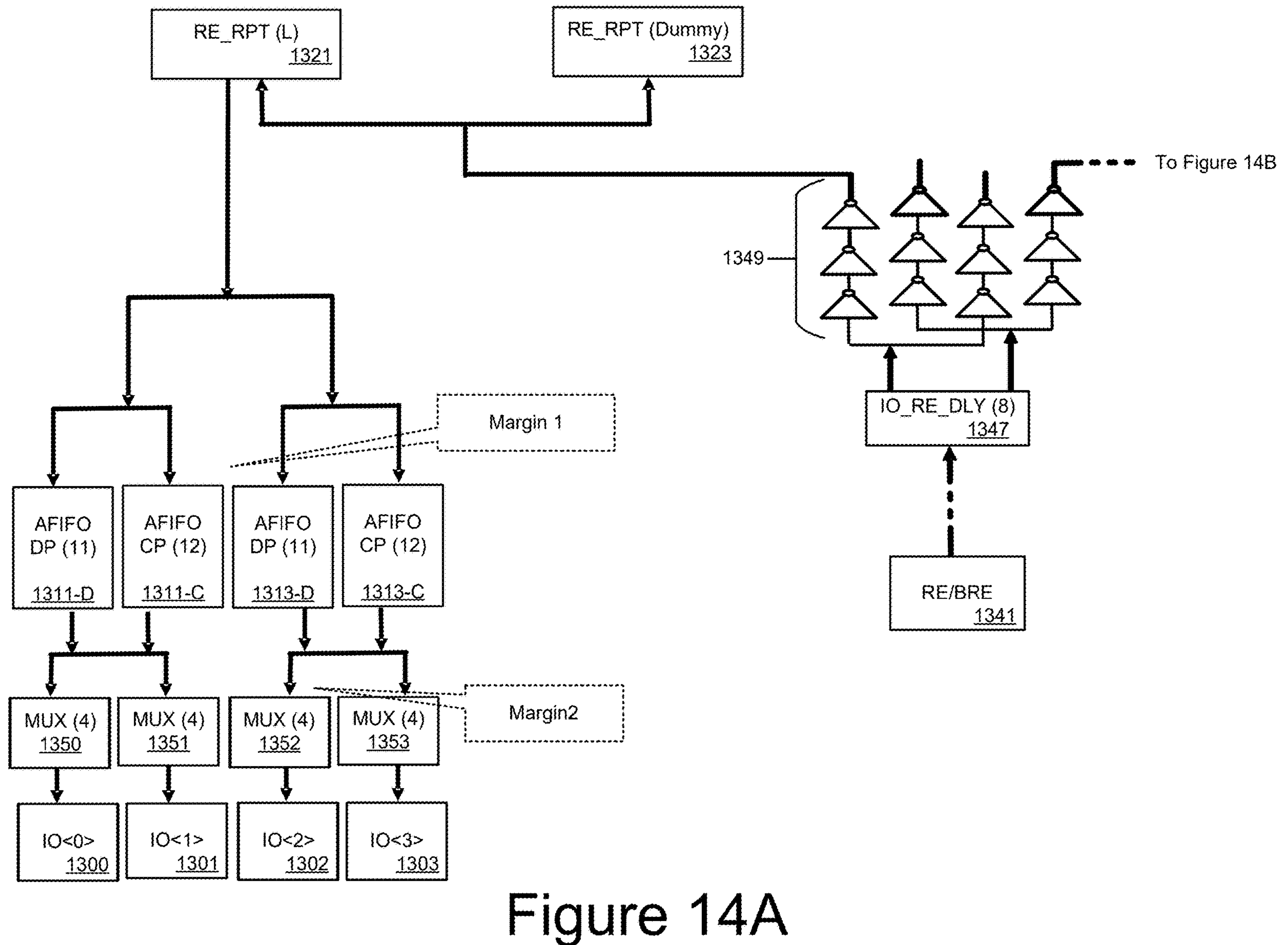
FIGS. 14A and 14B are block diagrams which provide more detail about the number of high-speed stages in an implementation of FIG. 13.
Figure 14B:
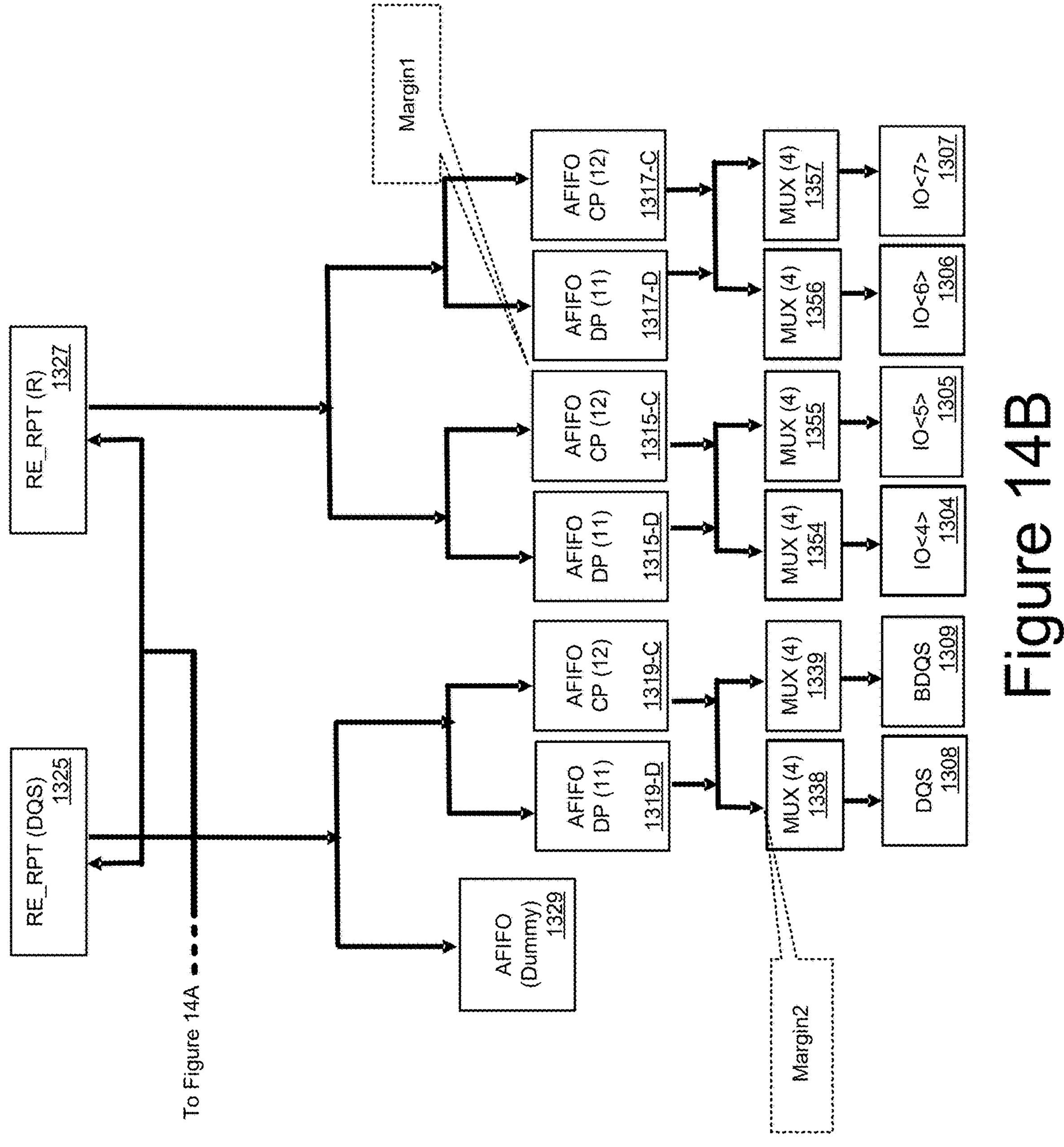

FIGS. 14A and 14B provide more detail about the number of high-speed stages in an implementation of the simplified FIG. 13, where FIGS. 14A and 14B are parts of the same circuit. RE/BRE 1341, IO_RE_DLY 1347, and inverters 1349 are as in FIG. 13, but the RE delays now includes the parenthetical (8) to indicate the number of stages, namely 8 stages, in IO_RE_DLY 1347. The repeater stage elements RE_RPT (L) 1321, RE_RPT (Dummy) 1323, RE_RPT (DQS) 1325, and RE_RPT (R) 1327 can also be as described with respect to FIG. 13.

With respect to the FIFOs, for each pair of IO pads are both data path FIFOs AFIFO DP 1311-D, AFIFO DP 1313-D, AFIFO DP 1315-D, AFIFO DP 1317-D and clock path FIFOs AFIFO CP 1311-C, AFIFO CP 1313-C, AFIFO CP 1315-V, AFIFO CP 1317-C. For the DQS/BDQS pads, there are similarly a data path FIFO AFIFO DP 1319-D and clock path FIFOs AFIFO CP 1319-C. The number of stages are again shown in parentheses, with the data path FIFOs having 11 stages and the clock path FIFOs having 12 stages. The IO pads IO<0> IO<7> 1300-1307 and DQS/BDQS 1308/1309 are now also shown connected through 4 stage multiplexers 1350-1359. As can be seen from this more detailed representation, there is a significant amount of circuitry involved for the matching of the data path under the matched DOUT architecture. (The Margin 1 and Margin 2 pointers will be discussed below.)

To reduce power requirement, layout area, and the need to update the matching clock path elements when the data path changes, the following embodiments reduce the number of stages in the high speed RE clock path, RE repeaters, and FIFOs by moving to an unmatched DOUT architecture. In some embodiments, to provide proper functionality, the memory will not have prefetch in the internal circuitry since, by doing prefetch, invalid data may be output between valid data bytes, as can be illustrated with respect to FIG. 15.

Figure 15:
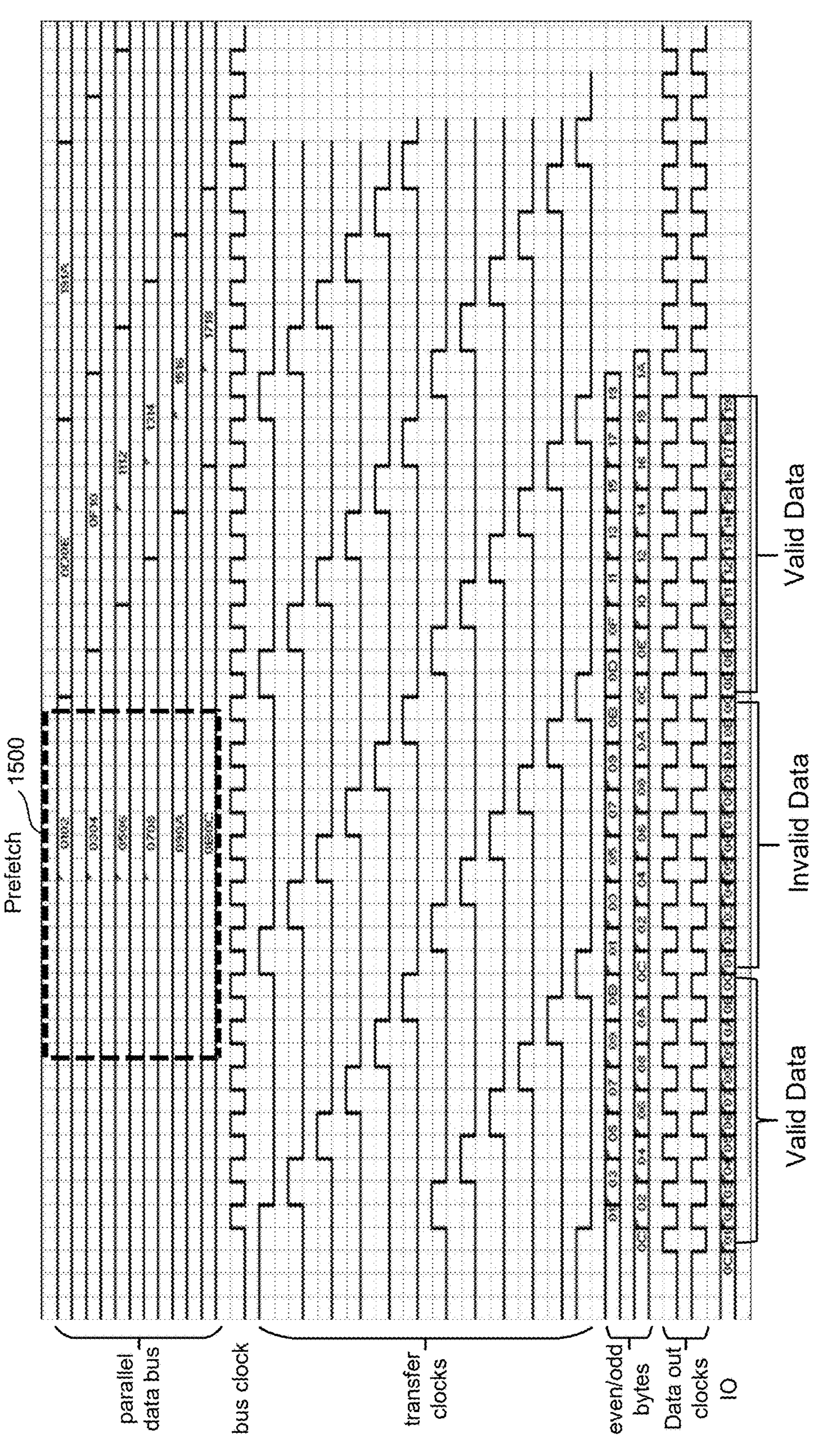
FIG. 15 is a set of waveforms illustrating some of the clock signals involved in the DOUT path.

FIG. 15 is a set of waveforms illustrating some of the clock signals and waveforms involved in the DOUT path for one embodiment. At top are the word wide transfers off of the data bus from the sense circuitry, such as the DBUS of FIG. 4B, where in this embodiment, there are 6 waveforms each of 6 bus clock cycles wide. These words are offset based on a bus clock, with the different words offset by one cycle. Underneath are a set of transfer clocks to break down the words on the data bus into even and odd bit streams. Below these are the data clock DQS and its inverse BDQS used to transfer data out on the IO pads at bottom. FIG. 15 illustrates the including of a data prefetch 1500 within the heavy line weight broken box. As this prefetch propagates through the DOUT path, it will arrive at the IO pads, but will result in an invalid data output in between sets of value data.

Returning to FIGS. 14A and 14B, some changes can be made in an unmatched DOUT architecture by the inclusion of tunable delays. This can include removing the 8 stages of delay of IO_RE_DLY 1347 and adding in its place a masking circuit. Another change is to reduce the number of stages of the repeater circuits RE_RPT (L) 1321, RE_RPT (Dummy) 1323, RE_RPT (DQS) 1325, and RE_RPT (R) 1327. Stages can be removed from the clock path FIFOs AFIFO CP 1311-C, 1313-C, 1315-C, 1317-C and from the multiplexers 1350-1359. Additionally, a tunable delay can be added to each FIFO clock path. A newly added set of parameters are added for the tunable delays and masking circuit. These changes are illustrated in FIG. 16.

Figure 16A:
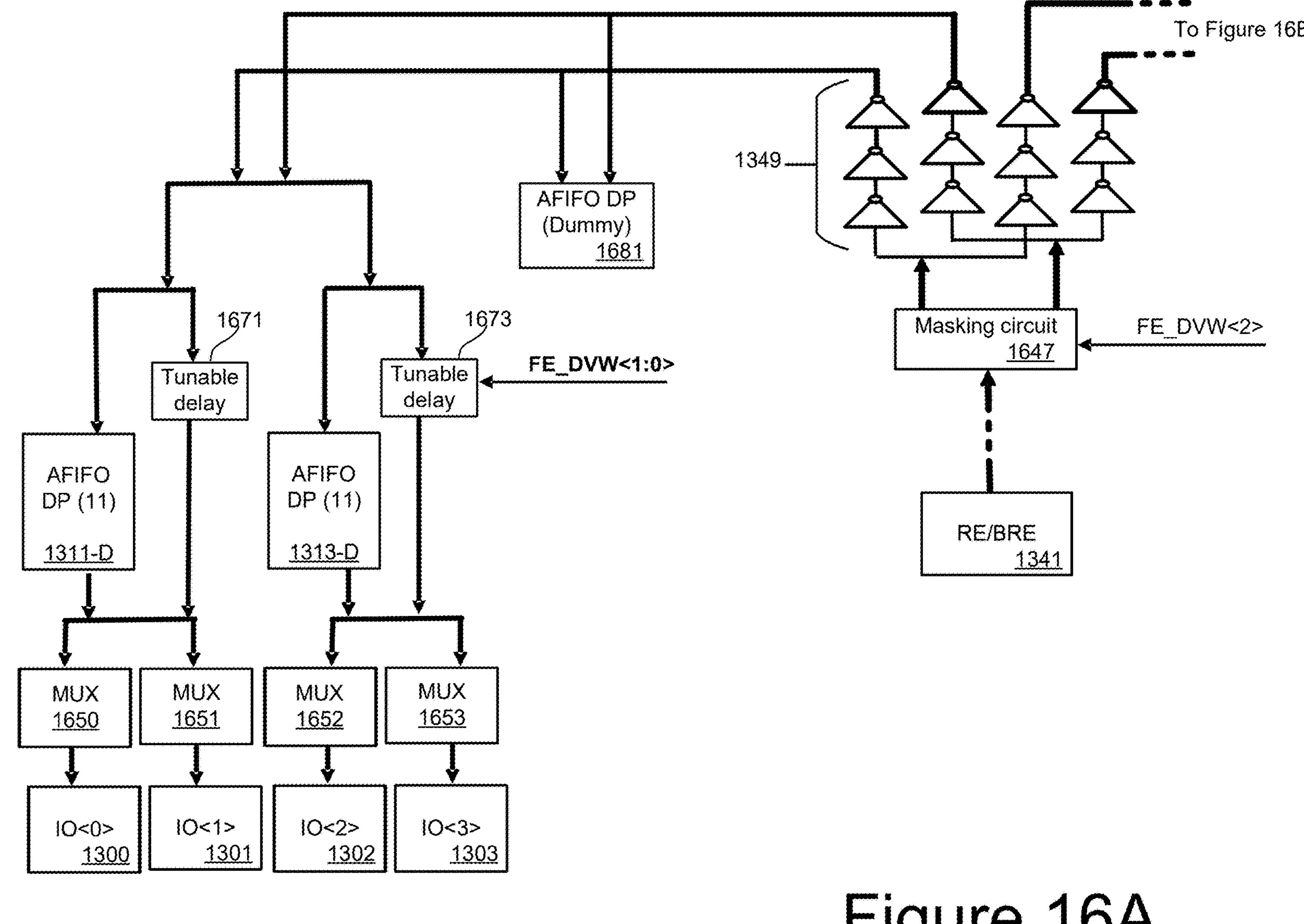
FIGS. 16A and 16B are a block diagram of an embodiment of an unmatched DOUT architecture with tunable delay.
Figure 16B:
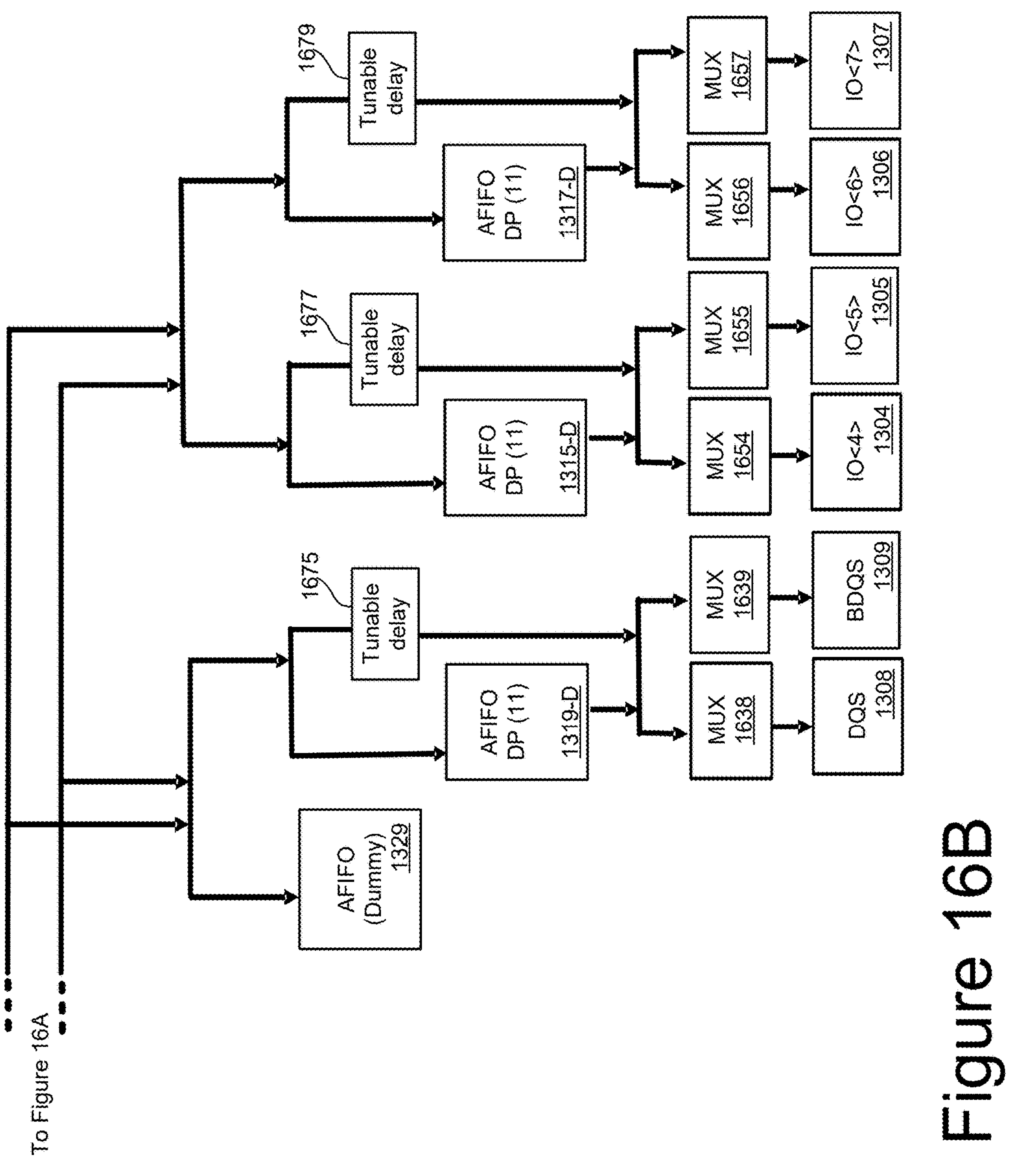

FIGS. 16A and 16B is a block diagram of an embodiment of an unmatched DOUT architecture with tunable delay, where these figures are different portions of the same circuit. Relative to the matched DOUT circuit of FIGS. 14A and 14B, the matching path for the clock signal has largely been eliminated and a masking circuit and tunable delays have been added. More specifically, the clock path FIFOs 1311-C, 1313-C, 1315-C, 1317-C, and 1319-C are removed, as are the clock path repeaters 1321, 1323, 1325, and 1327. The multiplexers 1350-1359 are now renumbered 1650-1559 as they may now have fewer stages in the unmatched architecture. For each of the removed clock path FIFOs, a tunable delay element 1671, 1673, 1675, 1677, 1679 has been added. Although only shown at tunable delay 1673, each of the tunable delay circuits receives one or more bits of a parameter to adjust the internal margins, as described further below. Additionally, although the examples given here introduce the relative delay into the clock path, as the purpose is to introduce a relative delay between the clock paths and data paths, other embodiments can instead introduce the relative delay into the data path or use a combination of both clock and data paths. In this example, the data valid window parameter FE_DVW<2:0> is a 3-bit parameter, where two of the bits (FE_DVW<1:0>) go to the tunable delay circuits 1671, 1673, 1675, 1677, 1679. The delay element IO_RE_DLY 1347 is now removed and a masking circuit 1647 is added. The masking circuit 1647 also receives one or more bits (in this example the single bit FE_DVW<2>) of the data valid window parameter. To balance the circuitry, a dummy data path FIFO 1681 cans also be included.

In a matched DOUT architecture, as in FIGS. 13-15, one goal is to keep the clock signal pulses aligned throughout its path by mirroring the data path elements in the clock path. In the unmatched approach, rather than try to keep the signals aligned, clock signals with the proper frequencies are provided and then, by comparing with a training, or "golden", data set, a determination is made as to whether the clock signals need to be shifted by some portion so that they align sufficiently to be used on the data waveforms. The data valid window parameter FE_DVW values introduce these shifts and are determined in a training process.

Figure 17:
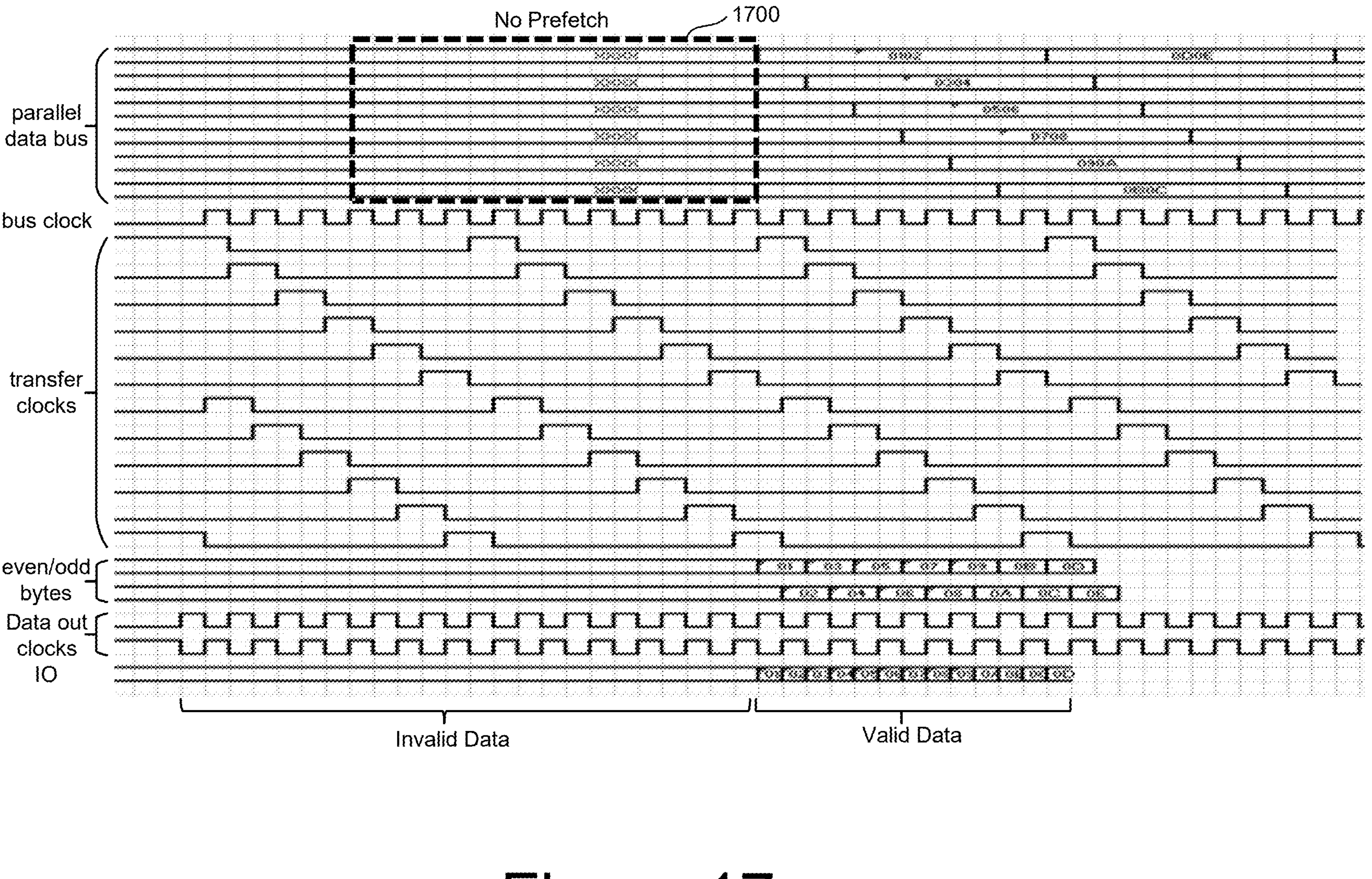
FIG. 17 illustrates an embodiment of a timing diagram for the architecture of FIGS. 16A and 16B.

FIG. 17 is an embodiment of a timing diagram for the architecture of FIGS. 16A and 16B. The waveforms are arranged the same way as in FIG. 15, but in this embodiment there no data prefetch in the interval within the box 1700 and data does not show up on the parallel data until after the interval represented by the boxed region, with words sequentially showing up at each cycle of the bus clock. Consequently, there is no data for the even and odd bytes until this time. On the IO pads, there is then only invalid data until this valid data shows up on the IO pads. As will now be discussed, the controller 102 or other control circuitry performs a data valid window (DVW) training to find the number of in 2200 valid data bytes by comparing the output data with the golden data, after which the data and clocks can be matched. Note that in FIG. 17, the beginning of the top line of the data bus waveform algins with the left hand side of the heavy broken box 1700, which also aligns with a rising edge of the waveform of the top-most transfer clock.

The data valid window training is introduced to satisfy internal margins in unmatched DOUT architecture, where the control circuitry, such as the controller 102, performs the data valid window training and help ensure a good data valid window at the NAND interface. The clock masking circuitry 1647 and tunable delays 1671, 1673, 1675, 1677, 1679 are added to tweak margins and improve the data valid window training to compensate for being unmatched. FIGS. 14A and 14B, illustrate the margins (Margin 1, Margin 2) that are compensated for using the FE_DVW parameters, masking circuit and tunable delays. Margin 1 is for the data path up to the FIFOs (such as 1313-D), when data is transferred off the internal parallel data bus on to the FIFOs, and is compensated for by the masking circuit 1647. Margin 2 occurs on the subsequent path through to the multiplexers (such as 1652 and 1653), when data is transferred from the FIFOs to the multiplexers, and is compensated by the tunable delays (such as 1673). In the examples here, the waveforms on the parallel data bus are 6 cycles long and even/odd data bytes will be of 1 cycle. The FE_DVW parameter has 3 bits, one for the masking circuit 1647 to shift the transfer clocks by either no or one cycle and two bits for the tunable delays (such as 1673) that can shift the data out clocks by half clock cycles.

Figure 18:
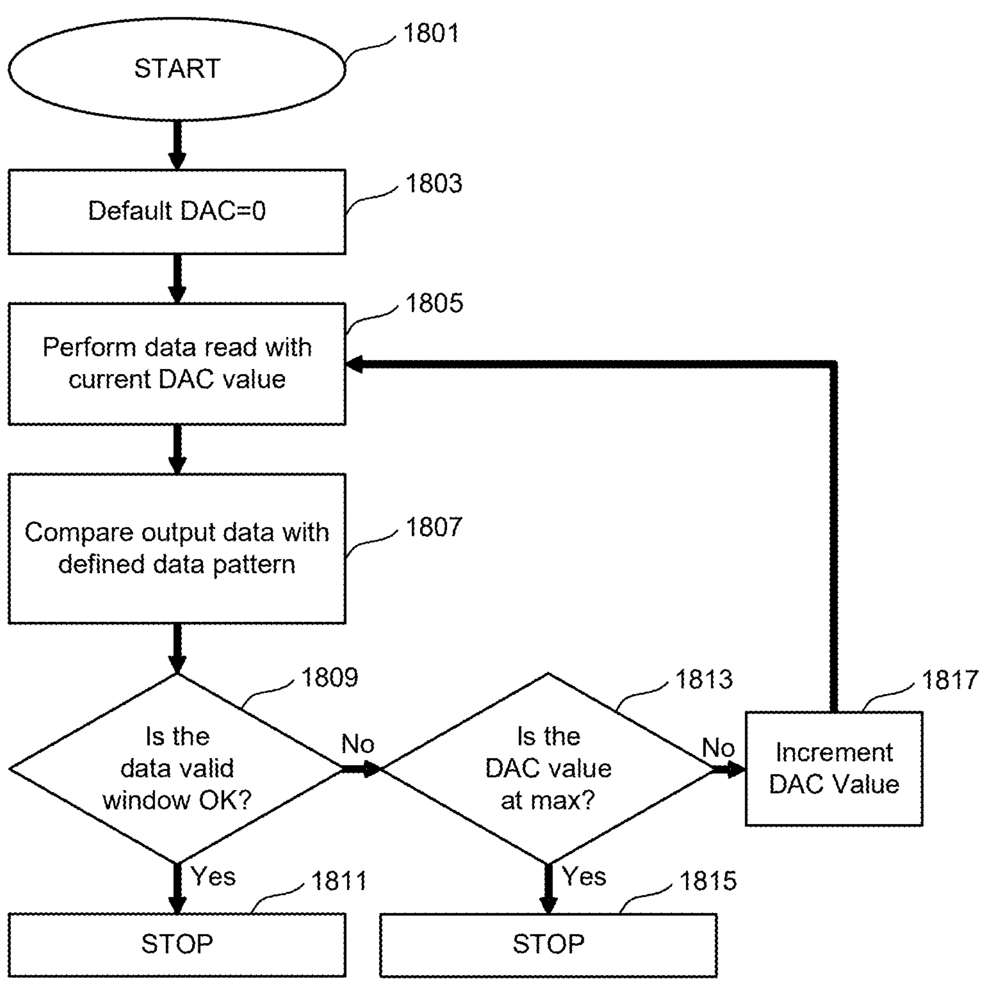
FIG. 18 is a flowchart of an embodiment for a data valid window training sequence.

FIG. 18 is a flowchart of an embodiment for a data valid window training sequence. In one set of embodiments, this process can be performed by the controller 102 at each power up to establish the data valid window parameters and can be incorporated to the same process as used for training other read parameters at start up as part of a start-up routine. These parameter values can then be stored as register values, for example, in storage 366 of the system control logic 360. This example uses an embodiment with 3 bits, or 8 DAC values, with one bit for the masking value and two bits for the delay value. The flow starts at 1801, setting the default value of DAC=0 at step 1803. A read is then performed using the current DAC value for FE_DVW<2:0> at step 1805. The result of the read can then be compared with the defined test pattern at step 1807. The result is then checked at step 1809 and, if current valid data is good, the corresponding flag value is set for the parameter and the process stops at 1811. If the current DAC value does not pass at 1809, at step 1813 is checked to see whether it is at its maximum value and, if so, the flow stops at step 1815; and, if not, the DAC value is incremented at step 1817 and loops back to step 1805.

FIG. 19 is an example of a table of the parameter values for the tunable delay parameter FE_DVW<2:0>. For the three bits, FE_DVW<2> is for Margin 1, where for 0 is the masking circuit 1647 includes no masking and for 1 introduces masking of one cycle to tweak Margin 1. FE_DVW<1:0> are a 2 bit tunable delay, MUX DAC<1:0>, used by the tunable delay circuits 1671, 1673, 1675, 1677, 1679 to introduce a corresponding amount of delay of half clock cycle before the MUXs.

Figures 20A, 20B:
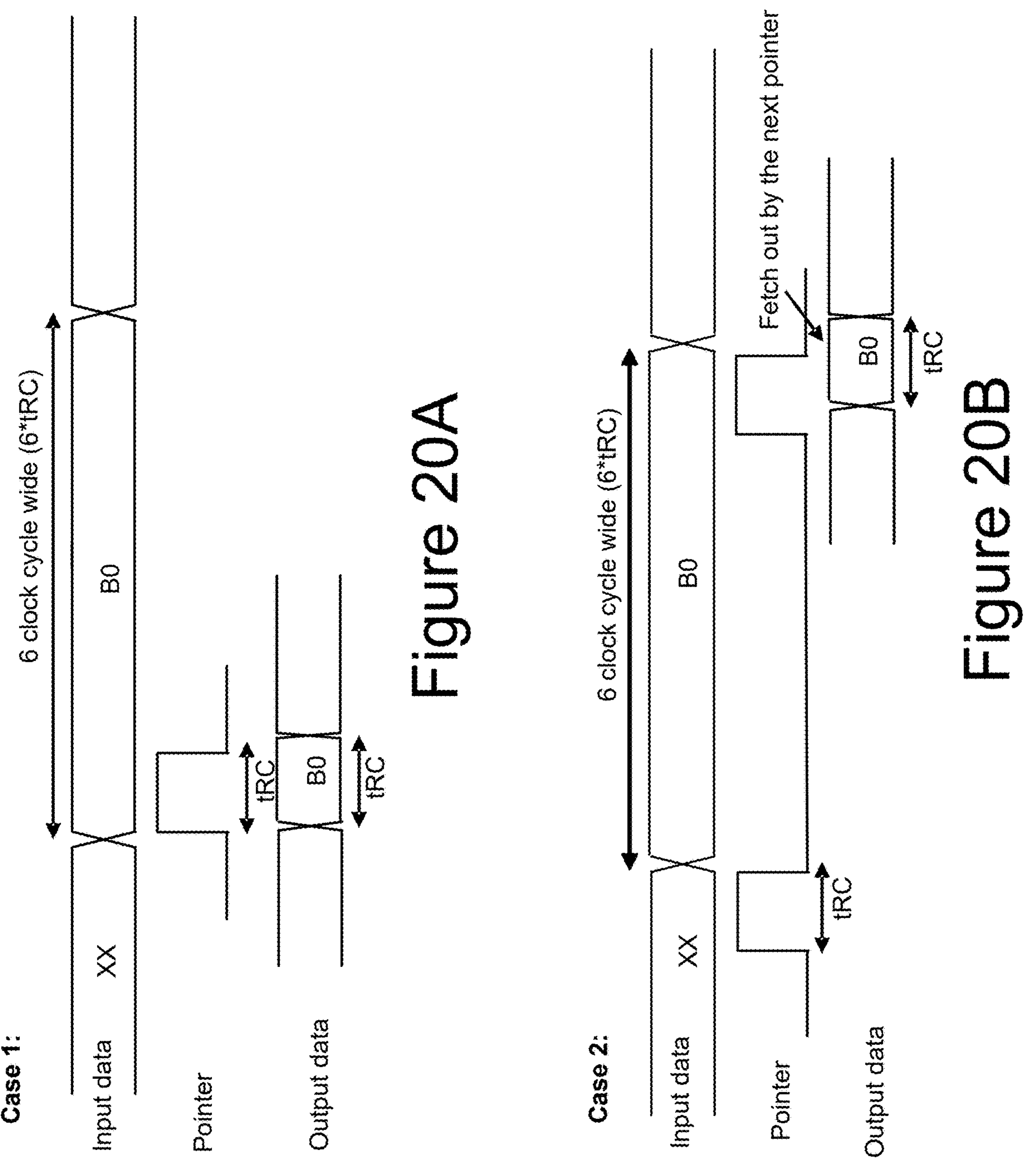
Figure 20C:
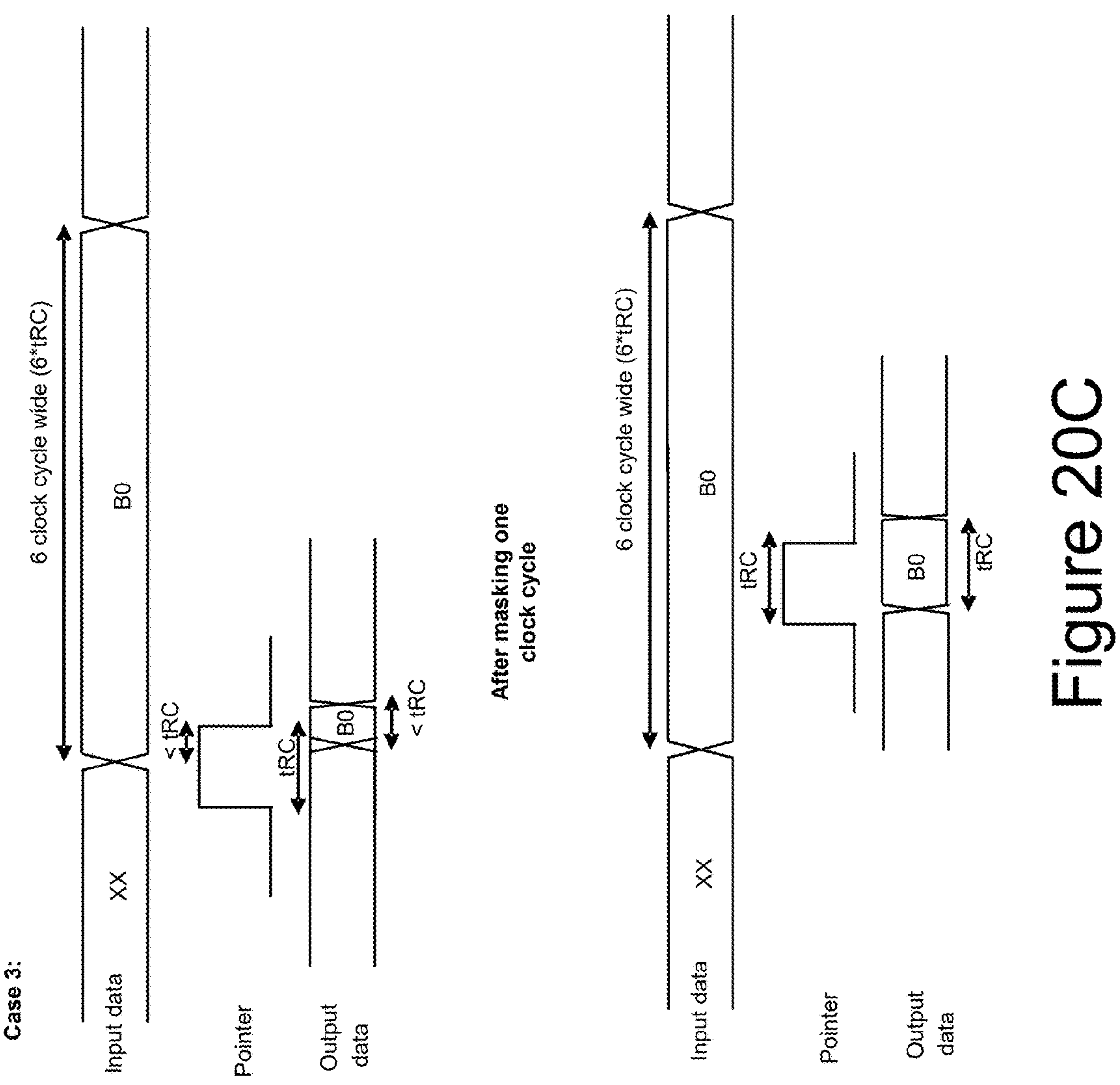

FIGS. 20A-20C and 21A-21C illustrate the effect of the parameter values on Margin 1 and Margin 2, respectively. More specifically, FIGS. 20A-20C illustrate the three possible scenarios for Margin 1. On each of FIGS. 20A-20C, the upper waveform, or input data, corresponds to one of the parallel data bus lines in FIG. 15 or 17, the pointer is the corresponding one of the transfer clocks, and the output data the corresponding one of either the even or odd data bytes. tRC is a read cycle time, which is a full cycle of the bus clock. The period of the input data is 6*tRC in this example (corresponding to the number of divisions of a memory array in this embodiment) and both of the pointer and the output data are at tRC. For a correct transference of the input data to the output data, the pointer needs to align with a well-defined state of the input data.

FIG. 20A illustrates the first of three cases, where input data of interest is B0, preceded by either other data or invalid data XX. The pointer is not long after the transition to B0, but is fully overlapping so that the output data of B0 is well defined and of duration tRC. In this case, no data valid training is required and the masking value is 0.

FIG. 20B illustrates the second of the three cases, where the pointer is before the transition to B0; however, the nest pointer will fall with the B0 input data period and the fetch out can be performed using the next pointer, which is fully overlapping so that the output data of B0 is well defined and of duration tRC. In this case, no data valid training is required and the masking value is 0.

FIG. 20C considers the third case, where, as illustrated at the top of FIG. 20C, the pointer interval includes the transition of the input data. The result is that the output data for B0 has a duration of less than tRC and is not well defined. In this case, data valid window training is required because the input data and pointers are not completely overlapping. The lower portion of FIG. 20C illustrates the introduction of one clock cycle of masking, so that the delay in the pointer results in the input data and pointers being completing overlapping and the output data waveform being well-defined. As the input data has a 6 clock wide cycle, a shift of one bit will place the pointer so to provide a well-defined output data value.

Figures 21A, 21B:
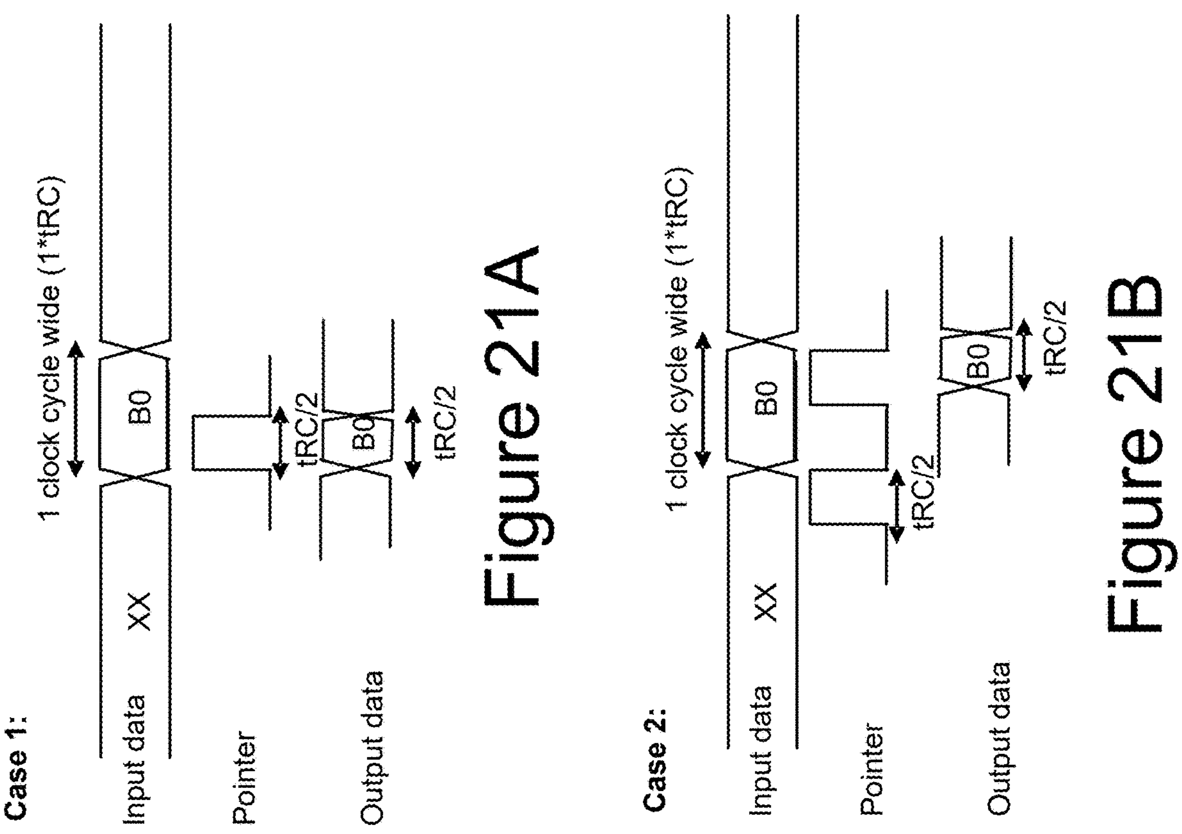

FIGS. 21A-21C illustrate the three possible scenarios for Margin 2. In each of FIGS. 21A-21C, the upper waveform, or input data, corresponds to one of either the even or odd byte of data in FIG. 15 or 17, the pointer is the corresponding data out clock, and the output data is the IO data. The period of the input data is tRC and both of the high value of the pointer and the output data are at tRC/2. For a correct transference of the input data to the output data, the pointer needs to align with a well-defined state of the input data. In case 1 of FIG. 21A, the pointer is near the front of, but within, the input data's well-defined value of data B0, resulting in output data B0. No data value window training is required as the data and pointer are completely aligned. In case 2 of FIG. 21B, the pointer is in advance of the input data's well-defined value of data B0, but the next high value for the pointer is within the input data's well-defined value of data B0 and aligned with the data so that, again, no data value window training is required.

FIG. 21C illustrates case 3 at the top of the Figure, where the data and pointer are not completely overlapping, hence data value window is impacted and the output data is not well-defined and has a duration of less than tRC/2. The input data value has a duration of 1 clock cycle of tRC, while the pointer is high for tRC/2, so that the pointer needs to be shifted for less than tRC, which is why input FE_DVW<1:0> has a two bit value to allow it to be accurately tuned. At bottom, FIG. 21C illustrates the result after shifting the clock using the tunable delay. The data and point are now completely overlapping so that the data value window is recovered and the output data is well-defined.

Figure 22:
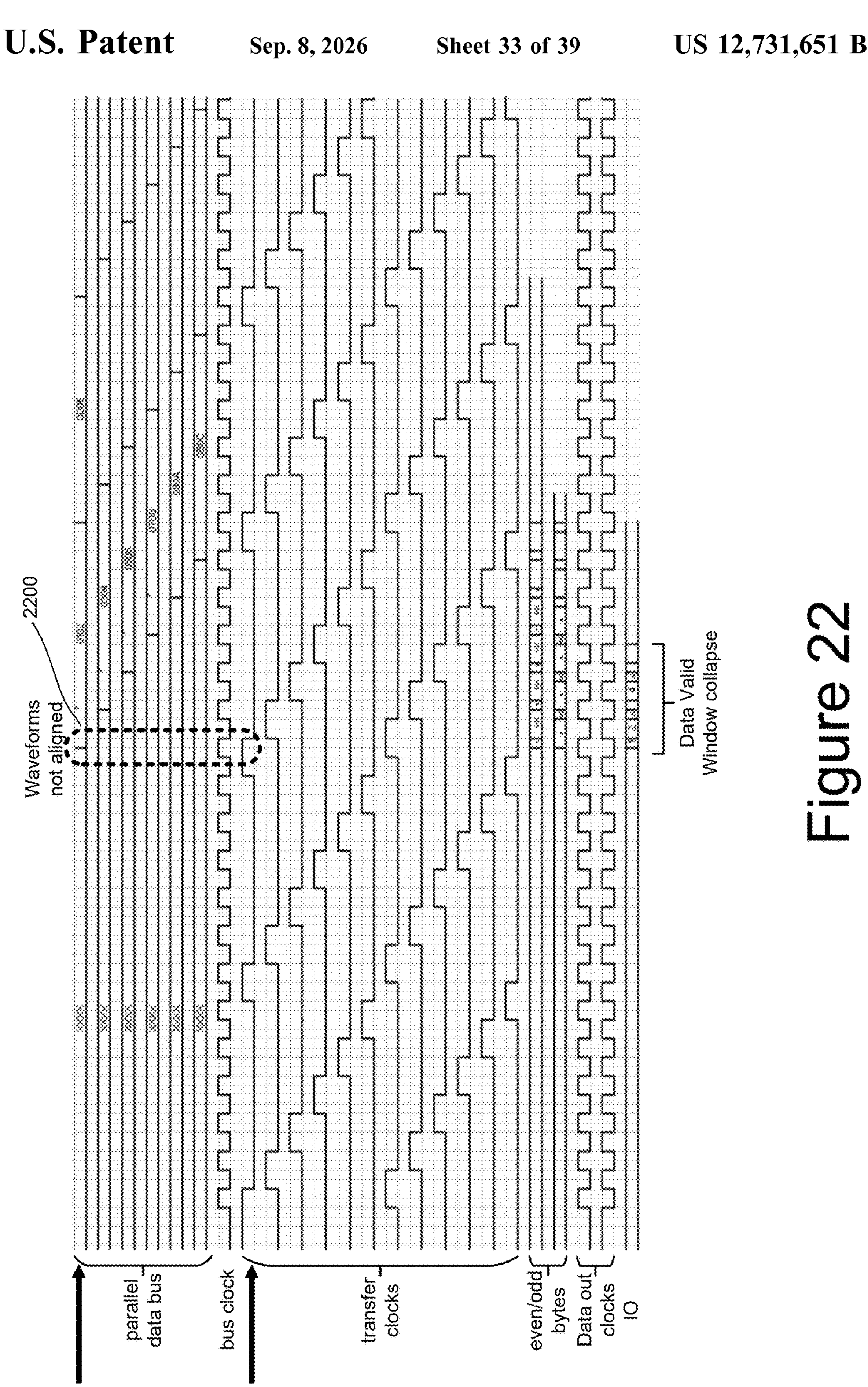
FIGS. 22 and 23 are examples of a timing waveform for unmatched DOUT respectively without and with data value window training.
Figure 23:
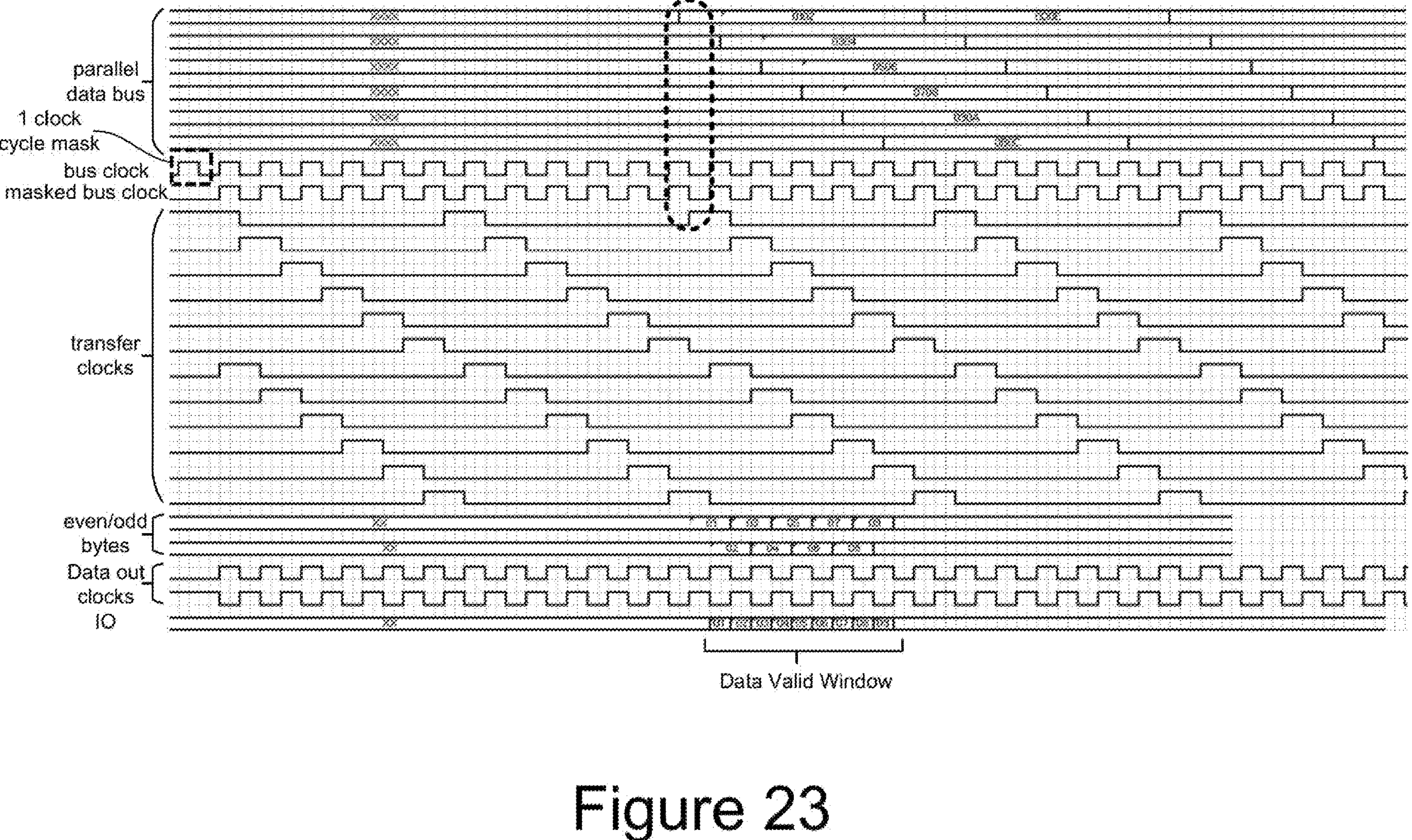

FIGS. 22 and 23 are examples of a timing waveform for unmatched DOUT respectively without and with data value window training. FIG. 22 repeats the waveforms of FIG. 17, where for the bus clock, transfer clock, and data out clocks, these all have the same waveform. However, the parallel data bus waveforms are shifted somewhat to the right and no longer align. For example, as shown by the waveforms in the heavily weighted broken oblong, the top-most parallel data bus (top arrow) and top-most transfer clock pointer (lower arrow) overlapping only for tRC/4. This results in a tRC/4 data valid window at the input of the data path FIFOs (e.g., 1311-D) and the data valid window at the IO pads (e.g., 1300) is always less than or equal to tRC/4. The result is that the data valid window collapses on the even/odd bytes data waveforms and the IO waveforms. To correct this, a mask of 1 clock cycle can be introduced at the input the FIFOs, as illustrated with respect to FIG. 23.

FIG. 23 repeats the elements of FIG. 22, but introduces a 1 clock cycle mask to the bus clock, with the resultant masked bus clock signal waveform now underneath the (unmasked) bus clock. The data bus waveform have the same timing as before, but the subsequent transfer clocks are now based on the masked bus clock waveform and shifted 1 clock cycle later, resulting in a one clock cycle mask at the input of the data path FIFOs (e.g., 1311-D). As now shown in the broken heavy weight oblong, the top most transfer clock point high signal falls fully with the corresponding top most data bus waveform. Consequently, the even/odd bytes data waveforms and the IO waveforms are now well-defined and the data valid window at the IO is always greater than or equal to tRC/2 as the data out clocks are aligned. FIGS. 22 and 23 illustrate use of FE_DVW<2> to adjust the delay at the input to the data path FIFOs based on the transfer clocks. If the data valid window at the IO pads is still less than tRC/2, Margin 2 needs to have its delay tuned to introduce a shift in the Data out clocks at the input of MUXs (e.g., 1650) by using tunable delay element as described with respect FIGS. 21A-21C.

Figure 24:
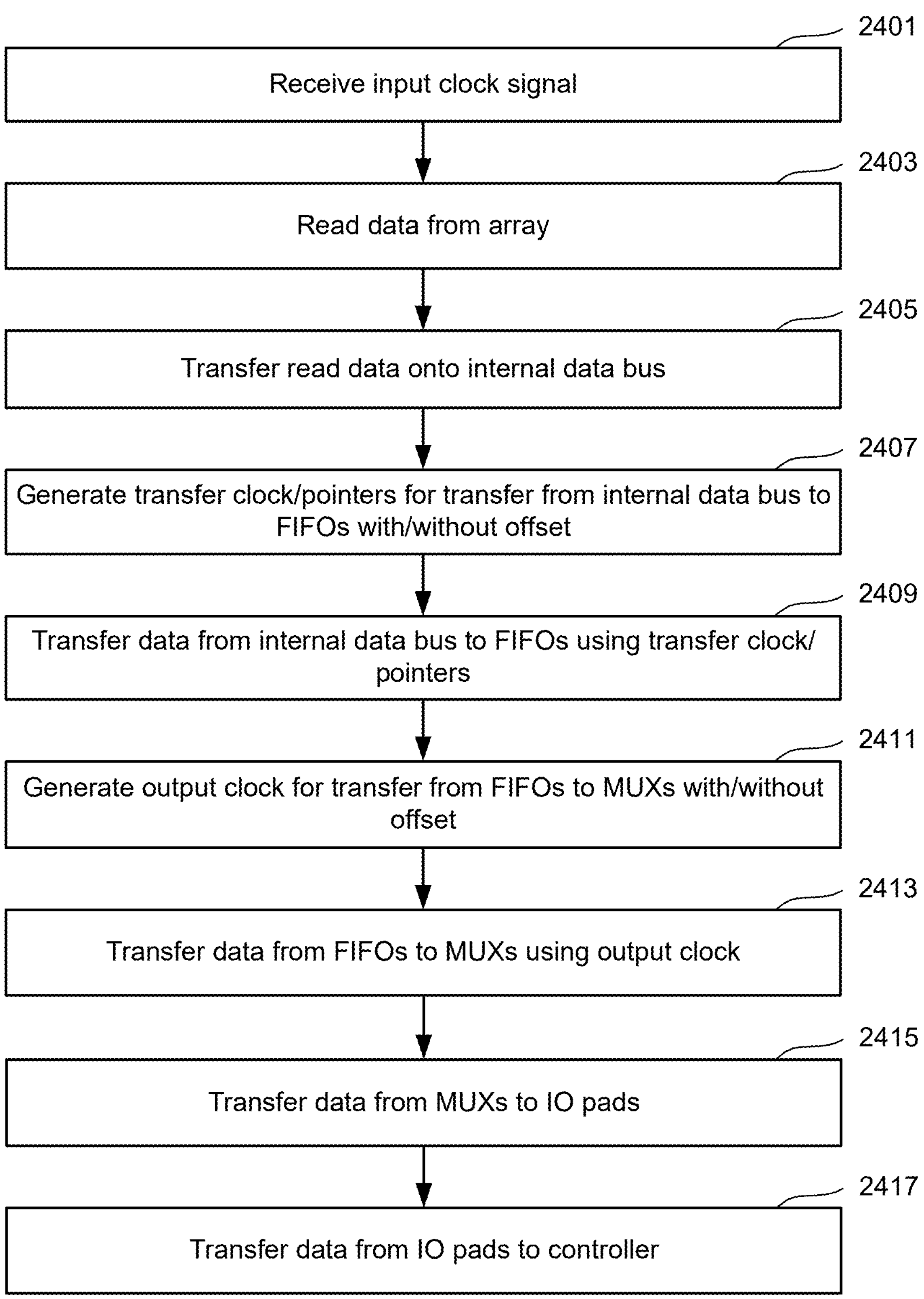
FIG. 24 is a flowchart of an embodiment for operating of a non-volatile memory system with an unmatched data out path with tunable delays.

FIG. 24 is a flowchart of an embodiment for operating of a non-volatile memory system with an unmatched data out path with tunable delays. Beginning at step 2401, the control circuitry of either memory die 300 of FIG. 3A or control die 311 of FIG. 3B receives an input clock signal, corresponding to the clock signal received at 1341 of FIG. 16A. With respect to the data path, at step 2403 data is read from the memory array or arrays 302 at step 2403 and transferred on to an internal data bus, such as DBUS of FIG. 4B, where the resultant data corresponds to the parallel data bus data waveforms of FIG. 23, at step 2405.

At step 2407, the transfer clock, or pointers, for transferring the data from the internal bus into the data path FIFOs (1311-D, 1313-D, 1315-D, 1317-D, 1317-D of FIGS. 16A and 16D) are generated, as described with respect to FIGS. 20A-20C, to compensate for Margin 1. As described with respect to FIG. 23, this aligns the transfer clocks with the waveforms on the parallel data buses to provide well-defined data output values. Using these transfer clock/pointer waveforms, at step 2409 the read data is transferred from the internal data bus into the FIFOs.

At step 2411 an output clock signal is generated from the input clock signal to include an amount of offset determined as described with respect to FIGS. 21A-21C to compensate for Margin 2. The data is then transferred, at step 2413, from the FIFOs (1311-D, 1313-D, 1315-D, 1317-D, 1317-D of FIGS. 16A and 16D) to the multiplexers (1650-1659), using the output clock with the offset as determined at step 2411. The data can then, at step 2415, be transferred from the MUXs to the IO pads (1300-1309) and then, at step 2417, from the IO pads to the controller 102.

The unmatched DOUT architecture embodiments presented above reduce the number of clock path stages, resulting in reduced area and power consumption. The reduction of stages further helps in improving the path jitter and data valid window. Additionally, the presented embodiments for an unmatched DOUT architecture is scalable and there is no need to change data path architecture generation by generation. This reduces the circuit designers' effort and allows them to close the design in less time with higher efficiency.

The techniques presented above with respect to FIGS. 16A-24 allow for a memory controller 102 to perform read and write data transfer and data in/data out adjustment for the DAC element for the tunable delay and masking elements of the unmatched DOUT architectures of FIGS. 16A and 16B. The training process is die specific and is repeated for each of the dies in a sequential fashion, which can involve a relatively large training time when there are a larger number of dies for each controller. The following discussion presents embodiments where the training for each of the dies can be performed concurrently, rather than sequentially, and more efficiently, significantly reducing the needed training time.

Figure 25:
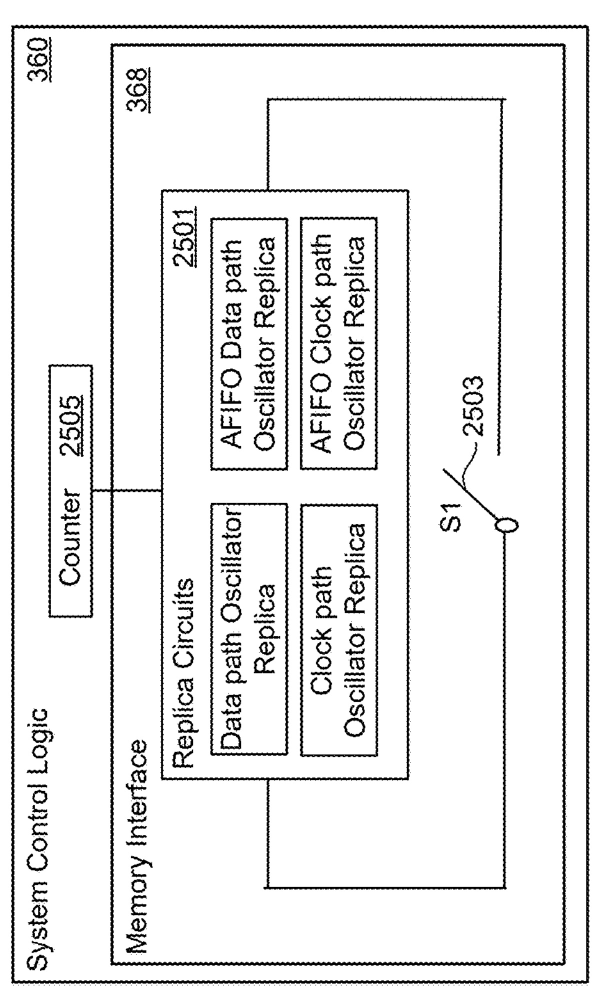
FIG. 25 is a schematic representation of the incorporation of a replica circuit to make an oscillator and find the path delay for the data and clock DOUT paths.

More specifically, the following embodiments introduce a replica circuit for the DOUT clock and data paths into the control circuitry of each die. The example embodiment uses a ring oscillator-based approach for calculating the path delay of both the data path and the clock path separately for Margin 1 and Margin 2 and mathematically calculating the DAC setting for each die. The discussion above mainly focused on the asynchronous path and asynchronous FIFOs, or AFIFOs, but the example embodiments will also include a general FIFO, or GFIFO, path and the replica circuit can include clock and data path replicas for both of these paths. FIG. 25 illustrates the introduction of a replica circuit into the memory dies.

FIG. 25 is a schematic representation of the incorporation of a replica circuit to make an oscillator and find the path delay for the data and clock DOUT paths. In this embodiment, the replica circuits 2501 can include a data path oscillator replica and a clock path oscillator replica for the general purpose FIFO paths and also an AFIFO data path oscillator replica and a AFIFO clock path oscillator replica for the asynchronous DOUT path. The system control logic 360 of each memory die 300 for the embodiment of FIG. 3A or each control die 311 for the embodiment of FIG. 3B can include the replica circuits 2501, which can be considered as part of the memory interface 368. The replica circuits will take up some of the control circuitry's area, but this will not be part of the high speed COMOS circuitry's space that tends to be more limited. Using path delays and mathematical formulas as described below, a non-volatile memory controller 102 can determine the DAC settings for the tunable delay and masking for all the dies using the controller in one-shot and used directly for satisfying internal margins.

When enabled to mimic the DOUT paths, the control circuit turns on the switch S1 2503. As the oscillator replica circuits 2501 are each implemented as a ring oscillator, they will have an odd number of stages so that they alternate states on each trip through the ring oscillator. To account for this, the signal can be propagated through the ring oscillator an even number of loops for twice the delay value. If tPDosc is the path delay, tPDosc=Runtime/(2*Count), where the Runtime is provided by the memory controller, and can be calculated based upon desired accuracy and Count is the number of clock cycles during the specified Runtime, where this can be determined by a counter, represented at 2505 as being part of the system control logic 360.

Figure 26:
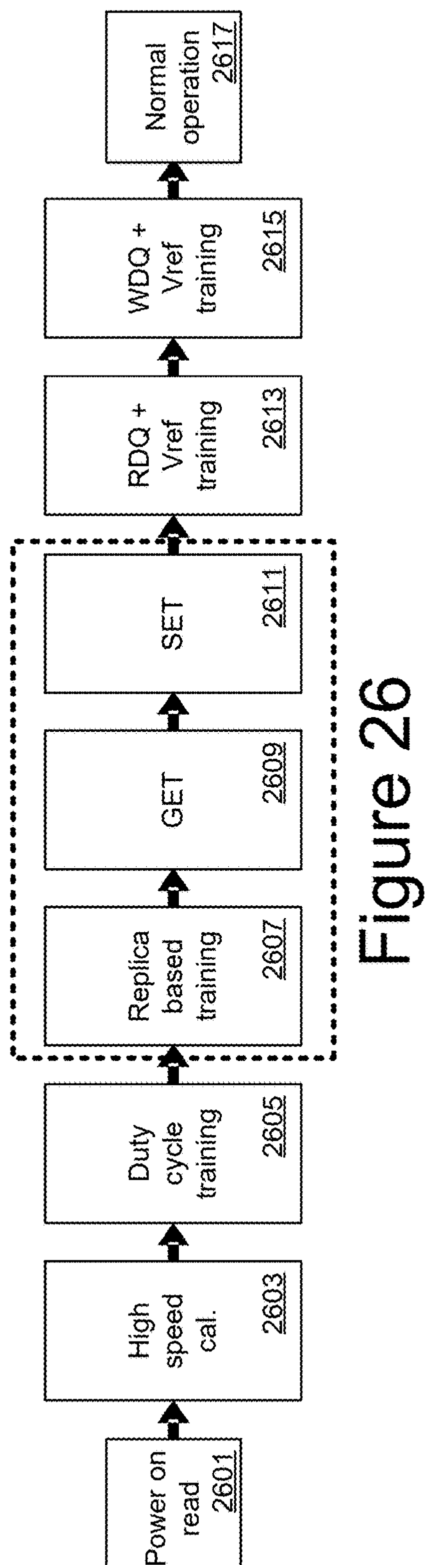
FIG. 26 presents an embodiment of a startup routine for a memory system that incorporates the replica based training for the unmatched DOUT path.

FIG. 26 presents an embodiment of a startup routine for a memory system that incorporates the replica based training for the unmatched DOUT path. This procedure can be performed by the system of a non-volatile memory controller 102 and memory dies 300 or 301/311 when the memory controller 102 receives a wakes up signal, such as in response to a host 120 signal. The process begins with a power on read 2601 that can read out parameter values for the operation of the memory system. A calibration for the high speed circuitry can performed at 2603, followed by duty cycle training at 2605, where these can be performed as in previous implementations.

The training process using the replica circuits 2501 follows at blocks 2607, 2609, and 2611. In the embodiment of FIG. 25, the training of 2607 is based on replicas of the four different paths, with a clock path and data path replica for each of the general FIFO and asynchronous FIFO paths. More generally, there can be a data path and clock path replica pair for each DOUT path. The non-volatile memory controller 102 can broadcast a start time and a stop time, determining the runtime, to the system control logic 360 for each of the oscillators of 2501 for each memory die that it controls. Between the start and stop time, the oscillator will oscillate and the counter 2505 will count the number of clock cycles and can, for example, save the count value at a specified addresses in the memory controller's ROM. A GET operation 2609 follows the stop time, when the memory controller 102 can read out the count values. The memory controller 102 can then use the count from each oscillator to determine the corresponding delay of each path. After some mathematics manipulation as described below, the memory controller 102 can provide the information of masking and tunable delay DAC requirement to the NAND devices through a SET feature 2611 for satisfying internal margins. The wakeup procedure can then continue through the other initialization steps, such as data read and Vref training at step 2613 and data write and Vref training at step 2615, after which normal operation 2617 can begin.

Figure 27:
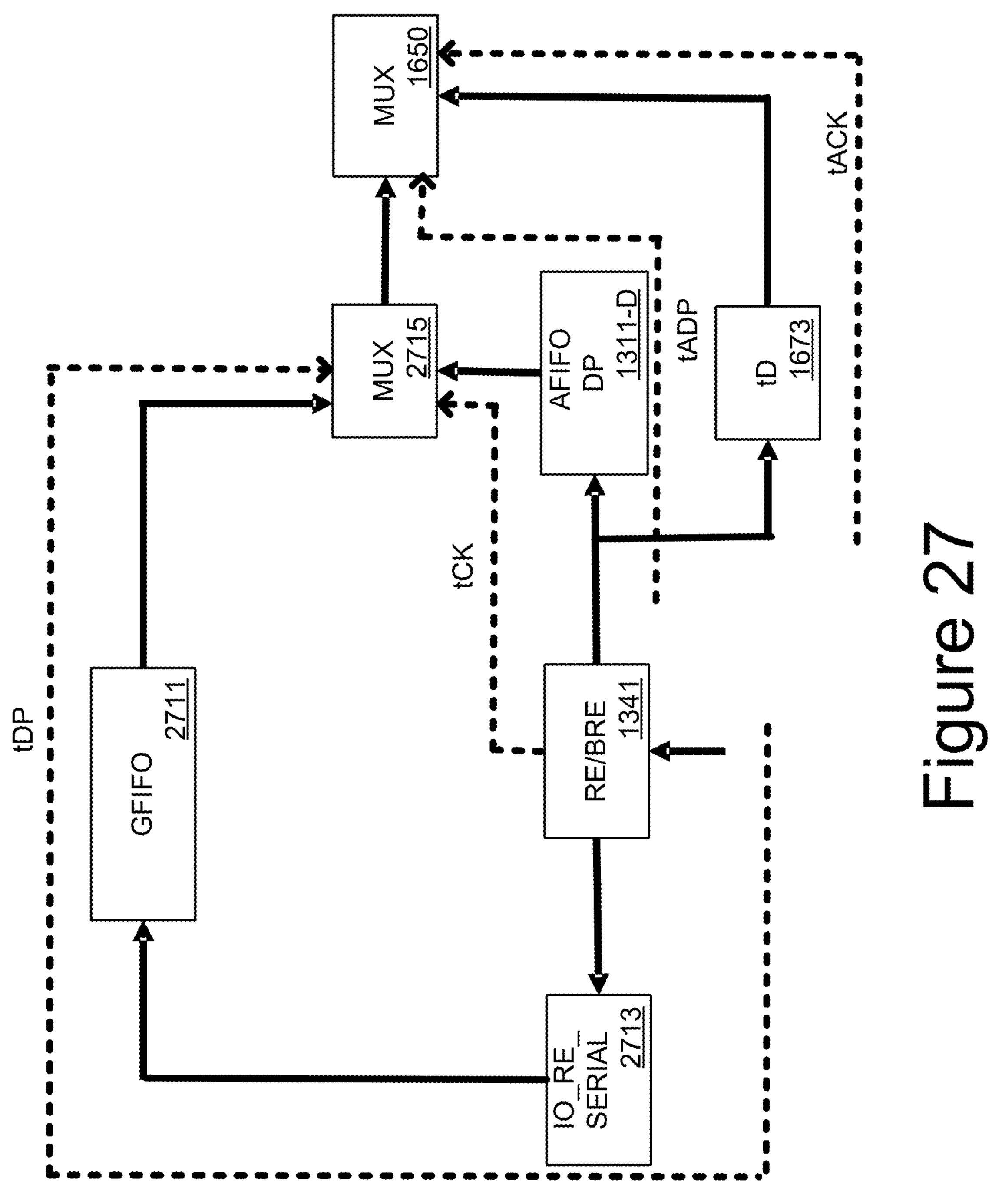
FIG. 27 illustrates the paths that are replicated by the ring oscillators in the embodiment of FIG. 25.

FIG. 27 illustrates the paths that are replicated by the ring oscillators in the embodiment of FIG. 25. FIG. 27 repeats some of the elements of FIGS. 16A and 16B for the asynchronous DOUT path, namely RE/BRE 1341, the AFIFO DP 1311-D, MUX 1650, and tunable delay tD 1671, where only a single one is shown of the multiple elements of FIGS. 16A and 16B and other elements are not included to simplify this discussion. As discussed above with respect to FIGS. 13-24, there are the time for the asynchronous data path from RE/BRE 1341 through AFIFO DP 1311-D to MUX 1650, here labeled tADFP, and the time for the clock path from RE/BRE 1341 through tD 1673 to MUX 1650, here labelled tACK.

FIG. 27 also includes elements representing the general FIFO path. These include the IO read serializer circuit IO_RE_SERIAL 2713 connected to receive signals from BE/BRE 1341 and transfer the data to the general FIFOs GFIFO 2711. A multiplexer MUX 2715 is included to multiplex the data between the asynchronous path FIFOs 1311-D and general FIFOs 2711 into the MUX 1650 for transfer to the IO pads, such as 1300. The data path transfer path from 1341 to MUX 2715 is indicated as tDP and the clock path from 1341 to MUX 2715 is indicated as tCK. By comparing tACK and tADP the amount of relative delay to introduce for the asynchronous paths can be determined and by comparing tCK and tDP the amount of relative delay to introduce for the general paths can be determined.

Figure 28:
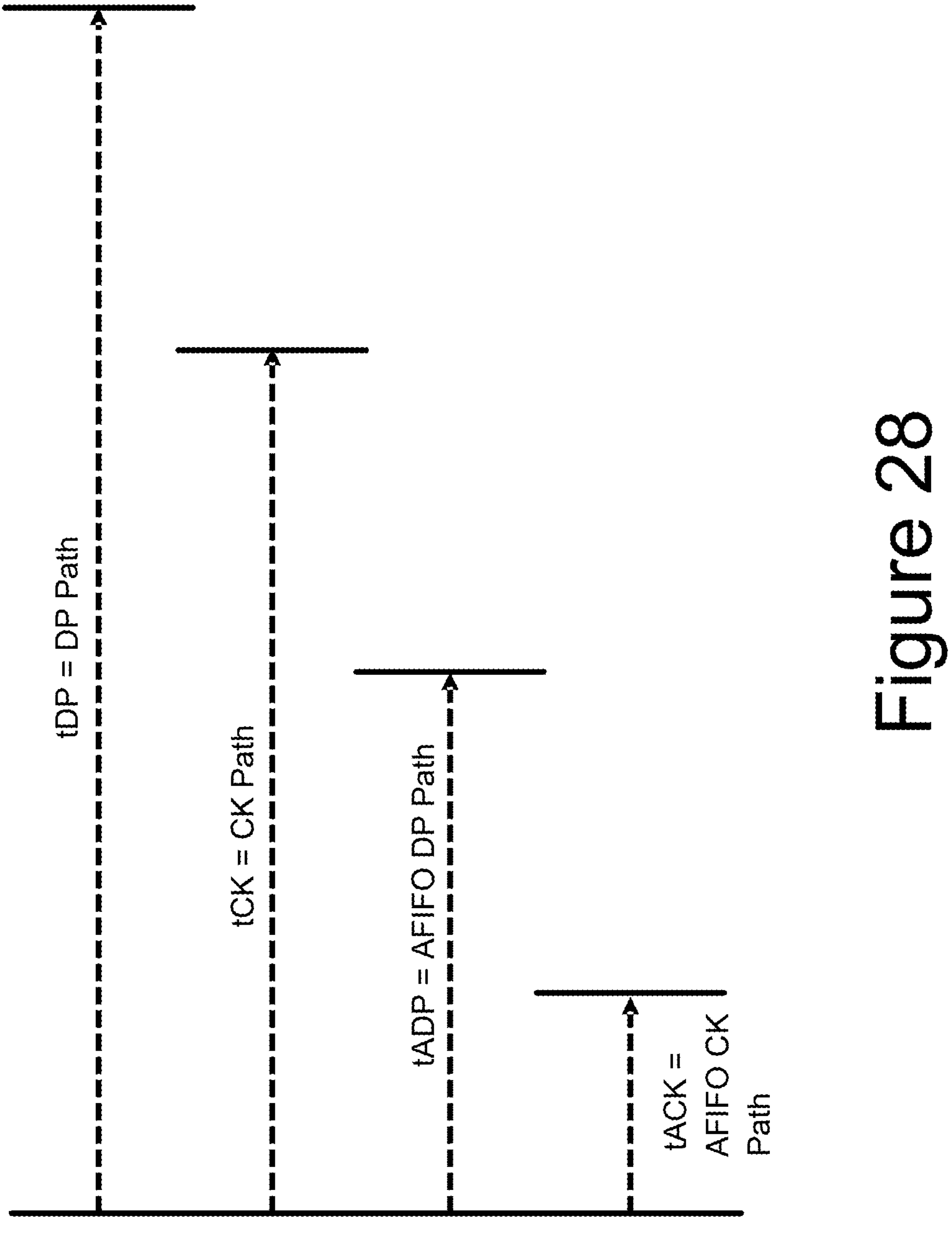
FIG. 28 illustrates an example the relative transfer times in an embodiment of an unmatched DOUT architecture.

FIG. 28 illustrates an example the relative transfer times in an embodiment of an unmatched DOUT architecture. As illustrated, the times tDP for the data path and tCK for the clock path for the general FIFO path tend to be longer than the times tADP and tACK for the asynchronous FIFO data path and clock path. In both cases, the data path times are longer than the clock paths, as in the DOUT architecture elements that are otherwise introduced only for path matching can be removed.

An example embodiment can again be based on an AFIFO depth of 6, a single bit for the mask decision and two for the tunable DAC decision. The mask decision for the AFIFO margin is determined similarly to the process described with respect to FIGS. 20A-20C, but now based on the AFIFO data path oscillator replication with tADP and AFIFO clock path oscillator replica with tACK. The mask decision for the AFIFO margin can be expressed in pseudo code as:

```
If (((tADP–tACK)%tRC) == 6n) where n=0,1,2...
{
  if (rem(tADP–tACK, tARC) > 0)
    {
      Mask one CK cycle;
    }
  else
```

-continued

```
    {
      No Mask;
    }
}
else
{
  No Mask;
}    ,
```

where tRC is again the read cycle time. The mask decision for the GFIFO margin can be similarly performed using tDP and TCK and the 6 in "6n" would be replaced by the GFIFO depth if other than 6.

The tunable DAC value supplied to the MUX 1650 can be determined similarly to the process described with respect to FIGS. 21A-21C, but now based on the AFIFO data path oscillator replication with tADP and AFIFO clock path oscillator replica with tACK. The tunable DAC decision for the AFIFO margin can be expressed in pseudo code as:

```
Y = (tADP–tACK) – ((tADP–tACK)%tRC)*tRC;
If(Y > tRC/2)
{
  No tuning required;
}
else
{
  Z = tRC/2 – Y;
  Enable delay DAC closet to delay Z;
} .
```

The mask decision for the GFIFO tunable DAC can be similarly performed using tDP and TCK. By using the replica circuits in this way, the masking and delay value can be determined significantly more quickly, both as the individual test can be performed faster, but in particular because the process can be performed for each memory die separately in parallel, rather than working sequentially through the dies by the memory controller.

As discussed above with respect to FIG. 25, for the oscillator replica circuits, if tPD is the path delay, the runtime provided by the memory controller for determining the delay is T, and count N is number of clock cycles during the specified runtime, then tPD=T/2N, where the memory controller can perform the processes concurrently on all of the memory times based on oscillator enable and oscillator stop signals. If the detectable accuracy is called t0, then:

$$t0 = t/2N - t/(2N+1) \approx 2(tPD)^2/T,$$

so that $$T = 2(tPD)^2/t0.$$

The needed run time T will consequently depend on the maximum tPD time and the level of accuracy t0 that is to be achieved. Typical values can be on the order of a few hundred nanoseconds. The maximum needed size of the counter 2505 is determined by the minimum tPD value:

$$N_{max} = T/2*(tPD_{min}).$$

For typical values, 2-byte register will be sufficient to hold the value set in the GET 2609 and SET 2611 operations.

Figure 29:
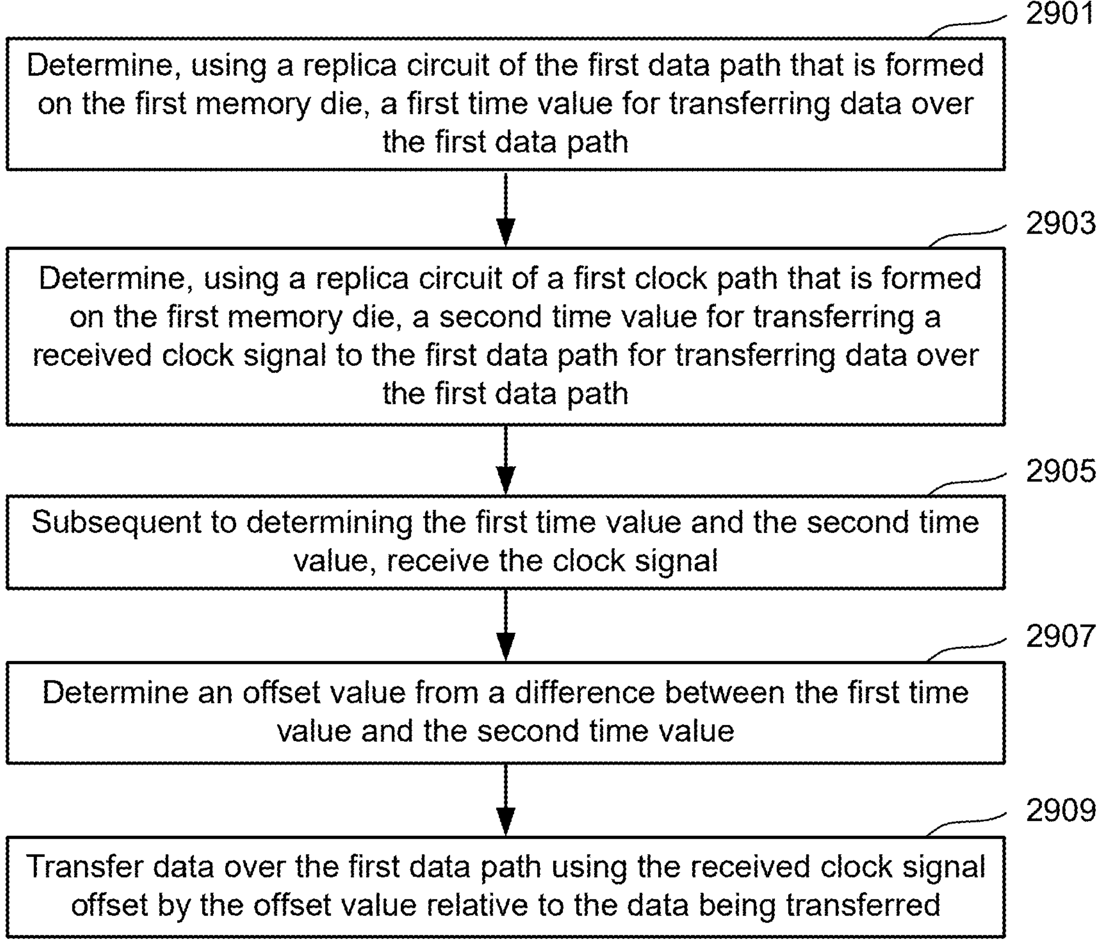
FIG. 29 is a flowchart of an embodiment for determining the masking and tunable delay values based on the replica circuits of the embodiments of FIGS. 25-28.

FIG. 29 is a flowchart of an embodiment for determining the masking and tunable delay values based on the replica circuits of the embodiments of FIGS. 25-28. In step 2901, the replica circuit for the data path of one or both of the AFIFO or GFIFO data path of replica circuits 2501 is used to determine a transfer time (one or both of tDP or tADP) for transferring data over the corresponding data path from the internal data bus through the corresponding FIFOs to the IO pads. In step 2903 the replica circuit for the corresponding clock path of one or both of the AFIFO or GFIFO clock path of replica circuits 2501 are used to determine a corresponding clock path time (one or both of tCK or tACK) for the corresponding clock path from the clock input of the memory die, incorporating the mask bit 1647 through the tunable delay to the data path. Based on the difference between the path times, the offsets can be determined as described above with respect to FIGS. 25-28. After determining the first time value and the second time value, data can be transferred over the data path based on a clock signal received at step 2905. Step 2907 determines an offset value from a difference between the first time value and the second time value, with the data then being transferred over the data path using the received clock signal offset by the first offset value relative to the data being transferred at step 2909.

One embodiment includes a non-volatile memory device that includes a control circuit configured to connect to an array of non-volatile memory cells, the control circuit comprising: an internal data bus; a plurality of input/output (IO) pads, a first data path between the internal data bus and the IO pads, including one or more first data buffers; a replica circuit of the first data path; a first clock path between a clock input and the first data path; and a replica circuit of the first clock path. The control circuit is configured to: determine a time for signal to propagate over the replica circuit of the first data path; determine a time for a signal to propagate over the replica circuit of the first clock path; determine a first time difference between the time for signal to propagate over the replica circuit of the first data path and the time for a signal to propagate over the replica circuit of the first clock path; receive an input clock signal at the first clock path; generate a first data transfer clock from the input clock, including offsetting the input clock signal by an amount determined from the first time difference; and transfer data over the first data path according to the first data transfer clock.

One embodiment includes a method comprising, for a memory system including a first memory die having a first data path configured to transfer data from an internal data bus to one or more input/output (IO) pads according to a received clock signal: determining, using a replica circuit of the first data path that is formed on the first memory die, a first time value for transferring data over the first data path; determining, using a replica circuit of a first clock path that is formed on the first memory die, a second time value for transferring the received clock signal to the first data path for transferring data over the first data path; subsequent to determining the first time value and the second time value, receiving the clock signal; determining a first offset value from a difference between the first time value and the second time value; and transferring data over the first data path using the received clock signal offset by the first offset value relative to the data being transferred.

One embodiment includes a system comprising a memory controller and a plurality of non-volatile memory dies each connected to the memory controller to exchange data with the memory controller and to receive commands and a clock signal from the memory controller. Each of the memory dies comprises: a clock input configured to receive the clock signal from the memory controller; a plurality of input/output (IO) pads configured to transfer data to the memory controller; an internal data bus; a data path between the internal data bus and the IO pads; a replica circuit of the data path; a clock path, including a settable delay, from the clock input to the data path; a replica circuit of the clock path; and one or more control circuits. The one or more control circuits are configured to: receive from the memory controller, concurrently with others of the memory dies, a command to determine the settable delay based on a difference between a time value for transferring data over the data path determined using the replica circuit of the data path and a second time value for transferring a received clock signal to the data path using the replica circuit of the clock path; determine the settable delay concurrently with one or more of the others of the memory dies determining a corresponding settable delay; and transferring data from the memory die over the data path using the received clock signal with the settable delay.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A non-volatile memory device, comprising:

a control circuit configured to connect to an array of non-volatile memory cells, the control circuit comprising:

an internal data bus;

a plurality of input/output (IO) pads;

a first data path between the internal data bus and the IO pads, including one or more first data buffers;

a replica circuit of the first data path;
a first clock path between a clock input and the first data path; and
a replica circuit of the first clock path,
the control circuit configured to:
determine a time for signal to propagate over the replica circuit of the first data path;
determine a time for a signal to propagate over the replica circuit of the first clock path;
determine a first time difference between the time for signal to propagate over the replica circuit of the first data path and the time for a signal to propagate over the replica circuit of the first clock path;
receive an input clock signal at the first clock path;
generate a first data transfer clock from the input clock, including offsetting the input clock signal by an amount determined from the first time difference; and
transfer data over the first data path according to the first data transfer clock.

2. The non-volatile memory device of claim 1, wherein the control circuit is formed on a control die, the non-volatile memory device further comprising:
a memory die including the array of non-volatile memory cells, the memory die separate from and bonded to the control die.

3. The non-volatile memory device of claim 1, wherein the one or more first data buffers are first in, first out (FIFO) data buffers.

4. The non-volatile memory device of claim 1, wherein the replica circuit of the first data path is a ring oscillator circuit and the replica circuit of the first clock path is a ring oscillator circuit.

5. The non-volatile memory device of claim 1, wherein the first data path is an asynchronous data path.

6. The non-volatile memory device of claim 5, wherein the control circuit further comprises:
a second data path between the internal data bus and the IO pads, including one or more second data buffers;
a replica circuit of the second data path;
a second clock path between the clock input and the second data path; and
a replica circuit of the second clock path,
the control circuit configured to:
determine a time for signal to propagate over the replica circuit of the second data path;
determine a time for a signal to propagate over the replica circuit of the second clock path;
determine a second time difference between the time for signal to propagate over the replica circuit of the second data path and the time for a signal to propagate over the replica circuit of the second clock path;
generate a second data transfer clock from the input clock, including offsetting the input clock signal by an amount determined from the second time difference; and
transfer data over the second data path according to the second data transfer clock.

7. The non-volatile memory device of claim 1, wherein the control circuit is further configured to:
receive, from a memory controller, an enable signal and a stop signal for the time for the signal to propagate over the replica circuit of the first data path and the time for the signal to propagate over the replica circuit of the first clock path; and
determine the first time difference as a count difference between a count for the signal to propagate over the replica circuit of the first data path and a count for the time for the signal to propagate over the replica circuit of the first clock path.

8. The non-volatile memory device of claim 1, the control circuit is further configured to:
read data from the array of non-volatile memory cells; and
transfer the read data onto the internal data bus wherein waveforms of the read data on the internal data bus are multiple cycles of the of the input clock signal, wherein offsetting the first data transfer clock includes:
selecting no offset or an offset of one cycle of the input clock signal.

9. The non-volatile memory device of claim 1, wherein the first data path further comprises:
a plurality of multiplexers,
wherein, to transfer data from the one or more first data buffers to the IO pads, the control circuit is further configured to:
transfer data from the one or more first data buffers to the multiplexers according to a second transfer clock;
transfer data from the multiplexers to the one or more first data buffers to the IO pads; and
generate the second transfer clock from the input clock signal, including selecting one of a plurality of values for an amount of offset between the input clock signal and the second transfer clocks.

10. The non-volatile memory device of claim 9, wherein the plurality of values for the offset between the input clock signal and output are each less than a full cycle of the input clock signal.

11. The non-volatile memory device of claim 1, the control circuit further comprising:
a counter,
wherein the control circuit is further configured to:
determine the time for signal to propagate over the replica circuit of the first data path by the counter as a first number of clock periods;
determine the time for a signal to propagate over the replica circuit of the first clock path by the counter as a second number of clock periods; and
determine the first time difference from a difference between the first number of clock periods and the second number of clock periods.

12. The non-volatile memory device of claim 11, the control circuit further comprising:
a register,
wherein the control circuit is further configured to:
store the amount for offsetting the input clock signal in the register as a number of clock cycles.

13. The non-volatile memory device of claim 11, wherein:
to determine the first number of clock periods and to determine second number of clock periods the control circuit is further configured to enable the counter in response to an enable signal from a memory controller.

14. A method comprising:
for a memory system including a first memory die having a first data path configured to transfer data from an internal data bus to one or more input/output (IO) pads according to a received clock signal:
determining, using a replica circuit of the first data path that is formed on the first memory die, a first time value for transferring data over the first data path;
determining, using a replica circuit of a first clock path that is formed on the first memory die, a second time value for transferring the received clock signal to the first data path for transferring data over the first data path;

subsequent to determining the first time value and the second time value, receiving the clock signal;

determining a first offset value from a difference between the first time value and the second time value; and transferring data over the first data path using the received clock signal offset by the first offset value relative to the data being transferred.

15. The method of claim 14, wherein the memory system further includes a memory controller and one or more additional memory dies each having a corresponding first data path configured to transfer data from a corresponding internal data bus to one or more corresponding input/output (IO) pads according to a corresponding first data transfer clock, the method further comprising for each of the additional memory dies:

determining, using a replica circuit of the corresponding first data path that is formed on the memory die, a corresponding first time value for transferring data over the corresponding first data path;

determining, using a replica circuit of a corresponding first clock data path that is formed on the memory die, a corresponding second time value for transferring a corresponding received clock signal to the corresponding first data path for transferring data over the corresponding first data path;

subsequent to determining the corresponding first time value and the corresponding second time value, receiving the clock signal;

determining a corresponding offset value from a difference between the corresponding first time value and the corresponding second time value; and transferring data over the corresponding first data path using the received clock signal offset by the corresponding offset value relative to the data being transferred; and receiving at each of the memory dies an enable signal from the memory controller, wherein the first memory die and each of the one or more additional memory dies determine the corresponding first time values and the corresponding second time values in response to the enable signal.

16. The method of claim 15, wherein each of the first memory die and the additional memory dies determine the corresponding first time values and the corresponding second time values concurrently with others of the first memory die and the additional memory dies.

17. The method of claim 14, wherein the first data path includes a plurality of first in, first out (FIFO) data buffer stages.

18. The method of claim 17, wherein transferring data over the first data path includes transferring data over the first data path asynchronously.

19. The method of claim 14, wherein the first memory die further includes a second data path configured to transfer data from the internal data bus to the one or more input/output (IO) pads according to a second data transfer clock:

determining, using a replica circuit of the second data path that is formed on the first memory die, a third time value for transferring data over the second data path;

determining, using a replica circuit of a second clock path that is formed on the first memory die, a fourth time value for transferring the received clock signal to the second data path for transferring data over the second data path;

subsequent to determining the third time value and the fourth time value, receiving the clock signal;

determining a second offset value from a difference between the third time value and the fourth time value; and transferring data over the second data path using the received clock signal offset by the second offset value relative to the data being transferred.

20. A system, comprising:

a memory controller; and a plurality of non-volatile memory dies each connected to the memory controller to exchange data with the memory controller and to receive commands and a clock signal from the memory controller, each of the memory dies comprising:

a clock input configured to receive the clock signal from the memory controller;

a plurality of input/output (IO) pads configured to transfer data to the memory controller;

an internal data bus;

a data path between the internal data bus and the IO pads;

a replica circuit of the data path;

a clock path, including a settable delay, from the clock input to the data path;

a replica circuit of the clock path; and one or more control circuits configured to:

receive from the memory controller, concurrently with others of the memory dies, a command to determine the settable delay based on a difference between a time value for transferring data over the data path determined using the replica circuit of the data path and a second time value for transferring a received clock signal to the data path using the replica circuit of the clock path;

determine the settable delay concurrently with one or more of the others of the memory dies determining a corresponding settable delay; and transferring data from the memory die over the data path using the received clock signal with the settable delay.

* * * * *